(12) United States Patent
Naito

(10) Patent No.: US 11,923,444 B2
(45) Date of Patent: Mar. 5, 2024

(54) SEMICONDUCTOR DEVICE AND MANUFACTURING METHOD OF SEMICONDUCTOR DEVICE

(71) Applicant: FUJI ELECTRIC CO., LTD., Kawasaki (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 18/150,770

(22) Filed: Jan. 5, 2023

(65) Prior Publication Data

US 2023/0142388 A1 May 11, 2023

Related U.S. Application Data

(60) Division of application No. 16/951,942, filed on Nov. 18, 2020, now Pat. No. 11,552,185, which is a
(Continued)

(30) Foreign Application Priority Data

Aug. 12, 2016 (JP) ................................ 2016-158680
Feb. 14, 2017 (JP) ................................ 2017-025389
(Continued)

(51) Int. Cl.
*H01L 21/00* (2006.01)
*H01L 21/324* (2006.01)
(Continued)

(52) U.S. Cl.
CPC ........ *H01L 29/7397* (2013.01); *H01L 21/324* (2013.01); *H01L 29/1095* (2013.01);
(Continued)

(58) Field of Classification Search
CPC ............... H01L 29/7397; H01L 21/324; H01L 29/1095; H01L 29/12; H01L 29/66348; H01L 29/739; H01L 29/78
See application file for complete search history.

(56) References Cited

U.S. PATENT DOCUMENTS 6,780,713 B2 * 8/2004 Bromberger ...... H01L 29/66659
257/E21.345
6,806,131 B2 * 10/2004 Bromberger ........ H01L 29/7824
257/E29.054
(Continued)

FOREIGN PATENT DOCUMENTS

CN 103959473 A 7/2014
CN 104425582 A 3/2015
(Continued)

OTHER PUBLICATIONS

Office Action issued for counterpart German Application 112017000297.4, issued by the German Patent and Trademark Office dated Jan. 18, 2023.
(Continued)

*Primary Examiner* — Richard A Booth

(57) ABSTRACT

There is provided a semiconductor device including a drift region of a first conductivity type, a first semiconductor region of the first conductivity type provided above the drift region and having a doping concentration higher than the drift region, a second semiconductor region of a second conductivity type provided between the first semiconductor region and the drift region, and a plurality of trench portions arranged in a first direction and having an extending portion that extends in a second direction perpendicular to the first direction. At least one trench portion of the plurality of trench portions has a first tapered portion at an upper side than a depth position of a lower surface of the second semiconductor region. The width of the first tapered portion
(Continued)

in the first direction becomes smaller from a lower side of the first tapered portion toward an upper side of the first tapered portion.

20 Claims, 46 Drawing Sheets

Related U.S. Application Data continuation of application No. 16/044,525, filed on Jul. 25, 2018, now Pat. No. 10,847,640, which is a continuation of application No. PCT/JP2017/028847, filed on Aug. 8, 2017.

(30) Foreign Application Priority Data

Jun. 5, 2017 (JP) ................................ 2017-111218
Jun. 16, 2017 (JP) ................................ 2017-119106

(51) Int. Cl.
| | | |
|---|---|---|
| H01L 29/10 | (2006.01) | |
| H01L 29/12 | (2006.01) | |
| H01L 29/66 | (2006.01) | |
| H01L 29/739 | (2006.01) | |
| H01L 29/78 | (2006.01) | |

(52) U.S. Cl.
CPC ........ *H01L 29/12* (2013.01); *H01L 29/66348* (2013.01); *H01L 29/739* (2013.01); *H01L 29/78* (2013.01)

(56) References Cited

U.S. PATENT DOCUMENTS

| | | | |
|---|---|---|---|
| 7,358,565 | B2 | 4/2008 | Harada |
| 10,269,946 | B2 | 4/2019 | Matsuura |
| 10,332,973 | B2 | 6/2019 | Baburske |
| 10,361,191 | B2 | 7/2019 | Takahashi |
| 10,651,301 | B2 | 5/2020 | Kanda |
| 2003/0173618 | A1 | 9/2003 | Zundel |
| 2005/0062102 | A1* | 3/2005 | Dudek .............. H01L 29/66659 |
| | | | 257/E21.345 |
| 2007/0114598 | A1 | 5/2007 | Sachiko |
| 2007/0267663 | A1 | 11/2007 | Harada |
| 2008/0197379 | A1 | 8/2008 | Aono |
| 2011/0186927 | A1 | 8/2011 | Kawaguchi et al. |
| 2012/0001199 | A1 | 1/2012 | Bauer |
| 2012/0056241 | A1 | 3/2012 | Sumitomo |
| 2012/0068248 | A1 | 3/2012 | Kawaguchi |
| 2012/0161154 | A1 | 6/2012 | Mimura |
| 2013/0341708 | A1 | 12/2013 | Sumida |
| 2014/0048847 | A1 | 2/2014 | Yamashita |
| 2014/0054682 | A1 | 2/2014 | Padmanabhan et al. |
| 2014/0217464 | A1 | 8/2014 | Higuchi |
| 2014/0299915 | A1 | 10/2014 | Kouno et al. |
| 2014/0339569 | A1 | 11/2014 | Sugimoto |
| 2015/0069461 | A1 | 3/2015 | Misu et al. |
| 2015/0162407 | A1 | 6/2015 | Laven |
| 2015/0221756 | A1 | 8/2015 | Vellei |
| 2015/0262999 | A1 | 9/2015 | Ogura |
| 2015/0295034 | A1 | 10/2015 | Laven |
| 2015/0380535 | A1 | 12/2015 | Oshino et al. |
| 2016/0141400 | A1 | 5/2016 | Takahashi |
| 2016/0204097 | A1 | 7/2016 | Laven |
| 2016/0211257 | A1 | 7/2016 | Yoshida |
| 2016/0247808 | A1 | 8/2016 | Horiuchi |
| 2016/0329322 | A1 | 11/2016 | Takahashi |
| 2016/0372586 | A1 | 12/2016 | Fujii |
| 2017/0018633 | A1 | 1/2017 | Baburske |
| 2017/0018637 | A1 | 1/2017 | Kitamura |
| 2017/0025410 | A1 | 1/2017 | Cheng |
| 2017/0047408 | A1 | 2/2017 | Kuribayashi et al. |
| 2018/0286971 | A1 | 10/2018 | Philippou |
| 2018/0350961 | A1 | 12/2018 | Naito |
| 2019/0123185 | A1 | 4/2019 | Vellei |
| 2019/0123186 | A1 | 4/2019 | Philippou |
| 2019/0305083 | A1 | 10/2019 | Dainese |
| 2019/0305087 | A1 | 10/2019 | Philippou |

FOREIGN PATENT DOCUMENTS

| | | |
|---|---|---|
| DE | 10207309 A1 | 9/2003 |
| DE | 102011088867 A1 | 6/2012 |
| JP | H0548112 A | 2/1993 |
| JP | 2001230414 A | 8/2001 |
| JP | 2005210047 A | 8/2005 |
| JP | 2007311627 A | 11/2007 |
| JP | 2008078397 A | 4/2008 |
| JP | 2008205015 A | 9/2008 |
| JP | 2010251608 A | 11/2010 |
| JP | 2011159763 A | 8/2011 |
| JP | 2012064849 A | 3/2012 |
| JP | 2012080074 A | 4/2012 |
| JP | 2012134376 A | 7/2012 |
| JP | 2013008778 A | 1/2013 |
| JP | 2013048230 A | 3/2013 |
| JP | 2013084922 A | 5/2013 |
| JP | 2013138172 A | 7/2013 |
| JP | 2013254844 A | 12/2013 |
| JP | 2014007254 A | 1/2014 |
| JP | 2014061075 A | 4/2014 |
| JP | 2015056482 A | 3/2015 |
| JP | 2015103697 A | 6/2015 |
| JP | 2015135954 A | 7/2015 |
| JP | 2015138884 A | 7/2015 |
| JP | 2015177057 A | 10/2015 |
| JP | 2016006891 A | 1/2016 |
| JP | 2016012637 A | 1/2016 |
| JP | 2016096222 A | 5/2016 |
| JP | 2016131224 A | 7/2016 |
| JP | 2016225566 A | 12/2016 |
| JP | 2017050471 A | 3/2017 |
| JP | 2018037649 A | 3/2018 |
| JP | 2019012762 A | 1/2019 |
| WO | 2015068203 A1 | 5/2015 |
| WO | 2016030966 A1 | 3/2016 |
| WO | 2016042955 A1 | 3/2016 |
| WO | 2016080288 A1 | 5/2016 |
| WO | 2018030440 A1 | 2/2018 |

OTHER PUBLICATIONS

International Search Report for International Patent Application No. PCT/JP2017/028847, issued by the Japan Patent Office dated Nov. 7, 2017.
Office Action issued for counterpart Japanese Application No. 2018-533520, issued by the Japanese Patent Office dated Nov. 5, 2019 (drafted on Oct. 30, 2019).
Office Action issued for counterpart Japanese Application No. 2020-082256, issued by the Japan Patent Office dated Mar. 16, 2021 (drafted on Mar. 12, 2021).
Office Action issued for counterpart Japanese Application No. 2021-141610, issued by the Japan Patent Office dated Aug. 9, 2022 (drafted on Aug. 4, 2022).
U.S. Appl. No. 16/044,525, filed Jul. 25, 2018, to Tatsuya Naito.
U.S. Appl. No. 16/951,942, filed Nov. 18, 2020, to Tatsuya Naito.
Noice of First Office Action for Patent Application No. 201780007710. 9, issued by The National Intellectual Property Administration of the People's Republic of Chine dated Nov. 27, 2020.

* cited by examiner

SEMICONDUCTOR DEVICE AND MANUFACTURING METHOD OF SEMICONDUCTOR DEVICE

This application is a divisional of U.S. application Ser. No. 16/951,942, filed on Nov. 18, 2020, which is a continuation of U.S. application Ser. No. 16/044,525, filed Jul. 25, 2018, the entire contents of both of which are explicitly incorporated herein by reference. The application also claims priority from each of the following patent applications, all of which are explicitly incorporated herein by reference:
NO. 2016-158680 filed in JP on Aug. 12, 2016,
NO. 2017-025389 filed in JP on Feb. 14, 2017,
NO. 2017-111218 filed in JP on Jun. 5, 2017,
NO. 2017-119106 filed in JP on Jun. 16, 2017, and
NO. PCT/JP2017/028847 filed on Aug. 8, 2017.

BACKGROUND

1. Technical Field

The present invention relates to a semiconductor device and a manufacturing method of a semiconductor device.

2 Related Art

Conventionally, semiconductor devices of an Insulated Gate Bipolar Transistor (IGBT) and the like are known (see Patent Documents 1 to 3, for example).
Patent document 1: Japanese Patent Application Publication No. 2007-311627
Patent Document 2: Japanese Unexamined Patent Application Publication (Translation of PCT Application) No. 2014-61075
Patent document 3: Japanese Patent Application Publication No. 2015-138884

SUMMARY

In a semiconductor device, it is preferable to reduce a turn-on loss.

A first aspect of the present invention provides a semiconductor device. The semiconductor device may include a semiconductor substrate having a drift region of a first conductivity type. The semiconductor device may comprise an emitter region of the first conductivity type provided above the drift region inside the semiconductor substrate and having an doping concentration higher than that of the drift region. The semiconductor device may include a base region of a second conductivity type provided between the emitter region and the drift region inside the semiconductor substrate. The semiconductor device may include a first accumulation region of the first conductivity type provided between the base region and the drift region inside the semiconductor substrate and having a doping concentration higher than the drift region. The semiconductor device may include a plurality of trench portions provided to pass through the emitter region, the base region and the first accumulation region from an upper surface of the semiconductor substrate, and provided with a conductive portion inside. The semiconductor device may comprise a capacitance addition portion provided below the first accumulation region to add a gate-collector capacitance thereto.

The capacitance addition portion may include an accumulation region of the first conductivity type provided below the first accumulation region between two trench portions and having a doping concentration higher than that of the drift region. The capacitance addition portion may include a plurality of accumulation regions of the first conductivity type having a doping concentration higher than that of the drift region in a depth direction of the semiconductor substrate. At least one accumulation region formed at a lower side than the first accumulation region may have a doping concentration higher than the first accumulation region.

A peak position in a doping concentration distribution of the accumulation region formed at the lowest side in the depth direction of the semiconductor substrate may be arranged at an upper side than a lower end of the trench portion. A lower end of the above accumulation region formed at the lowest side may be arranged at an upper side than the lower end of the trench portion. In the depth direction of the semiconductor substrate, the peak position in the doping concentration distribution of the accumulation region formed at the lowest side may be arranged at a lower side than the center of the trench portion.

In an accumulation region other than the first accumulation region, the accumulation region at a lower side may have a doping concentration higher than that of the accumulation region at an upper side.

In the depth direction of the semiconductor substrate, an interval between the first accumulation region and an accumulation region arranged next to the first accumulation region may be larger than an interval between an accumulation region at the lowest side and the accumulation region that is second from the bottom. A doping concentration in a region between the first accumulation region and the accumulation region arranged next to the first accumulation region may be higher than the doping concentration in the drift region.

A minimum value of the doping concentration in a region between the first accumulation region and the accumulation region arranged next to the first accumulation region may be 1/10 or less of the peak value of the doping concentration in the first accumulation region. The first accumulation region contains phosphorus as a dopant, and an accumulation region other than the first accumulation region may contain hydrogen as a dopant.

The trench portion may have an emitter region, a base region, a trench provided to pass through the first accumulation region, and an insulating film formed in the inner wall of the trench to surround the conductive portion, from the upper surface of the semiconductor substrate. At least a part of the insulating film at a lower side than the first accumulation region may be formed thinner than an insulating film at an upper side than the first accumulation region. The insulating film at a lower side than the first accumulation region may function as a capacitance addition portion.

The trench portion may have an emitter region, a base region, a trench provided to pass through the first accumulation region, and an insulating film formed in the inner wall of the trench to surround the conductive portion, from the upper surface of the semiconductor substrate. At least a part of the insulating film at a lower side than the first accumulation region may be formed higher in dielectric constant than an insulating film at an upper side than the first accumulation region. The insulating film at a lower side than the first accumulation region may function as a capacitance addition portion.

The semiconductor device may include a high concentration region of the first conductivity type provided below the plurality of trench portions inside the semiconductor substrate and having a doping concentration higher than the drift region. The doping concentration of the high concentration region may be lower than the doping concentration of the first accumulation region. The semiconductor device may comprise a bottom region of the second conductivity type provided between the accumulation region at the lowest side and the drift region.

At least one trench portion in the plurality of trench portions may have a first tapered portion of which a width in a direction parallel to the upper surface of the semiconductor substrate becomes smaller as the width is measured at the upper side in the direction. The first tapered portion may be arranged at an upper side than the depth position at a boundary between the first accumulation region and the base region.

At least one trench portion may have a second tapered portion of which the above width is larger as going downward. The second tapered portion may be arranged at a lower side than the depth position at the boundary of the first accumulation region and the base region.

At least one trench portion may have a third tapered portion of which the above width is smaller as going downward. The third tapered portion may be arranged at a lower side than the depth position at the boundary of the first accumulation region and the base region.

At least one trench portion may have a maximum width portion to give a maximum width between the first tapered portion and the third tapered portion. Any of the accumulation regions may be arranged at the same depth position as that of the maximum width portion.

The plurality of trench portions may have the emitter region, the base region and the trench provided to pass through the first accumulation region from the upper surface of the semiconductor substrate. The plurality of trench portions may have an insulating film formed on an inner wall of a trench to surround a conductive portion. At least one trench portion of the plurality of trench portions may have a lower portion including a bottom portion of the trench portion. The trench portions may have a thin film portion provided at an upper side than the lower portion, and having an insulating film portion thinner than the insulating film at the lower portion. The accumulation region at the highest side may be arranged opposite to the thin film portion.

A second aspect of the present invention provides a semiconductor device comprising a semiconductor substrate including the drift region of the first conductivity type. The semiconductor device may have an emitter region of the first conductivity type provided above the drift region inside the semiconductor substrate and having a doping concentration higher than the drift region. The semiconductor device may have a base region of a second conductivity type provided between the emitter region and the drift region inside the semiconductor substrate. The semiconductor device may have an accumulation region of the first conductivity type provided between the base region and the drift region inside the semiconductor substrate and having a doping concentration higher than the drift region. The semiconductor device may have a plurality of trench portions provided to pass through the emitter region, the base region and the accumulation region from an upper surface of the semiconductor substrate and provided with a conductive portion inside. At least one trench portion of the plurality of trench portions may have a first tapered portion provided at an upper side than the depth position of the boundary between the accumulation region and the base region. A width of the first tapered portion in a surface parallel to the upper surface of the semiconductor substrate may be smaller as going upward. The trench portion may have a third tapered portion provided at a lower side than the depth position at a boundary between the accumulation region and the base region. The width of the third tapered portion may be smaller as going downward. The trench portion may have a maximum width portion provided between the first tapered portion and the third tapered portion to give a maximum width. The accumulation region may be arranged at the same depth position as that of the maximum width portion.

In the depth direction of the semiconductor substrate, when a distance from an upper end of the first accumulation region to a lower end of the accumulation region arranged at the lowest side is denoted as L1, and a distance from the lower end of the accumulation region arranged at the lowest side to the lower end of the trench portion is denoted as L2, the distance L2 may be twice or more and three times or less of the distance L1. The capacitance addition portion may have only one accumulation region of the first conductivity type. The doping concentration of the accumulation region of the first conductivity type may be higher than the doping concentration of the first accumulation region.

A third aspect of the present invention provides a manufacturing method of a semiconductor device. The manufacturing method may comprises an emitter region formation step that, inside the semiconductor substrate having the drift region of the first conductivity type, forms an emitter region of the first conductivity type provided above the drift region and having a doping concentration higher than that of the drift region. The manufacturing method may comprise a base region formation step of forming a base region of a second conductivity type provided between the emitter region and the drift region inside the semiconductor substrate. The manufacturing method may include a first accumulation region formation step that, inside the semiconductor substrate, forms a first accumulation region of the first conductivity type provided between the base region and the drift region and having a doping concentration higher than the drift region. The manufacturing method may comprise a trench formation of forming a plurality of trench portions provided to pass through the emitter region, the base region and the first accumulation region from an upper surface of the semiconductor substrate, and provided with a conductive portion inside. The manufacturing method may comprise a capacitance addition portion formation step of forming a capacitance addition portion provided below the first accumulation region to add a gate-collector capacitance thereto.

In the capacitance addition portion formation step, protons may be implanted from the upper surface side of the semiconductor substrate to form an accumulation region of the first conductivity type having a doping concentration higher than that of the drift region at a lower side of the first accumulation region.

The above summary clause of the invention does not necessarily describe all necessary features of the embodiments of the present invention. The present invention may also be a sub-combination of the features described above.

BRIEF DESCRIPTION OF THE DRAWINGS

FIG. 4 illustrates a waveform example of a collector current Ic at turn-on.

FIG. 15 illustrates one example of time waveforms of a gate voltage Vg and an inter-collector-emitter voltage Vce at turn-on.

DESCRIPTION OF EXEMPLARY EMBODIMENTS

Hereinafter, embodiments of the present invention will be described. The embodiments do not limit the invention according to the claims, and all the combinations of the features described in the embodiments are not necessarily essential to means provided by aspects of the invention.

Figure 1:
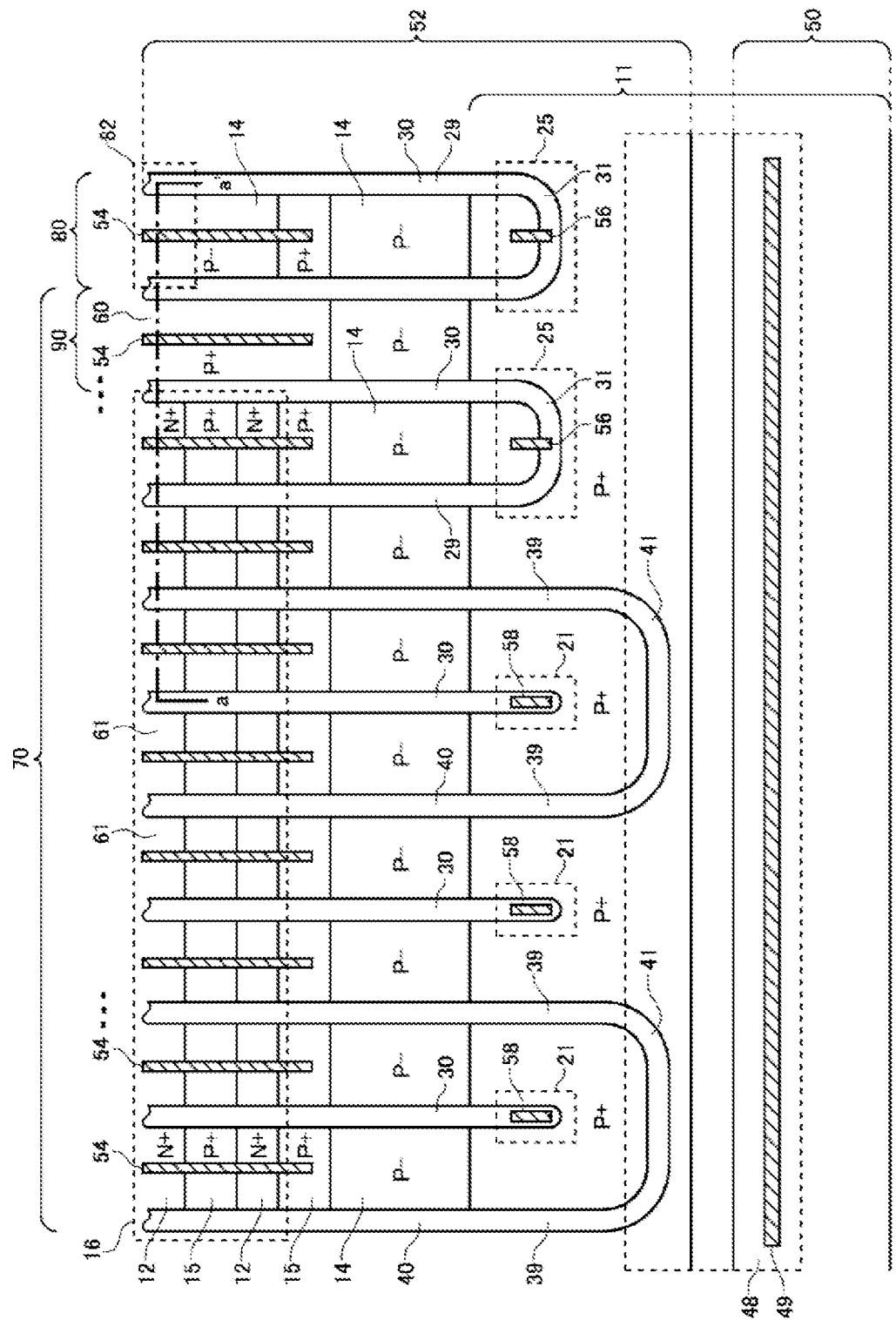
FIG. 1 illustrates a part of an upper surface of a semiconductor device 100 according to an embodiment of the present invention.

FIG. 1 illustrates a part of an upper surface of a semiconductor device 100 according to an embodiment of the present invention. The semiconductor device 100 of the present example is a semiconductor chip including a transistor section 70 which includes a transistor such as an IGBT and a diode section 80 which includes a diode such as an FWD (Free Wheel Diode). The diode section 80 is formed to be adjacent to the transistor section 70 on an upper surface of a semiconductor substrate. FIG. 1 illustrates an upper surface of the chip around an end portion of the chip and omits other regions.

Also, although FIG. 1 illustrates an active region of a semiconductor substrate in the semiconductor device 100, the semiconductor device 100 may have an edge termination structure portion surrounding the active region. The active region refers to a region where current flows when the semiconductor device 100 is controlled to be in an ON state. The edge termination structure portion relaxes electric field concentration on the upper surface side of the semiconductor substrate. The edge termination structure portion has a structure of, for example, a guard ring, a field plate, a RESURF, or a combination of them.

The semiconductor device 100 of the present example includes a gate trench portion 40 formed inside the upper surface side of the semiconductor substrate, a dummy trench portion 30, a well region 11, an emitter region 12, a base region 14 and a contact region 15. Also, the semiconductor device 100 of the present example includes an emitter electrode 52 and a gate metal layer 50 provided above the upper surface of the semiconductor substrate. The emitter electrode 52 and the gate metal layer 50 are provided to be separated from each other. The gate trench portion 40 and the dummy trench portion 30 are one example of the trench portion.

An interlayer insulating film is formed between the emitter electrode 52 and the gate metal layer 50, and the upper surface of the semiconductor substrate, but is omitted from FIG. 1. In the interlayer insulating film of the present example, a contact hole 56, a contact hole 58, a contact hole 49 and a contact hole 54 are formed to pass through the interlayer insulating film.

The emitter electrode 52 contacts the emitter region 12, the contact region 15 and the base region 14 on the upper surface of the semiconductor substrate through the contact hole 54. Also, the emitter electrode 52 is connected to a dummy conductive portion within the dummy trench portion 30 through the contact hole 56 and the contact hole 58. A connection section 21 and a connection section 25 may be provided between the emitter electrode 52 and the dummy conductive portion, which is formed of a conductive material such as polysilicon doped with impurities. The connection section 21 and the connection section 25 are formed on the upper surface of the semiconductor substrate. An insulating film such as a thermal oxide film is formed between the connection section 21 and the connection section 25, and the semiconductor substrate.

The gate metal layer 50 is in contact with a gate runner 48 through the contact hole 49. The gate runner 48 is formed of polysilicon doped with impurities, or the like. An insulating film such as a thermal oxide film is formed between the gate runner 48 and the semiconductor substrate. The gate runner 48 is connected to a gate conductive portion within the gate trench portion 40 on the upper surface of the semiconductor substrate. The gate runner 48 is not connected to the dummy conductive portion within the dummy trench portion 30. The gate runner 48 of the present example is formed from below the contact hole 49 to an edge portion 41 of the gate trench portion 40. The edge portion 41 is an end portion closest to the gate metal layer 50 in the gate trench portion 40. At the edge portion of the gate trench portion 40, the gate conductive portion is exposed to the upper surface of the semiconductor substrate and contacts the gate runner 48.

The emitter electrode 52 and the gate metal layer 50 are formed of a metal-containing material. For example, at least a partial region of each electrode and each metal layer is formed of aluminum or an aluminum-silicon alloy. Each electrode and each metal layer may have, at a layer underlying a region formed of aluminum or the like, a barrier metal formed of titanium, a titanium compound or the like. Furthermore, in the contact hole, there may be plugs formed by embedding of tungsten or the like such that it contacts the barrier metal, aluminum or the like.

One or more gate trench portions 40 and one or more dummy trench portions 30 are arrayed at a predetermined interval along a predetermined array direction (short direction) in a region of the transistor section 70. In the transistor section 70, one or more gate trench portions 40 and one or more dummy trench portions 30 may be formed alternately along the array direction.

The gate trench portion 40 of the present example may have two extending portions 39 that extends along an extending direction (longitudinal direction) perpendicular to the array direction (trench portions in a straight shape along the extending direction), and an edge portion 41 that connects between the two extending portions. At least a part of the edge portion 41 is preferably formed in a curved shape. In the two extending portions 39 of the gate trench portion 40, the end portions that are ends in a straight shape along the extending direction are connected to each other at the edge portion 41, and thus an electric field concentration at the end portions of the extending portions 39 can be relaxed. The gate runner 48 may be connected to the gate conductive portion at the edge portion 41 of the gate trench portion 40.

The dummy trench portion 30 of the present example is provided between the respective extending portions 39 of the gate trench portion 40. These dummy trench portions 30 may have a straight shape to extend in the extending direction.

In the transistor section 70, a boundary adjacent to the diode section 80 is provided with an intermediate region 90 on the surface of which an emitter region is not formed. Also, in the transistor section 70, a plurality of dummy trench portions 30 may be arrayed continuously at a portion adjacent to the intermediate region 90. The dummy trench portion 30 formed at the portion adjacent to the intermediate region 90 may also include the extending portions 29 and the edge portion 31. The edge portion 31 and the extending portion 29 have shapes similar to the edge portion 41 and the extending portion 39, respectively. The dummy trench portion 30 having the edge portion 31 and the dummy trench portion 30 in a straight shape may have the same length in the extending direction.

The number of dummy trench portions 30 arrayed continuously at the boundary with the diode section 80 may be greater than the number of dummy trench portions 30 arrayed continuously inside the transistor section 70 separate from the diode section 80. Note that the number of trench portions refers to the number of extending portions of the trench portions arrayed in the array direction.

In the example of FIG. 1, in the transistor section 70 at the boundary with the diode section 80 (that is, the intermediate region 90 and its adjacent portion), the dummy trench portion 30 having the edge portion 31 and the extending portion 29 is provided. In the example of FIG. 1, the two extending portions 29 connected through the edge portion 31 are arrayed continuously in the array direction perpendicular to the extending direction of the extending portion 29. On the other hand, inside the transistor section 70, the extending portion 39 of the gate trench portions 40 and the dummy trench portions 30 in a straight shape are arrayed alternately one by one.

The emitter electrode 52 is formed above the gate trench portion 40, the dummy trench portion 30, the well region 11, the emitter region 12, the base region 14 and the contact region 15. The well region 11 is formed in a predetermined range separate from the end in the longitudinal direction of the contact hole 54 in the active region on the side provided with the gate metal layer 50. A diffusion depth of the well region 11 may be greater than each depth of the gate trench portion 40 and the dummy trench portion 30. Some regions of the gate trench portion 40 and the dummy trench portion 30 on the gate metal layer 50 side are formed in the well region 11. The end of the dummy trench portion 30 in a straight shape in the extending direction and the bottom of the edge portion 31 of the dummy trench portion 30 may be covered with the well region 11.

A base region 14 is formed in a mesa portion 61 sandwiched by individual trench portions. In a region of the semiconductor substrate that is sandwiched by the trench portions, a mesa portion 61 refers to a region located in a more upper surface side than the deepest bottom portion of the trench portions. The base region 14 is of the second conductivity type and has a lower doping concentration than the well region 11. The well region 11 is of a second conductivity type. The base region 14 of the present example is of P− type and the well region 11 is of P+ type.

The contact region 15 of the second conductivity type having a higher doping concentration than that of the base region 14 is formed in the upper surface of the base region 14 in the mesa portion 61. The contact region 15 of the present example is of P+ type. The well region 11 may be formed separate, in the direction toward the gate metal layer 50, from a contact region 15, among the contact regions 15 in the active region, that is arranged at the most end in the extending direction of the trench portion. Also, in the transistor section 70, the emitter region 12 of the first conductivity type is selectively formed on a part of an upper surface of the contact region 15. The emitter region 12 has an doping concentration higher than that of the semiconductor substrate. The emitter region 12 of the present example is of N+ type.

Each of the contact region 15 and the emitter region 12 is formed to extend from one of the adjoined trench portions to the other. One or more contact regions 15 and one or more emitter regions 12 in the transistor section 70 are formed to be exposed to an upper surface of the mesa portion 61 alternately along the extending direction of the trench portion.

In another example, in the mesa portion 61 of the transistor section 70, the contact regions 15 and the emitter regions 12 may also be formed in a striped pattern along the extending direction. For example, the emitter region 12 is formed in a region in contact with the trench portion, and the contact region 15 is formed in a region sandwiched between the emitter regions 12.

The emitter region 12 does not need to be formed in the mesa portion 61 of the diode section 80. Also, in the mesa portion 61 of the intermediate region 90 (in the present specification, referred to as intermediate mesa portion 60), the contact region 15 is formed, across the dummy trench portion 30, in a region opposed to at least one contact region 15 in the transistor section 70. Moreover, among outermost surfaces of the intermediate mesa portion 60, the contact region 15 may be also formed in the outermost surface that faces mutually the emitter region 12 in the transistor section 70 adjacent across the dummy trench portion 30. In this case, the contact region 15 may be formed continuously to be sandwiched by the base region 14 exposed at both ends of the intermediate mesa portion 60 in the trench extending direction.

In the transistor section 70, the contact hole 54 is formed above each region of the contact region 15 and the emitter region 12. The contact hole 54 is not formed in the region corresponding to the base region 14 and the well region 11.

In the diode section 80, the contact hole 54 is formed above the contact region 15 and the base region 14. The contact hole 54 of the present example is not formed in the base region 14 closest to the gate metal layer 50, among a plurality of base regions 14 in the mesa portion 61 of the diode section 80. In the present example, the contact hole 54 of the transistor section 70 and the contact hole 54 of the diode section 80 have the same length in the extending direction of each trench portion.

In the diode section 80, the cathode region 82 of N+ type is formed on the lower surface of the semiconductor substrate. In FIG. 1, a region where the cathode region 82 is formed is shown by a dotted line. A collector region of P+ type may be formed in a region where the cathode region 82 is not formed in a region adjacent to the lower surface of the semiconductor substrate.

Figure 2:
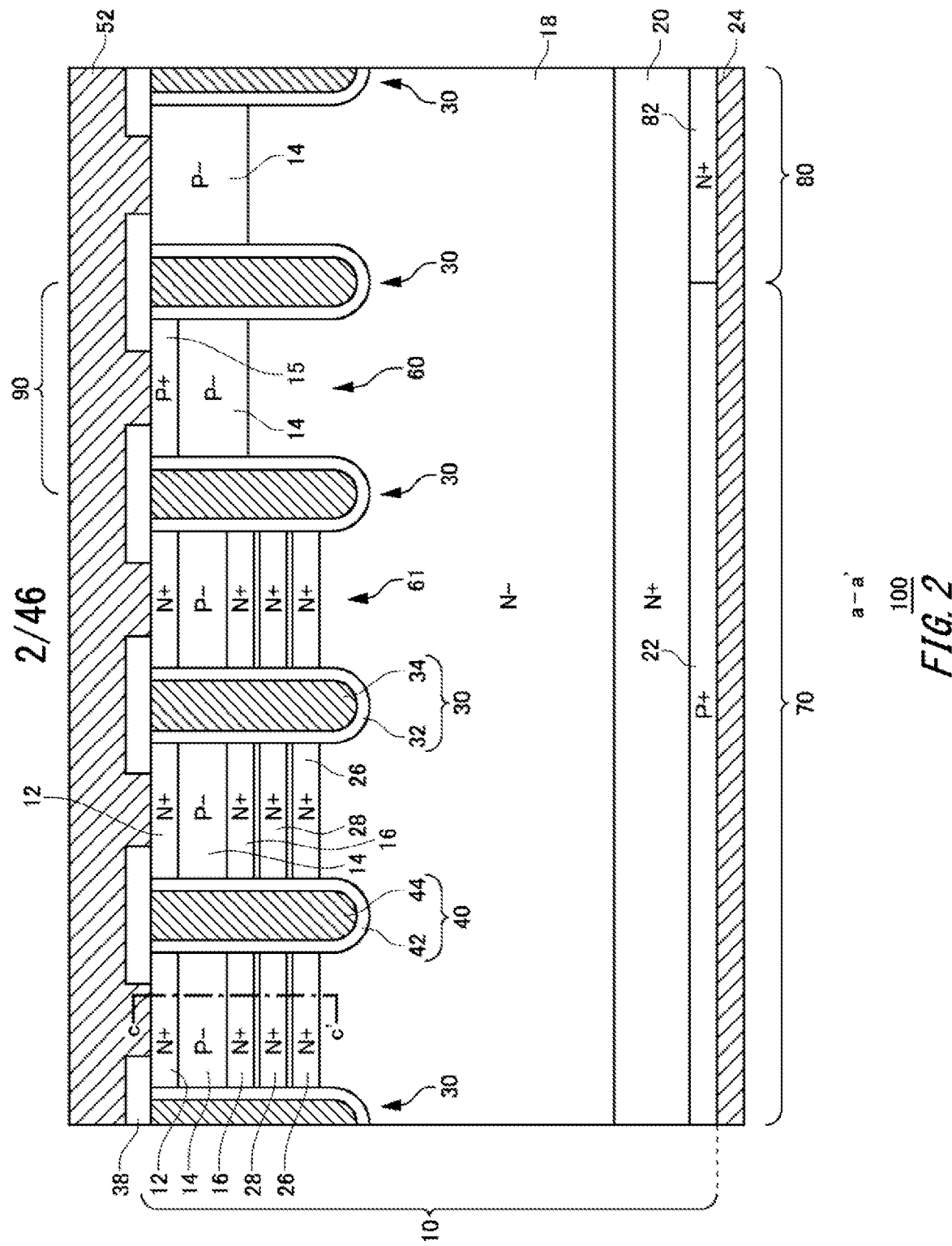
FIG. 2 illustrates one example in a cross-section a-a' in FIG. 1.

FIG. 2 illustrates one example in a cross-section a-a' in FIG. 1. The semiconductor device 100 of the present example includes, in the cross-section, a semiconductor substrate 10, an interlayer insulating film 38, the emitter electrode 52 and a collector electrode 24. The emitter electrode 52 is formed on an upper surface of the semiconductor substrate 10 and the interlayer insulating film 38.

The collector electrode 24 is formed on a lower surface of the semiconductor substrate 10. The emitter electrode 52 and the collector electrode 24 are formed of a conductive materials such as metal. In the present specification, a direction connecting the emitter electrode 52 and the collector electrode 24 is referred to as a depth direction.

The semiconductor substrate 10 may be a silicon substrate, may be a silicon carbide substrate, or may be a nitride semiconductor substrate such as gallium nitride or the like. The semiconductor substrate 10 of the present example is a silicon substrate. The base region 14 of P− type is formed in an upper surface side of the semiconductor substrate 10 in the cross-section.

In the cross-section, in an upper surface side of the transistor section 70, the emitter region 12 of N+ type, the base region 14 of P− type and the first accumulation region 16 of N+ type are formed in order from the upper surface side of the semiconductor substrate 10.

In the cross-section, the base region 14 of P− type is formed in an upper surface side of the diode section 80. The first accumulation region 16 is not formed in the diode section 80. Also, the contact region 15 is formed on an upper surface of an intermediate mesa portion 60 adjacent to the transistor section 70.

In the transistor section 70, the drift region 18 of N− type is formed on a lower surface of the first accumulation region 16. The first accumulation region 16 having a concentration higher than the drift region 18 can be provided between the drift region 18 and the base region 14, thereby increasing a carrier injection enhanced effect (IE effect) and reducing an ON voltage.

The first accumulation region 16 is formed in each mesa portion 61 of the transistor section 70. The first accumulation region 16 may be provided to cover the whole lower surface of the base region 14 in each mesa portion 61. In the diode section 80, the drift region 18 is formed in a lower surface of the base region 14. In both of the transistor section 70 and the diode section 80, a buffer region 20 of the N+ type is formed on a lower surface of the drift region 18.

The buffer region 20 is formed at a lower surface side of the drift region 18. The doping concentration of the buffer region 20 is higher than a doping concentration of the drift region 18. The buffer region 20 may function as a field stop layer to prevent a depletion layer, expanded from a lower surface side of the base region 14, from reaching a collector region 22 of P+ type and a cathode region 82 of N+ type.

In the transistor section 70, the collector region 22 of P+ type is formed in a lower surface of the buffer region 20. In the diode section 80, the cathode region 82 of N+ type is formed in a lower surface of the buffer region 20. Note that in the active region, a region in the lower surface that coincides with the cathode region 82 is taken as the diode section 80. Alternatively, a projection region where the cathode region 82 is projected to the upper surface of the semiconductor substrate 10 in a direction perpendicular to the lower surface of the semiconductor substrate 10 may be taken as the diode section 80. Also, in the active region, the following region is taken as the transistor section 70: in a projection region where the collector region 22 is projected in a direction perpendicular to the lower surface of the semiconductor substrate 10 with respect to the upper surface of the semiconductor substrate, a predetermined unit structure that includes the emitter region 12 and the contact region 15 is regularly arranged.

One or more gate trench portions 40 and one or more dummy trench portions 30 are formed in the upper surface side of the semiconductor substrate 10. Each trench portion passes through the base region 14 from the upper surface of the semiconductor substrate 10 and reaches the drift region 18. In a region provided with at least either of the emitter region 12, the contact region 15 and the first accumulation region 16, each trench portion also passes through these regions and reaches the drift region 18. A configuration that a trench portion penetrates a doping region is not limited to the one manufactured in the order of forming the doping region and then forming the trench portion. A configuration that is manufactured by forming the trench portion and thereafter forming the doping region between the trench portions is also included in the configuration that the trench portion penetrates the doping region.

For example, in a plan view shown in FIG. 1, the end of the first accumulation region 16 in the extending direction of the trench portion may be positioned inside the contact regions 15 that are arranged at both ends of the trench portion in the extending direction (at the lower portion of the contact region 15 in the depth direction of the semiconductor substrate 10). Further, the end of the first accumulation region 16 in the extending direction of the trench portion may be positioned nearer to the gate metal layer 50 side than the emitter region 12, and nearer to the emitter region 12 side than the end of the contact hole 54 in the extending direction.

The gate trench portion 40 has a gate trench, a gate insulating film 42 and a gate conductive portion 44 that are formed in the upper surface side of the semiconductor substrate 10. The gate insulating film 42 is formed to cover an inner wall of the gate trench. The gate insulating film 42 may be formed by oxidizing or nitriding semiconductors on the inner wall of the gate trench. The gate conductive portion 44 is formed inside the gate trench in a more inner side than the gate insulating film 42. That is, the gate insulating film 42 insulates the gate conductive portion 44 from the semiconductor substrate 10. The gate conductive portion 44 is formed of a conductive material such as polysilicon.

The gate conductive portion 44 includes a region facing at least an adjacent base region 14 in the depth direction, with the gate insulating film 42 being sandwiched therebetween. The gate trench portion 40 in the cross-section is covered with the interlayer insulating film 38 on the upper surface of the semiconductor substrate 10. When a predetermined voltage is applied to the gate conductive portion 44, a channel as an inversion layer of electrons is formed in the interfacial surface layer of the base region 14 in contact with the gate trench.

The dummy trench portion 30 may have the same structure as that of the gate trench portion 40 in the cross-section. The dummy trench portion 30 has a dummy trench, a dummy insulating film 32 and a dummy conductive portion 34 that are formed in the semiconductor substrate 10 on its upper surface side. The dummy insulating film 32 is formed to cover an inner wall of the dummy trench. The dummy conductive portion 34 is formed inside the dummy trench and formed in a more inner side than the dummy insulating film 32. The dummy insulating film 32 insulates the dummy conductive portion 34 from the semiconductor substrate 10. The dummy conductive portion 34 may be formed of the same material as that of the gate conductive portion 44. For example, the dummy conductive portion 34 is formed of a conductive material such as polysilicon. The dummy conductive portion 34 may have a length in the depth direction which is the same as that of the gate conductive portion 44. The dummy trench portion 30 in the cross-section is covered with the interlayer insulating film 38 on the upper surface of the semiconductor substrate 10. Note that the bottom portions of the dummy trench portion 30 and the gate trench portion 40 may have a shape of a curved surface (a curved shape in the cross-section) that is downward convex.

The semiconductor device 100 further includes a capacitance addition portion provided below the first accumulation region 16 in the mesa portion 61 to add the gate-collector capacitance thereto. That is, as compared to a case where the capacitance addition portion is not provided, the capacitance addition portion increases a transient gate-collector capacitance at turn-on between the gate conductive portion 44 and the collector electrode 24. The semiconductor device 100 in an example of FIG. 2 has a second accumulation region 26 as the capacitance addition portion.

The second accumulation region 26 is provided below the first accumulation region 16 between the two trench portions. At least one of the two trench portions in contact with the second accumulation region 26 may be the gate trench portion 40. Also, the second accumulation region 26 may be also provided between the two dummy trench portions 30. The second accumulation region 26 are the region of N+ type having a doping concentration higher than that of the drift region 18.

Also, three or more accumulation regions may be provided between the two trench portions. In the example of FIG. 2, the third accumulation region 28 is provided between the first accumulation region 16 and the second accumulation region 26. The third accumulation region 28 is a region of N+ type having a doping concentration higher than that of the drift region 18.

Figure 3:
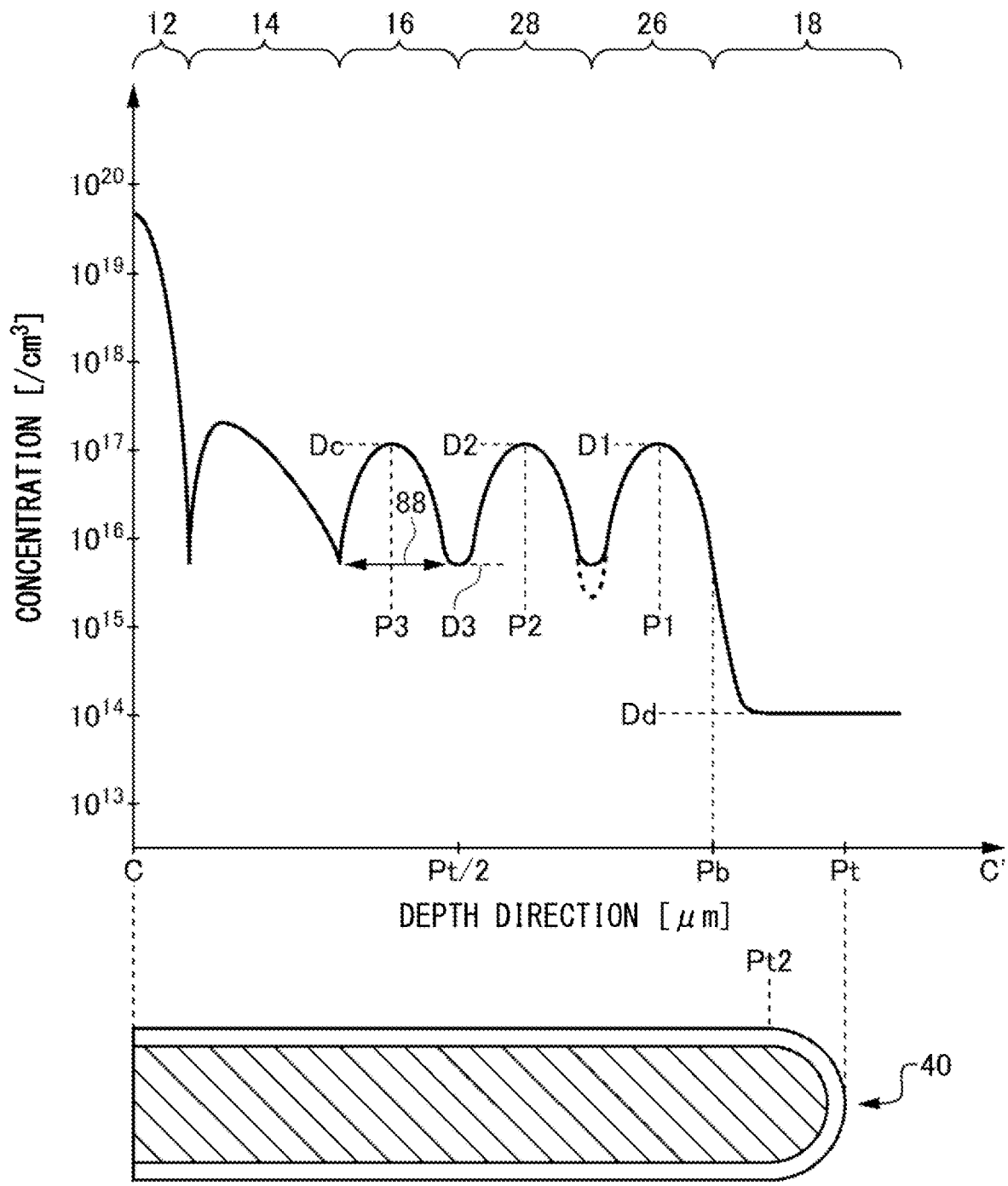
FIG. 3 illustrates one example of a doping concentration distribution in a cross-section c-c' in FIG. 2.

FIG. 3 illustrates one example of a doping concentration distribution in a cross-section c-c' of FIG. 2. FIG. 3 illustrates a doping concentration distribution from the emitter region 12 in the transistor section 70 to the upper end of the drift region 18. As shown in FIG. 3, the vertical axis in a figure illustrating a concentration of doping is a logarithmic axis. One graduation in the vertical axis indicates 10 times thereof. In this specification, the doping concentration refers to the concentration of impurities (dopant) transformed to donors or acceptors. The impurity concentration shown in FIG. 3 corresponds to a difference between concentrations of donors and acceptors (net doping concentration).

The doping concentration distribution in the depth direction has a peak in each of the first accumulation region 16, the third accumulation region 28 and the second accumulation region 26. The first accumulation region 16, the third accumulation region 28 and the second accumulation region 26 may be formed by implantation of impurities from the upper surface or the lower surface of the semiconductor substrate 10.

As one example, a peak value Dc of the doping concentration in the first accumulation region 16, a peak value D2 of the doping concentration in the third accumulation region 28, and a peak value D1 in the doping concentration distribution of the second accumulation region 26 are the same. Note that these peak values may have an error within approximately ±10%.

As one example, a peak position P3 of the doping concentration in the first accumulation region 16, a peak position P2 of the doping concentration in the third accumulation region 28, and a peak position P1 in the doping concentration distribution of the second accumulation region 26 are located at the regular intervals in the depth direction. Note that these peak positions may have an error within approximately ±10%. A distance between the peak position P3 and the peak position P1 may be longer than the width of the first accumulation region 16 in the depth direction. In addition, a distance between the peak position P3 and the peak position P2 may also be longer than the width of the first accumulation region 16 in the depth direction. Here, the width of the first accumulation region 16 in the depth direction may be, for example, a full width at half maximum (FWHM) with respect to the peak concentration, or may also be a width between positions that exhibit local minimum values in doping concentration before and after the peak position as shown in a two-way arrow 88 in FIG. 3.

Also, among the multiple accumulation regions, the accumulation region formed at the lowest side (second accumulation region 26 in the present example) is preferably provided in the mesa portion 61 in the vicinity of a lower end of the trench portion in contact with the accumulation region. Note that among the multiple accumulation regions, a peak position P1 of the accumulation region formed at the lowest side (second accumulation region 26 in the present example) is preferably arranged at an upper side than a lower end position Pt of the adjacent gate trench portion 40. Furthermore, it may be arranged at an upper side than a boundary Pt2 that the trench sidewall is changed from an approximately straight shape into a curved surface. When the second accumulation region 26 is provided in a region sandwiched between the trench portions is provided, a transient gate-collector capacitance at turn-on can be increased.

Also, among the multiple accumulation regions, a position Pb at the lower end of the accumulation region formed at the lowest side (second accumulation region 26 in the present example) may be arranged at an upper side than a lower end position Pt of the gate trench portion 40 in contact with the accumulation region. Further, it may be arranged at an upper side than the boundary Pt2 that the trench sidewall is changed from an approximately straight shape into a curved surface. At a lower side than a peak P1 of the second accumulation region 26, the lower end of the second accumulation region 26 may be a position that exhibits a doping concentration corresponding to 10 times of the doping concentration Dd of the drift region 18.

The doping concentration in a region between the first accumulation region 16 and an accumulation region arranged next to the first accumulation region 16 (in the present example, the third accumulation region 28) may be higher than the doping concentration of the drift region Dd. That is, a local minimum value D3 in a doping concentration distribution at a boundary between the first accumulation region 16 and the third accumulation region 28 may be larger than the doping concentration Dd in the drift region. A local minimum value in a doping concentration distribution at a boundary between accumulation regions other than the first accumulation region 16 may also be larger than the doping concentration Dd in the drift region.

Note that when a local minimum value D3 in a doping concentration distribution at a boundary between the first accumulation region 16 and an accumulation region arranged next to the first accumulation region 16 (third accumulation region 28 in the present example) becomes too close to the peak value Dc of the doping concentration in the first accumulation region 16, the first accumulation region 16 and the third accumulation region 28 comes to function as one accumulation region. For this reason, the accumulation region provided below the first accumulation region 16 becomes unable to function as a capacitance addition region. That is, a doping concentration between the first accumulation region 16 and an accumulation region as an adjacent capacitance addition region (second accumulation region 26 in the present example) may be lower than the peak concentration of the first accumulation region 16 at a predetermined ratio. As one example, a local minimum value D3 in a doping concentration distribution at a boundary between the first accumulation region 16 and the third accumulation region 28 may be 1/10 or less of a peak value Dc of the doping concentration in the first accumulation region 16. The local minimum value D3 may be 1/100 or less of the peak value Dc.

Also, a peak position P1 of the accumulation region formed at the lowest side (second accumulation region 26 in the present example) among the multiple accumulation regions may be arranged at a lower side than the center of the adjacent gate trench portion 40. Also, a peak position P2 of the accumulation region arranged next to the first accumulation region 16 (third accumulation region 28 in the present example) may be arranged at a lower side than the center of the adjacent gate trench portion 40.

Also, the peak position P1 of the accumulation region (second accumulation region 26 in the present example) formed at the lowest side among the multiple accumulation regions may be arranged in a range of 1/4 at the lower side of the adjacent gate trench portion 40, or may be arranged in a range of 1/8 at the lower side thereof. When the second accumulation region 26 is provided in the vicinity of the bottom portion of the gate trench portion 40, a transient gate-collector capacitance at turn-on can be increased.

Note that between the second accumulation region 26 and the third accumulation region 28, a minimum concentration at a portion that the doping concentration distribution exhibits a valley shape may be lower than a minimum concentration at a portion that the doping concentration distribution exhibits a valley shape between the first accumulation region 16 and the second accumulation region 26. In this way, a transient gate-collector capacitance at turn-on can be increased efficiently.

When the accumulation region is arranged in the vicinity of the base region 14, a negative capacitance will be increased, so that a transient positive capacitance between gate and collector cannot be increased. On the other hand, adjustment of the positions of the individual accumulation regions as described above, for example, makes it possible to increase the transient positive capacitance between gate and collector.

Figure 4:
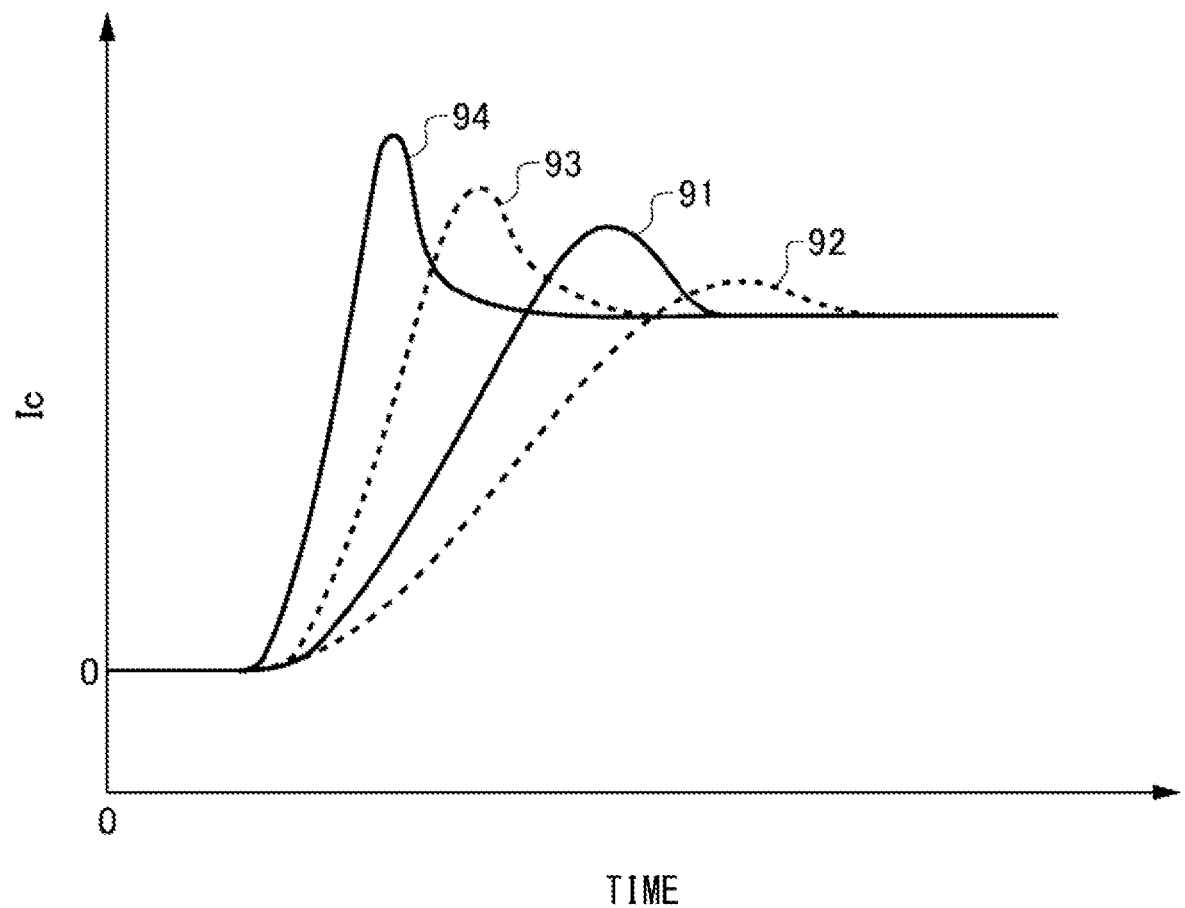

FIG. 4 illustrates a waveform example of a collector current Ic at turn-on. A waveform 93 shows an collector current Ic in a case where none of the first accumulation region 16, the second accumulation region 26 and the third accumulation region 28 are provided.

A waveform 94 shows an collector current Ic in a case where the first accumulation region 16 is provided, while the second accumulation region 26 and the third accumulation region 28 are not provided. Since the first accumulation region 16 is provided in the vicinity of the base region 14, a negative capacitance between gate and collector can be increased. For this reason, di/dt of the collector current Ic at turn-on is increased. Although providing the first accumulation region 16 can improve a trade-off between an ON voltage and a turn-off loss, it also increases di/dt at turn-on. Therefore, increasing the gate resistance to suppress the increase of di/dt results in the increase of the turn-on loss.

The waveform 91 shows a collector current Ic in a case where the first accumulation region 16 and the second accumulation region 26 are provided. Since the second accumulation region 26 is provided at a position separate from the base region 14, the capacitance between gate and collector is increased. For this reason, di/dt of the collector current Ic at turn-on is reduced. Accordingly, the turn-on loss can be reduced while the trade-off between the ON voltage and the turn-off loss is improved.

The waveform 92 shows a collector current Ic in a case where the first accumulation region 16, the second accumulation region 26 and the third accumulation region 28 are provided. Providing the third accumulation region 28 further increases the capacitance between gate and collector. For this reason, the turn-on loss can be reduced while the trade-off between the ON voltage and the turn-off loss is improved.

Figure 5:
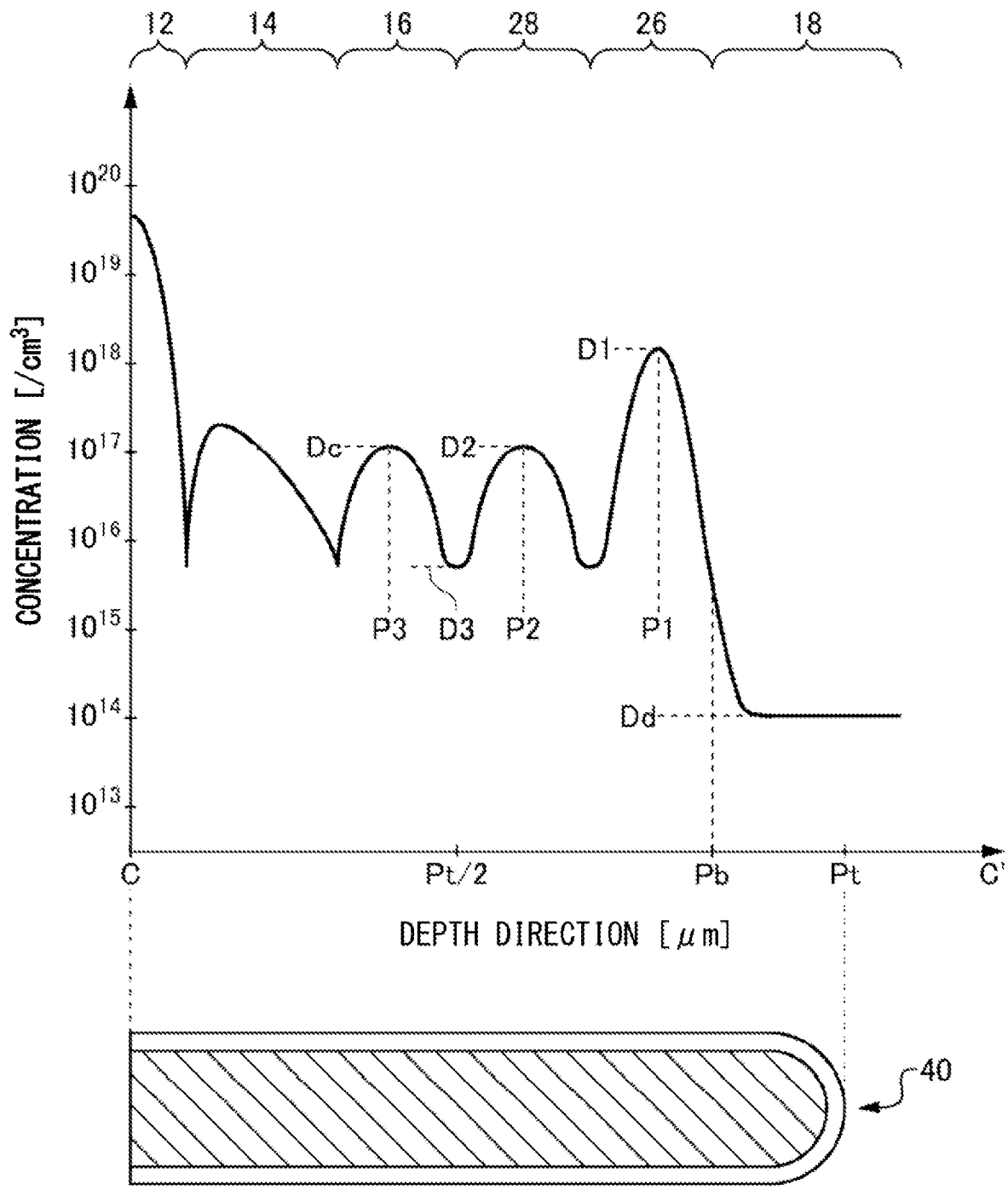
FIG. 5 illustrates another example of a doping concentration distribution in a cross-section c-c' of FIG. 2.

FIG. 5 illustrates another example of a doping concentration distribution in a cross-section c-c' of FIG. 2. In the present example, an accumulation region at a lower side in an accumulation region other than the first accumulation region 16 has a doping concentration higher than that of an accumulation region at an upper side. More specifically, the peak value D1 of the doping concentration distribution in the second accumulation region 26 is higher than the peak value D2 of the doping concentration in the third accumulation region 28. The peak value D1 of the doping concentration distribution in the second accumulation region 26 may be higher than the peak value Dc of the doping concentration in the first accumulation region 16. For example, the peak value D1 of the doping concentration distribution in the second accumulation region 26 may be set at approximately three times to seven times of the peak value Dc of the doping concentration in the first accumulation region 16. With this configuration, an effect in an increase of the negative capacitance by the first accumulation region 16 is relaxed, di/dt of the collector current Ic at turn-on can be reduced. Accordingly, when the accumulation effect by the IE effect is further increased by a high concentration of the doping concentration in the second accumulation region 26, the turn-on di/dt is reduced while the trade-off between the ON voltage and the turn-off loss is improved, so that the turn-on loss can be further decreased.

Also, the peak value D1 in the doping concentration distribution of the second accumulation region 26 at the lowest side may be smaller than each of the peak values D2, Dc of the doping concentrations in the first accumulation region 16 and the third accumulation region 28. When the doping concentration of the accumulation region having the longest distance from the base region 14 is lessened, a capacitance addition amount between gate and collector can be reduced efficiently.

Figure 6:
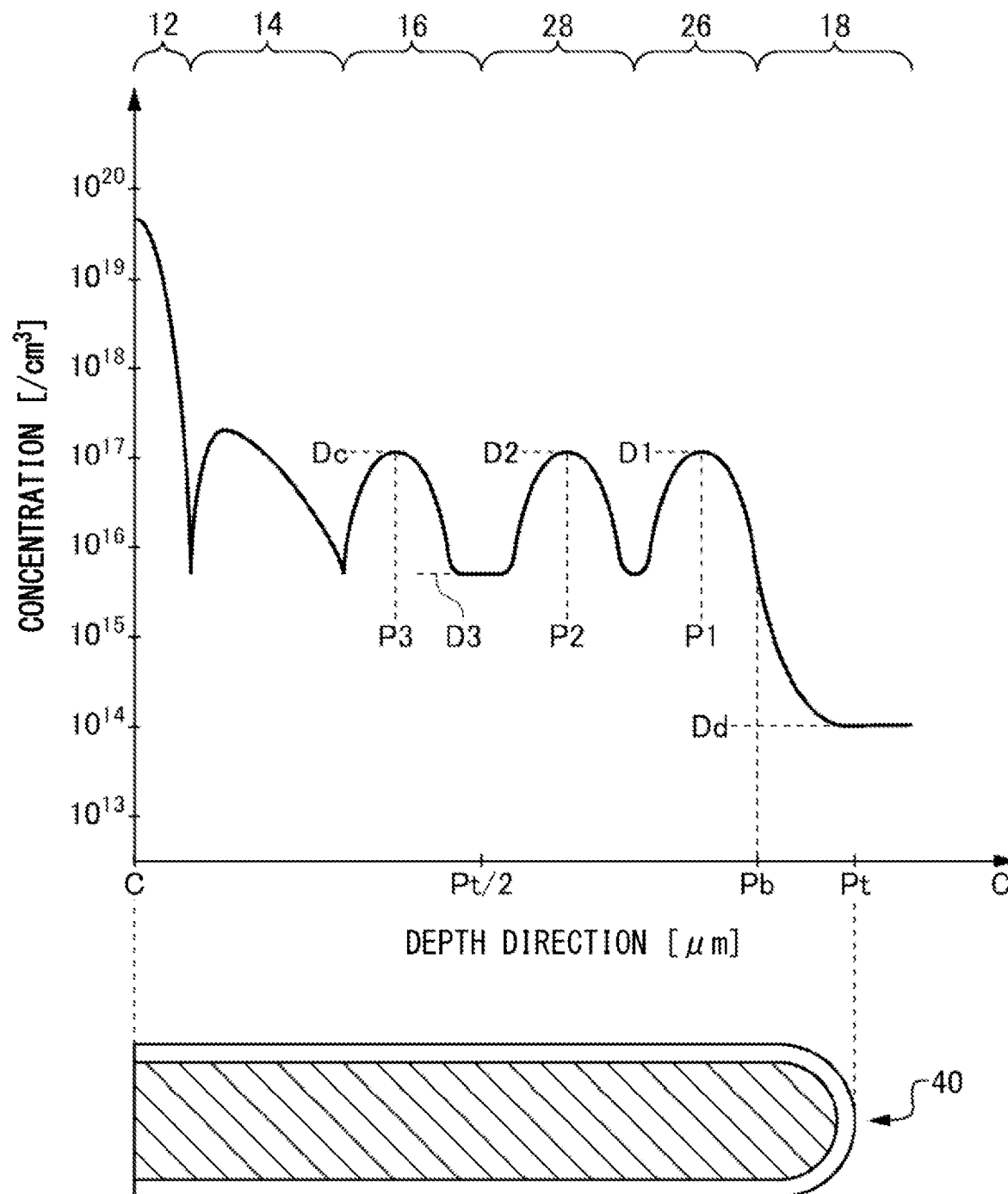
FIG. 6 illustrates another example of a doping concentration distribution in a cross-section c-c' of FIG. 2.

FIG. 6 illustrates another example of a doping concentration distribution in a cross-section c-c' of FIG. 2. In the present example, in the depth direction of the semiconductor substrate 10, an interval P2-P3 between the first accumulation region 16 and the accumulation region arranged next to the first accumulation region 16 (third accumulation region 28 in the present example) is larger than an interval P1-P2 between the accumulation region at the lowest side (second accumulation region 26 in the present example) and the accumulation region that is second from the bottom (third accumulation region 28 in the present example).

The interval P2-P3 may be 1.5 times or more of the interval P1-P2, or may also be twice or more thereof. Also, the interval between the accumulation regions may be constant. There are some cases that when the accumulation region is formed in the vicinity of the base region 14, a negative capacitance between gate and collector will be increased; however, with the aforementioned configuration, the capacitance addition amount can be increased efficiently without an increase in the negative capacitance between gate and collector.

Figure 7:
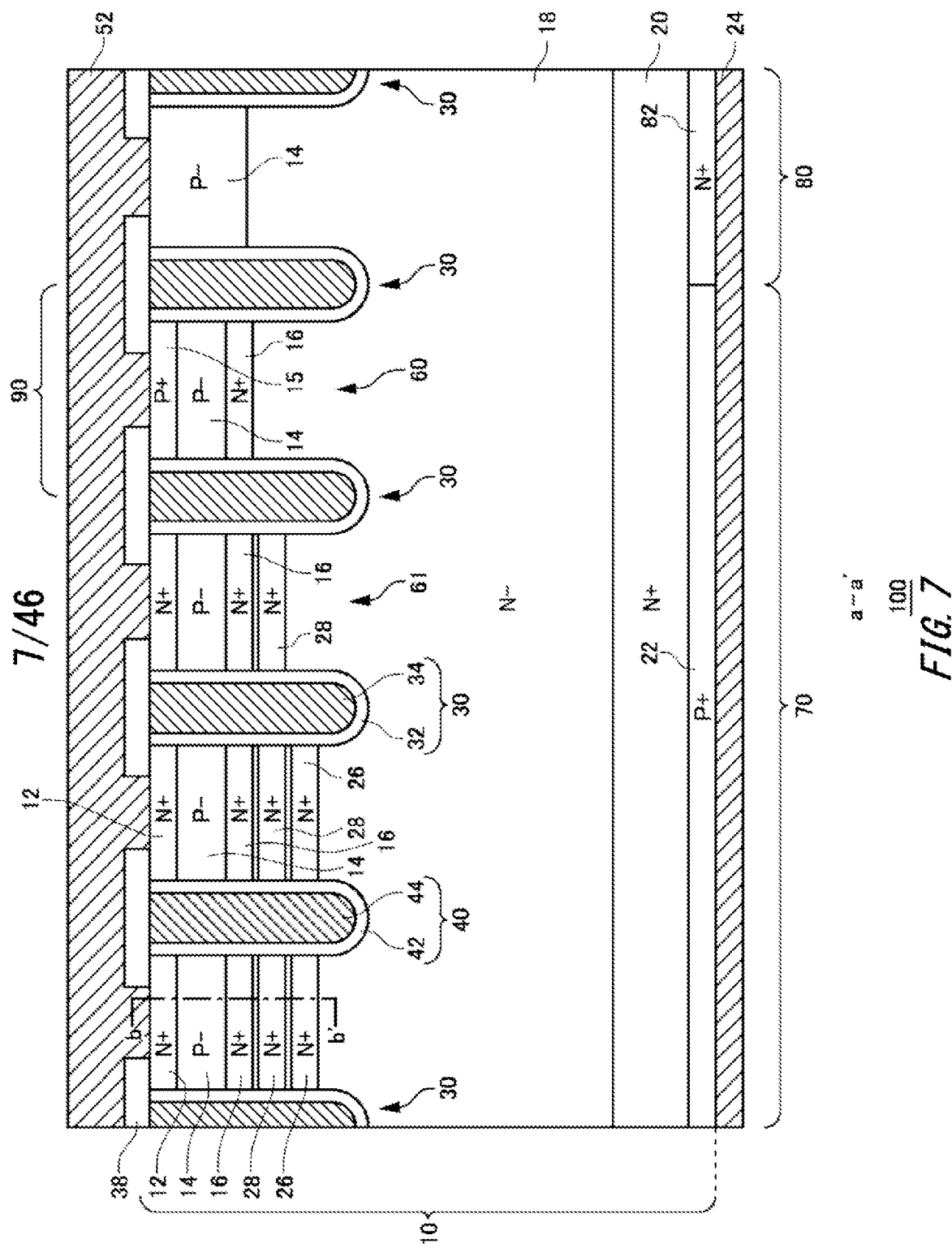
FIG. 7 illustrates another example in a cross-section a-a' in FIG. 1.

FIG. 7 illustrates another example in a cross-section a-a' in FIG. 1. In the present example, the number of the accumulation regions in each of the intermediate region 90, and the mesa portion 61 adjacent to the intermediate region 90 across the dummy trench portion 30 in the transistor section 70 is smaller than the number of the accumulation regions in the mesa portion 61 inside the transistor section 70. The number of the accumulation regions of the mesa portion 61 in the transistor section 70 may be reduced with an approach thereof to the intermediate region 90.

In in the example of FIG. 7, the third accumulation region 28 is formed in the mesa portion 61 adjacent to the intermediate region 90 across the dummy trench portion 30, but not formed in the second accumulation region 26. With respect to the mesa portion 61, the third accumulation region 28 and the second accumulation region 26 are formed in the mesa portion 61 that is adjacent on the opposite side to the intermediate region 90. With this configuration, the number of the accumulation regions can be gradually changed, which can relax electric field concentration in the boundary portion.

Also, the first accumulation region 16 may be formed in the mesa portion 61 of the intermediate region 90 (intermediate mesa portion 60). Another accumulation region is not formed in the intermediate mesa portion 60. Also, the contact region 15 may be formed in the vicinity of the upper surface of the semiconductor substrate 10 in the intermediate mesa portion 60. Also, with respect to the intermediate mesa portion 60, in the mesa portion 61 of the diode section 80, none of the first accumulation region 16, the second accumulation region 26 and the third accumulation region 28 are formed. With this configuration, the number of the regions of N+ type formed at the lower side of the base region 14 can be gradually changed.

Figure 8:
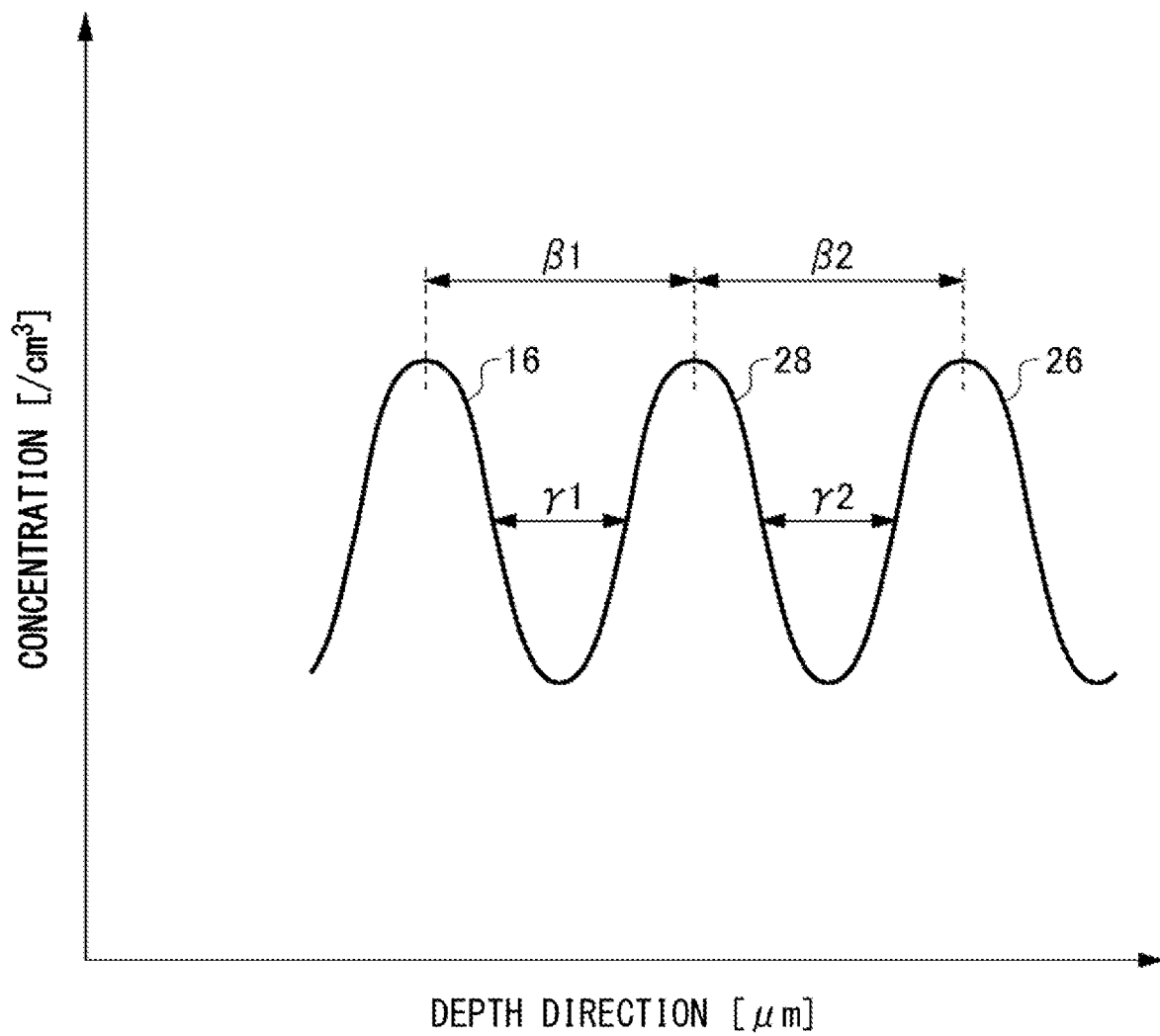
FIG. 8 illustrates an exemplary arrangement of a first accumulation region 16, a second accumulation region 26 and a third accumulation region 28.

FIG. 8 illustrates an exemplary arrangement of the first accumulation region 16, the third accumulation region 28 and the second accumulation region 26. In FIG. 8, the horizontal axis represents the depth direction of the semiconductor substrate 10, and the vertical axis represents the doping concentration. Also, a length of the gate trench portion 40 that protrudes to the lower side from the lower end of the base region 14 is denoted as α, and an interval between peak positions of individual accumulation regions is denoted as β.

Also, in the doping concentration distribution of each accumulation region, an interval of positions corresponding to a 1/10 times concentration of the peak concentration is denoted as γ. For example, an interval is denoted as γ1 between a position corresponding to the 1/10 times concentration of the peak concentration at a lower side than the peak position in the doping concentration distribution of the first accumulation region 16, and a position corresponding to the 1/10 times concentration of the peak concentration at an upper side than the peak position in the doping concentration distribution of the third accumulation region 28. Similarly, an interval is denoted as γ2 between a position corresponding to the 1/10 times concentration of the peak concentration at a lower side than the peak position in the doping concentration distribution of the third accumulation region 28, and a position corresponding to the 1/10 times concentration of the peak concentration at an upper side than the peak position in the doping concentration distribution of the second accumulation region 26.

The interval βk between the individual peak positions (k=1, 2, . . . toward the lower surface side) is approximately 0.3α or more, and 0.9α or less. As described above, β1 may be larger than β2. Also, the individual interval γk is approximately 0.2βk or more, and 0.8βk or less. Although the doping concentration distribution in FIG. 8 is a Gaussian distribution, in another example, the doping concentration distribution may have a shape such as a rectangular. As one example, when each region is formed by ion implantation, the doping concentration distribution is approximated by the Gaussian distribution, while when each region is formed by epitaxial growth, the doping concentration distribution is approximated by the rectangular. When the doping concentration distribution is the rectangular, the peak position is the center of a section in which the doping concentration exhibits a local maximum value.

βk may be smaller as the depth increases toward the lower surface side in the depth direction of the semiconductor substrate 10. Alternatively, βk may be larger as the depth increases toward the lower surface side in the depth direction. Also, γk may be larger as the depth increases toward the lower surface side in the depth direction. Alternatively, γk may be smaller as the depth increases toward the lower surface side in the depth direction.

In the multiple accumulation regions, with respect to a depth at a midpoint between the base region 14 and a trench bottom, the number of the accumulation regions on a trench bottom side may be larger than the number of the accumulation regions on a base region 14 side. Alternatively, in the multiple accumulation regions, with respect to the depth at the midpoint between the base region 14 and the trench bottom, the number of the accumulation regions on the trench bottom side may be smaller than the number of the accumulation regions on the base region 14 side.

Figure 9:
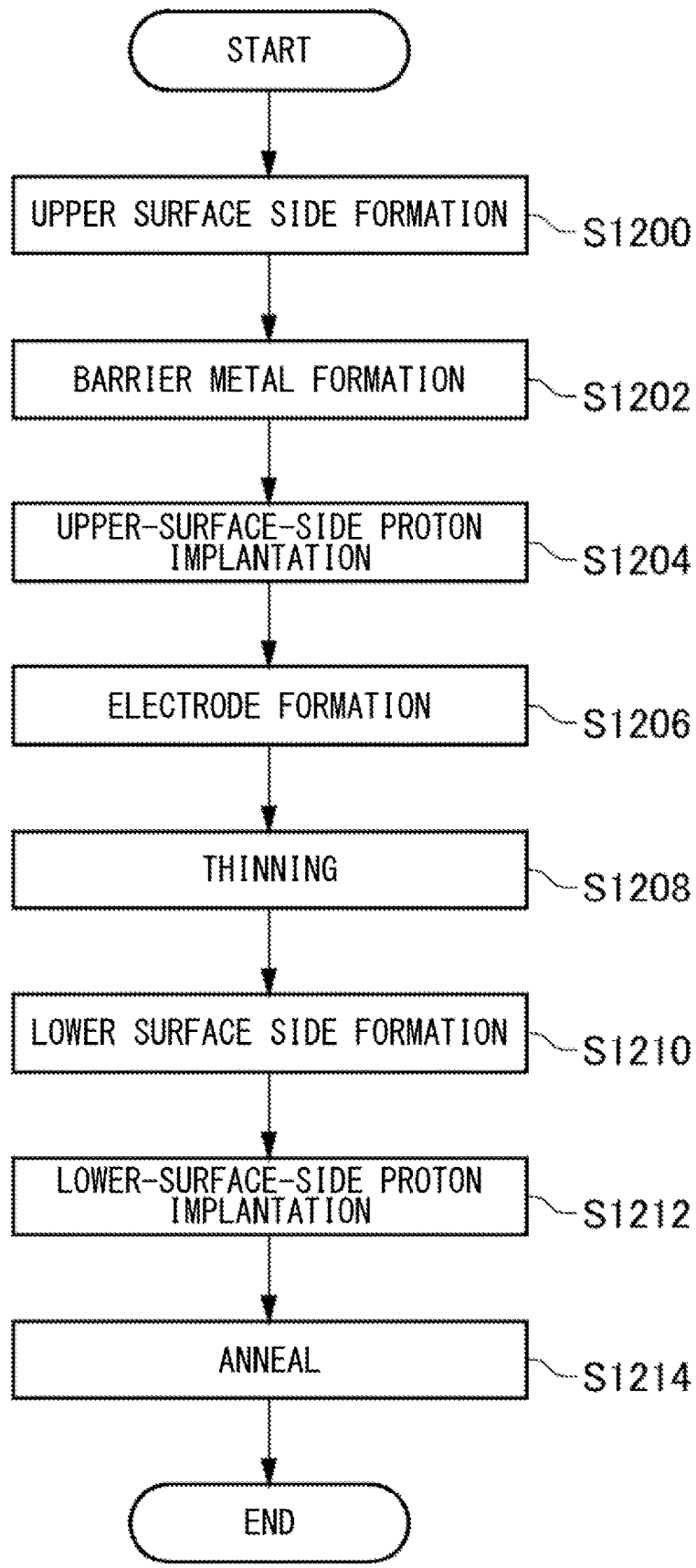
FIG. 9 is a flowchart showing one example of a manufacturing method of the semiconductor device 100.

FIG. 9 is a flowchart showing one example of a manufacturing method of the semiconductor device 100. First, at process S1200, a structure on the upper surface side of the semiconductor device 100 is formed. A doping region formation step of forming the emitter region 12 and the base region 14 is included at process S1200. The base region 14 may be formed by implantation of doping such as phosphorus. Also, a trench formation step that forms each trench portion after the doping region formation step is included at process S1200. Also, an interlayer-insulating-film formation step of forming an interlayer insulating film 38 to cover each trench portion is included at process S1200.

Next at process S1202, a barrier metal is formed on the whole upper surface of the semiconductor substrate 10 and the interlayer insulating film 38. Next at process S1204, the first accumulation region 16 and another accumulation region (for example, the second accumulation regions 26 and the third accumulation region 28) are formed by implantation of protons from the upper surface side of the semiconductor substrate 10. At process S1204, protons are implanted thereinto by a plurality of times while a range for implanting protons is varied. A part of the implanted protons is transformed to donors to form each accumulation region. In this case, hydrogen as an impurity is contained in the first accumulation region 16 and another accumulation region. Also, at process S1204, protons may be implanted thereinto from a lower surface side of the semiconductor substrate 10. After the implantation of protons, a heat treatment may be carried out at a temperature of approximately 350 degrees Celsius to 450 degrees Celsius to activate protons.

As compared to phosphorous ions or the like, protons can be easily implanted to a deeper position, and also variations of the implanted position are smaller. When the accumulation region is formed with protons, the accumulation region located at a deep position can be easily formed. Also, since the peak in the doping concentration distribution of the accumulation region can be steeply formed, an accumulation region with a narrow width can be easily formed, so that a gate-collector capacitance can be easily increased. Also, when protons are implanted thereinto from the upper surface side of the semiconductor substrate 10 after the formation of the barrier metal, it can be suppressed that protons or hydrogen gets out of the upper surface side of the semiconductor substrate 10.

Next, at process S1206, the emitter electrode 52 is formed. The formation temperature of the emitter electrode 52 is approximately 350 degrees Celsius to 450 degrees Celsius. By omission of the heat treatment after the proton implantation, protons may also be activated at the time of formation of the emitter electrode 52. Note that the order of process S1204 and process S1206 may be replaced. When protons are implanted thereinto after the formation of the emitter electrode 52, it can be further suppressed that protons get out of the upper surface side of the semiconductor substrate 10. Also, after the emitter electrode 52 is formed, an electron beam may be irradiated to the semiconductor substrate 10 to adjust the carrier lifetime.

Next, at process S1208, a thickness of the semiconductor substrate 10 is adjusted by grinding the lower surface side of the semiconductor substrate 10. The thickness of the semiconductor substrate 10 is set according to a breakdown voltage to be involved by the semiconductor device 100 or a rated voltage. Here, the breakdown voltage may be a voltage applied when an avalanche current flows at a predetermined value, for instance.

Next, at process S1210, a structure in a lower surface side of the semiconductor device 100 is formed. The structure in the lower surface side is, for example, the collector region 22 and the cathode region 82. Next, at process S1212, protons are implanted from the lower surface side of the semiconductor substrate 10 to form the buffer region 20. Next, at process S1214, a heat treatment is carried out to activate the protons implanted into the buffer region 20.

Protons may be implanted into the buffer region 20 by a plurality of times while depth positions are varied. In this way, a plurality of peaks are formed in the doping concentration distribution in the depth direction of the buffer region 20. In the doping concentration distribution of the buffer region 20, the peak value at the deepest position when viewed from the lower surface of the semiconductor substrate 10 is higher than that at the second deepest position. With this method, the semiconductor device 100 can be manufactured.

In an example of another manufacturing method, the impurity of the first accumulation region 16 may be provided with phosphorus. In this case, at process S1200, impurities may be implanted in the first accumulation region 16. Because the first accumulation region 16 is formed in a relatively shallow position, it can be formed with phosphorus. On the other hand, another accumulation region (for example, the second accumulation regions 26 and the third accumulation region 28) is formed at a relatively deep position. When hydrogen is provided for the impurity of the accumulation region other than the first accumulation region 16, as described above, the accumulation region other than the first accumulation region 16 can be easily formed, and further a width of the accumulation region other than the first accumulation region 16 can be made narrower.

Also, in an example of another manufacturing method, the impurity of at least one accumulation region of the accumulation regions other than the first accumulation region 16 may be provided with phosphorus. For example, the impurity of the accumulation region at the shallowest position (the third accumulation region 28) of the accumulation regions other than the first accumulation region 16 may be provided with phosphorus. In this case, at process S1200, impurities may be implanted in the accumulation region. At process S1200, after the implantation of phosphorous into the base region 14, a heat treatment may be carried out at approximately 1150 degrees Celsius for approximately 3 hours.

Next, phosphorus is implanted into the first accumulation region 16 and one or more other accumulation regions. Here, a valence of phosphorous ions to be implanted into a deeper position may be set higher. In this way, even when an acceleration voltage is not much increased, phosphorous ions can be implanted into a deep position. After the implantation of phosphorus into the first accumulation region 16 and another accumulation region, a heat treatment is carried out at a lower temperature and for a brief time as compared to the base region 14. For example, a heat treatment is carried out at approximately 1000 degrees Celsius for approximately 30 minutes. Other processes are similar to those shown in FIG. 9.

Figure 10:
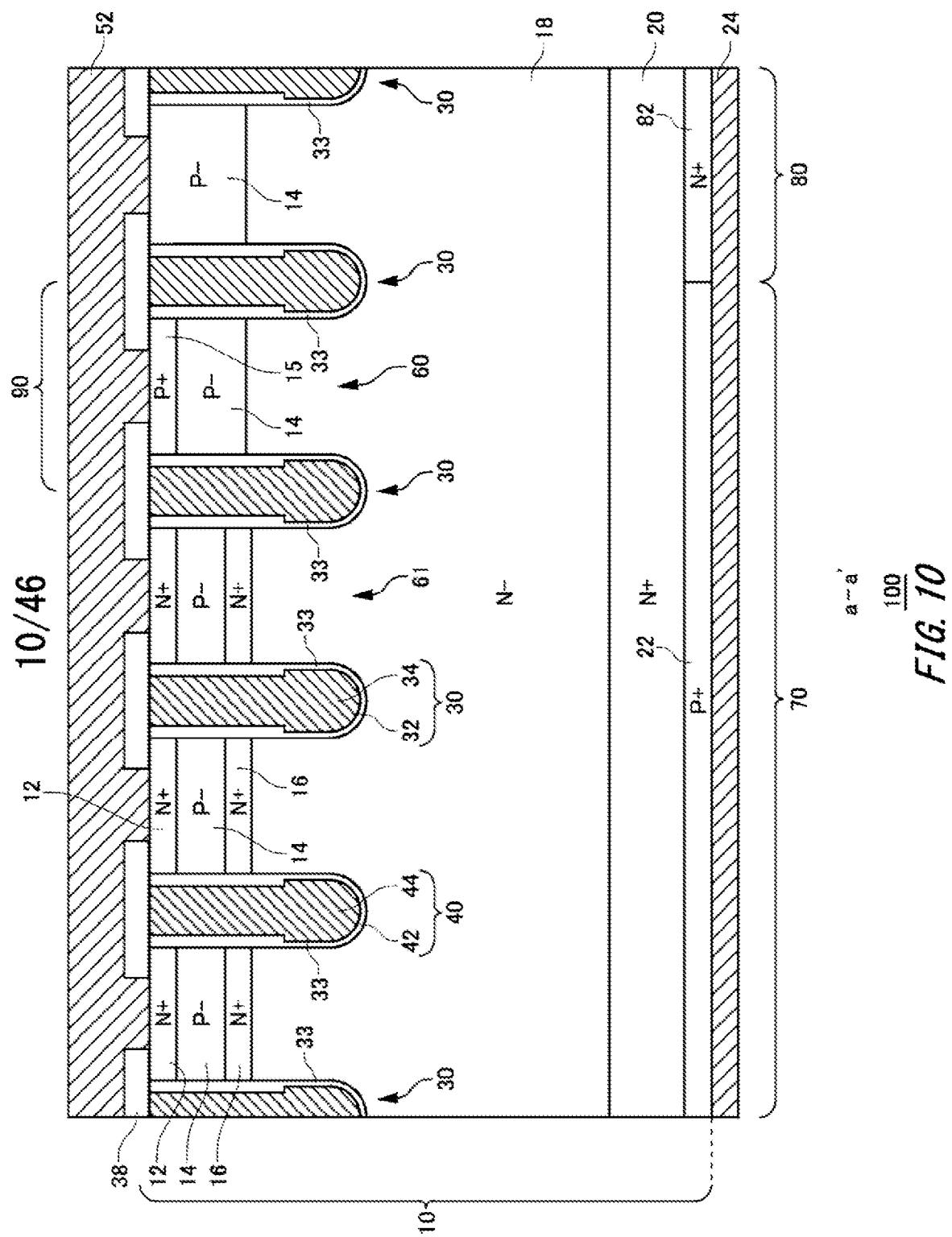
FIG. 10 illustrates another example in a cross-section a-a' in FIG. 1.

FIG. 10 illustrates another example in a cross-section a-a' in FIG. 1. The semiconductor device 100 of the present example has a capacitance addition portion 33 in an insulating film of each trench portion. In each trench portion of FIG. 10, at least a part of the insulating film at a lower side than the first accumulation region 16 is formed thinner than an insulating film at an upper side than the first accumulation region 16. In the present example, at a lower side than the first accumulation region 16, an insulating film with a small thickness functions as the capacitance addition portion 33.

When the an insulating film at a lower side than the first accumulation region 16 is formed thinner, a transient gate-collector capacitance at turn-on can be increased at a lower side than the first accumulation region 16. The upper end of the capacitance addition portion 33 (that is, an upper end of a portion of the insulating film with a small thickness) is formed separate from a lower end of the first accumulation region 16 in the depth direction. A distance between the upper end of the capacitance addition portion 33 and the lower end of the first accumulation region 16 in the depth direction may be 0.5 times or more of a length of the first accumulation region 16 in the depth direction, or may be 1 times or more thereof.

In another example, in each trench portion, at least a part of the insulating film at a lower side than the first accumulation region 16 is formed higher in dielectric constant than an insulating film at an upper side than the first accumulation region 16. A portion of the insulating film having a high dielectric constant functions as the capacitance addition portion 33. The insulating film that functions as the capacitance addition portion 33 may be formed of a material different from a portion of another insulating film. Also, the insulating film that functions as the capacitance addition portion 33 may be formed at a temperature condition different from the portion of another insulating film. Also with this configuration, a transient gate-collector capacitance at turn-on can be increased.

Note that the capacitance addition portion 33 may be applied to any of the semiconductor devices 100 shown in FIG. 1 to FIG. 9. That is, a plurality of accumulation regions may be further formed while the capacitance addition portion 33 is formed in the insulating film of each trench portion. The peak position of the doping concentration in the second accumulation region 26 that is located at the deepest position may be provided in a depth range opposed to the capacitance addition portion 33.

Figure 11:
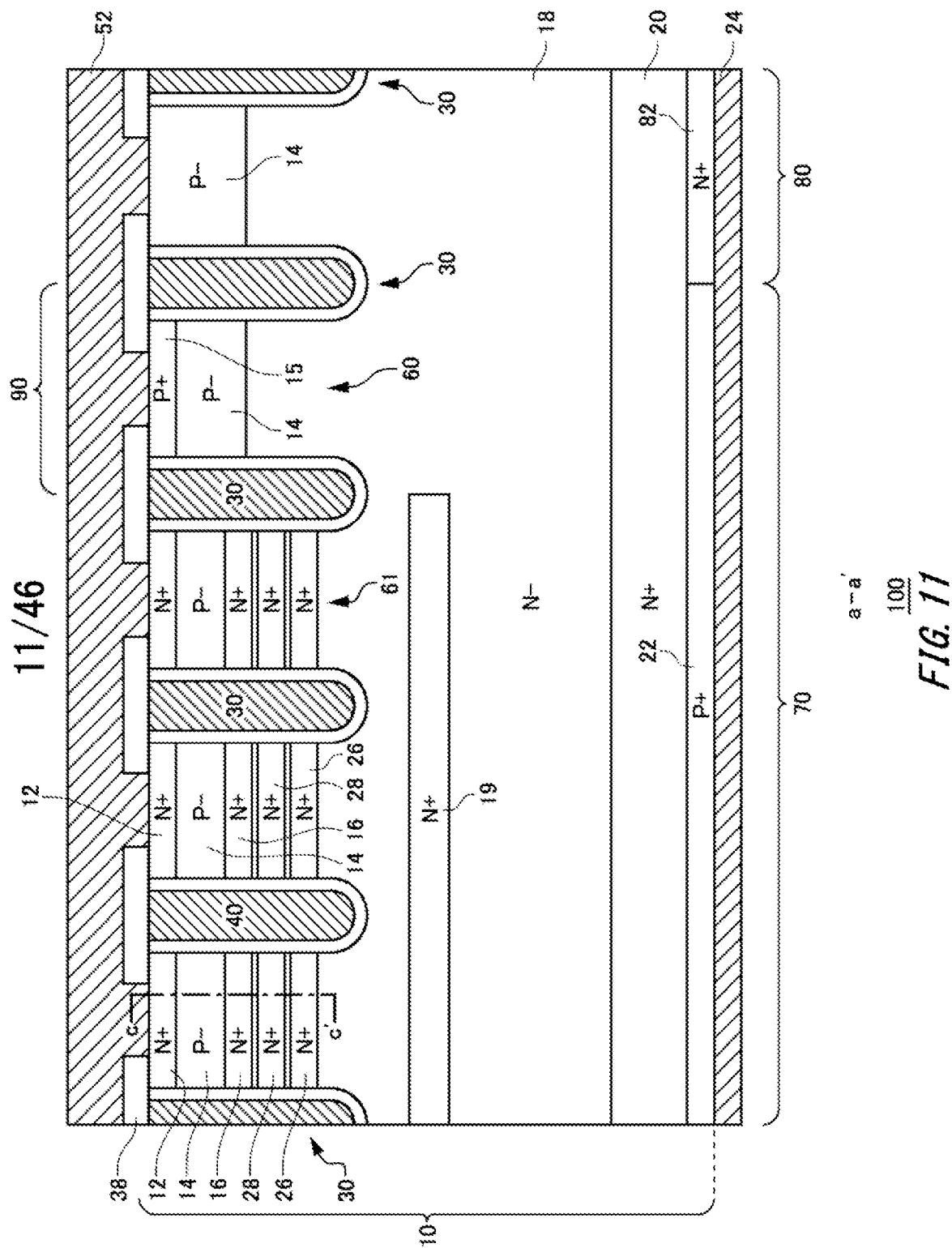
FIG. 11 illustrates another example of the semiconductor device 100 in a cross-section a-a' of FIG. 1.

FIG. 11 illustrates another example of the semiconductor device 100 in a cross-section a-a' of FIG. 1. In addition to the configuration of the semiconductor device 100 in any aspect illustrated in FIG. 1 to FIG. 10, the semiconductor device 100 of the present example further comprises a high concentration region 19 of N+ type having a doping concentration higher than that of the drift region 18.

Inside the semiconductor substrate 10, the high concentration region 19 is provided below the plurality of trench portions and above the buffer region 20. The high concentration region 19 may be arranged in a more upper side than a midpoint of the semiconductor substrate 10 in the depth direction. The high concentration region 19 may be provided separate from the plurality of trench portions. The drift region 18 may be provided between the high concentration region 19 and each trench portion.

The high concentration region 19 is provided in at least a partial region of the transistor section 70. In an example of FIG. 11, the high concentration region 19 is provided in the whole active region of the transistor section 70 (the whole region in which the emitter regions 12 are regularly formed). For example, in an inner side parallel to the upper surface of the semiconductor substrate 10, the high concentration region 19 may be provided to be overlapped with the whole collector region 22. In the inner side, the end portion of the high concentration region 19 may be arranged at a position overlapped with an end portion of the collector region 22. Also, the end portion of the high concentration region 19 may be arranged nearer to a transistor section 70 side than an end portion of the collector region 22, or may be arranged nearer to the diode section 80 side than the end portion of the collector region 22.

Also, the high concentration region 19 may be provided in at least a partial region of the diode section 80. Note that it is preferable that at least a partial region of the mesa portion 61 of the intermediate region 90 (intermediate mesa portion 60) is not covered with the high concentration region 19. The contact region 15 is provided in the intermediate mesa portion 60. In this way, a drawing of holes from the intermediate mesa portion 60 can be maintained. In the example of FIG. 11, the high concentration region 19 is not provided in the whole of the diode section 80 and the intermediate region 90.

In the semiconductor device 100, due to an occurrence of a current concentration in a region other than the active region, a withstand capability at turn-off (turn-off withstand capability) may be lowered. In particular, when miniaturization of the semiconductor device 100 is developed, a breakdown voltage in the active region is increased, so that avalanche breakdown occurs easily in a region other than the active region. When the avalanche breakdown occurs in a region other than the active region, the turn-off withstand capability of the semiconductor device 100 will be lowered. On the other hand, when the high concentration region 19 is provided in the transistor section 70, the breakdown voltage in the transistor section 70 is dropped. For this reason, before a region other than the active region, the avalanche breakdown can be brought to the whole transistor section 70 having a relatively large area, so that the withstand capability of the semiconductor device 100 can be improved.

Figure 12:
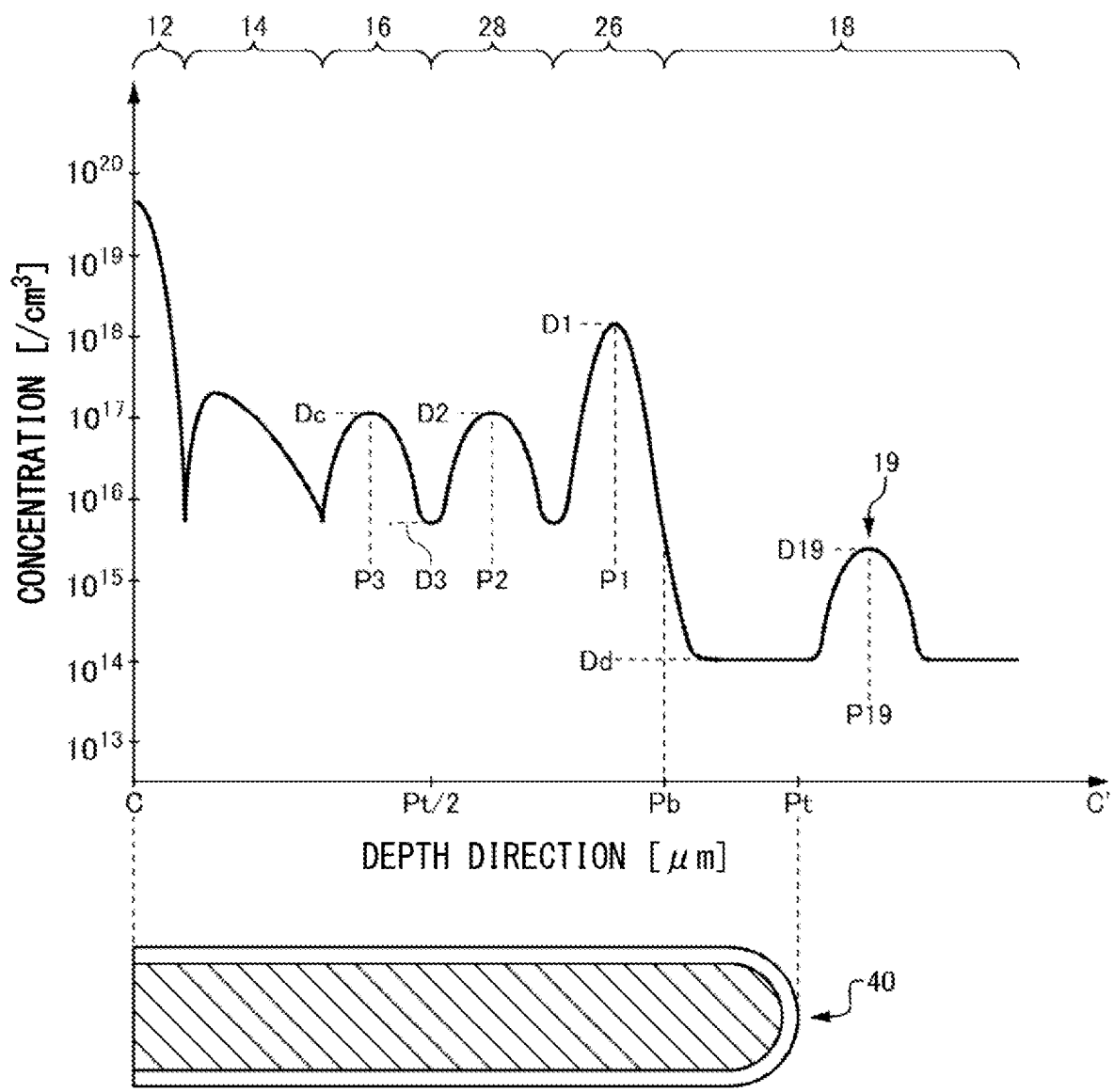
FIG. 12 illustrates one example of a doping concentration distribution in a cross-section c-c' of the semiconductor device 100 shown in FIG. 11.

FIG. 12 illustrates one example of a doping concentration distribution in a cross-section c-c' of the semiconductor device 100 shown in FIG. 11. As described above, the high concentration region 19 is provided at a position P19 deeper than the lower end position Pt of the gate trench portion 40. A doping concentration D19 of the high concentration region 19 (for example, peak concentration) is lower than the doping concentration Dc in the first accumulation region 16. The doping concentration D19 of the high concentration region 19 may be lower than the doping concentration of any accumulation region. The doping concentration D19 of the high concentration region 19 may be a half or less of the smallest doping concentration of the doping concentrations of the multiple accumulation regions. Also, the doping concentration D19 of the high concentration region 19 may be 1/10 or less of the largest doping concentration of the doping concentrations of the multiple accumulation regions. Note that the high concentration region 19 may be formed by implantation of protons or the like from the upper surface side of the semiconductor substrate 10.

Note that the semiconductor device 100 including the multiple accumulation regions shown in FIG. 2 and so on is different in a path in which an electron current flows in the mesa portion 61 as compared to the semiconductor device in which the number of the accumulation region is 1 or less. Also with this configuration, the semiconductor device 100 can reduce the loss at turn-on.

Figure 13:
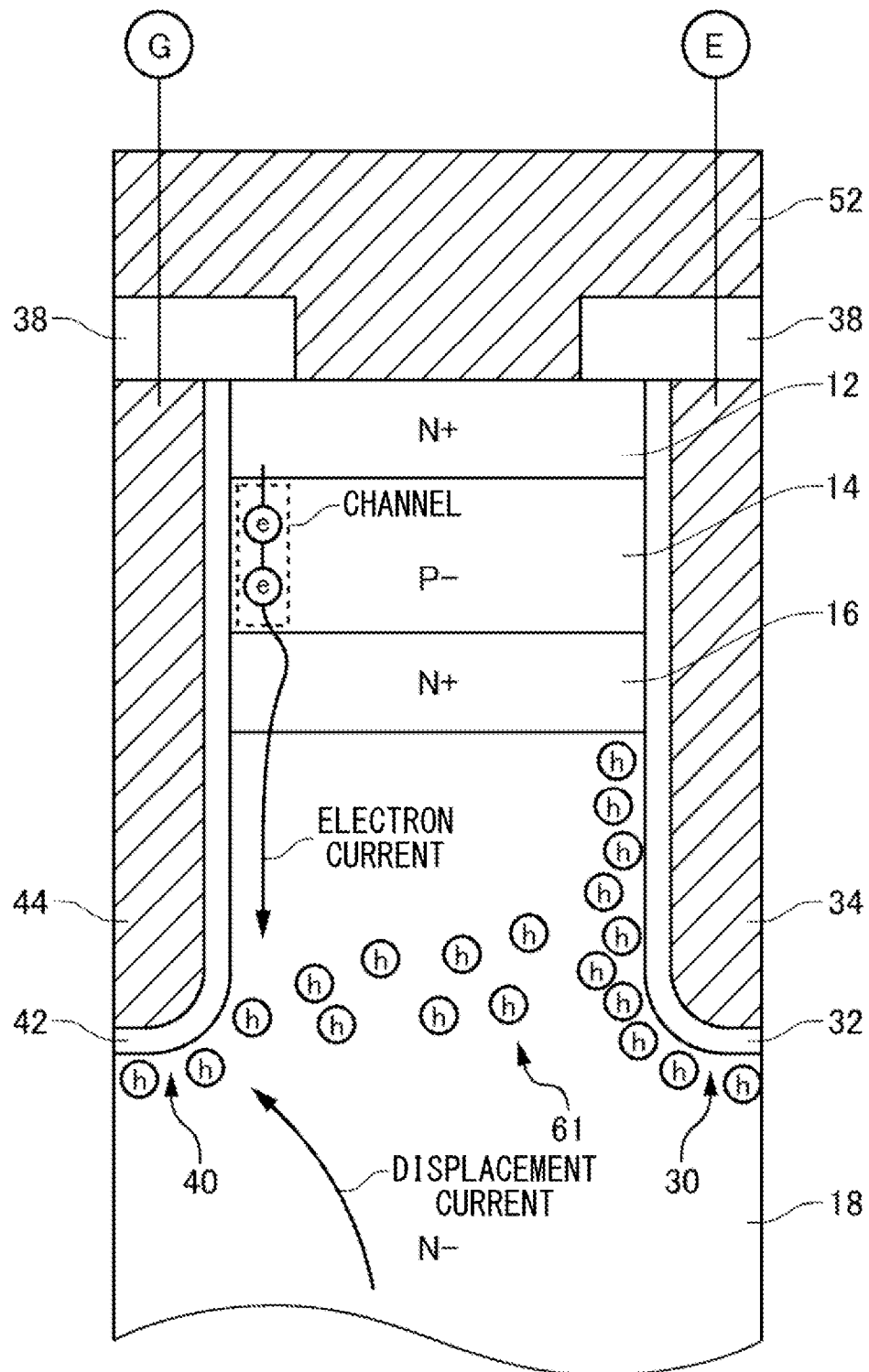
FIG. 13 illustrates one example of a path in which an electron current and a displacement current flow in the vicinity of a mesa portion 61 in a comparative example having only the first accumulation region 16.

FIG. 13 illustrates one example of a path in which an electron current and a displacement current flow in the vicinity of the mesa portion 61 in a comparative example having only the first accumulation region 16. FIG. 13 illustrates a current path at turn-on. The voltage of the gate conductive portion 44 gradually rises from 0 [V] at turn-on. In this way, a negative charge is induced in the vicinity of the gate trench portion 40 in the base region 14 to thus form a channel.

A main constituent of a current during an initial period at turn-on is not a hole current, but an electron current. The initial period is a period from a time immediately before a gate voltage Vge reaches a threshold voltage to a time that enters a mirror period in which Vge becomes constant at the approximately threshold voltage. If Vge approaches the threshold voltage, a channel begins to open, and injection of electrons into the drift region begins.

In a comparative example of FIG. 13, there is a possibility that electrons that travel downward from the channel flows temporarily in the first accumulation region 16 in the array direction (X-axis direction, or the direction from the vicinity of the gate trench portion 40 toward the center of the mesa portion 61). Note that in the drift region 18 below the first accumulation region 16, the vicinity of the gate trench portion 40 has an accumulation layer of electrons that has been already formed (a threshold voltage where the accumulation layer of electrons is formed in a region of N type is much smaller than a threshold voltage of an inversion layer in a P type region), and thus has an impedance lower than that of the drift region 18. Therefore, the electron current mainly flows in the vicinity of the gate trench portion 40.

Once electrons reach the collector region 22 on the rear surface, injection of holes starts in a region extending from the collector region 22 to the buffer region 20 and the drift region 18. In this way, holes are accumulated in the vicinity of the lower end of a trench portion. As one example, holes exist on the order of 1E+16 [cm$^{-3}$] in a region ranging from the vicinity of the lower end of a gate trench portion 40 to a side portion of a dummy trench portion 30 below a first accumulation region 16.

Holes gather at the lower end of a gate trench portion 40 and the lower end of a dummy trench portion 30. In particular, because a dummy conductive portion 34 is at the same potential as the emitter electrode 52, a hole inversion layer is easily formed at the sidewall of a dummy trench portion 30. Holes injected from the collector region 22 gather in the vicinity of this hole inversion layer. Holes are distributed continuously from a dummy trench portion 30 to the lower end of a gate trench portion 40. Due to this hole distribution, a large displacement current flows to the vicinity of the lower end of the gate trench portion 40 at turn-on.

The displacement current due to the accumulation of holes causes charging of the gate conductive portion 44 opposed across the gate insulating film 42. This charging of the gate conductive portion 44 causes an instantaneous increase at the gate metal layer Vge. The larger the displacement current, the more the gate conductive portion 44 is charged, so that a potential of the gate conductive portion 44 is promptly raised. As a result, the potential of the gate conductive portion 44 exceeds instantaneously a gate threshold.

In this way, a large amount of injection of electrons and holes is started, and an inter-collector-emitter current is increased. A voltage reduction rate (dV/dt) of an inter-collector-emitter voltage is increased according to an electric current change rate by the increase of the inter-collector-emitter current. The larger the displacement current, the larger dV/dt. In particular, the less the accumulated holes flow to the emitter electrode 52, the larger the displacement current, so that an instantaneous increase in potential of the gate conductive portion 44 becomes larger. Therefore, in the comparative example of FIG. 13, dV/dt becomes relatively larger, and electromagnetic noise also becomes relatively larger.

Figure 14:
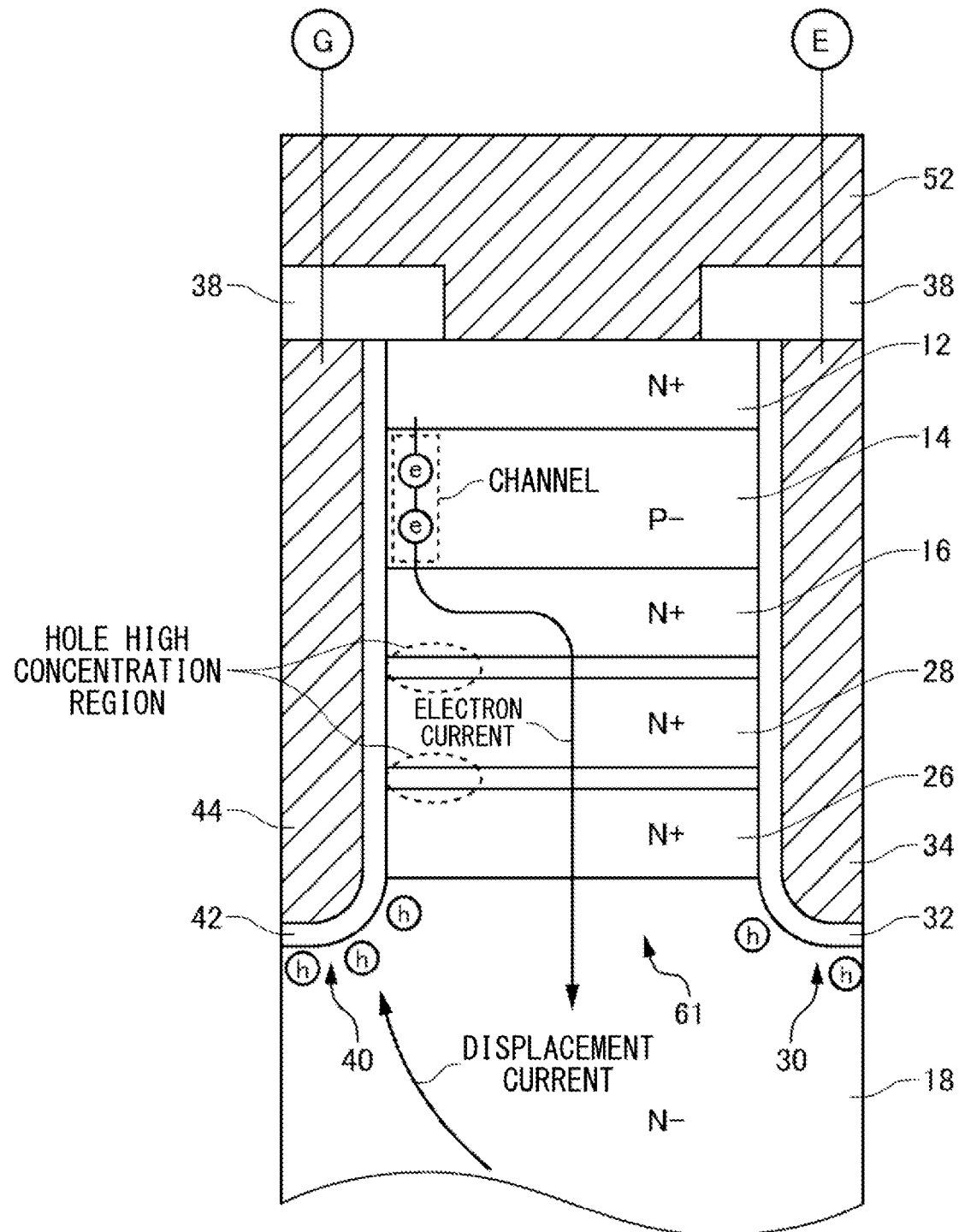
FIG. 14 illustrates an electron current and a displacement current at turn-on in the semiconductor device 100 that comprises the first accumulation region 16, the second accumulation region 26 and the third accumulation region 28.

FIG. 14 illustrates an electron current and a displacement current at turn-on in the semiconductor device 100 that comprises the first accumulation region 16, the second accumulation region 26 and the third accumulation region 28. Also in the present example, the electrons that passes through the channel is liable to travel in the array direction (X-axis direction) in the first accumulation region 16. Note that in the present example, the third accumulation region 28 and the second accumulation region 26 are provided below the first accumulation region 16.

In the present example, an impedance for the electron current is lower in a path that flows directly from the first accumulation region 16 to the third accumulation region 28 rather than in a path to flow in the third accumulation region 28 from the center vicinity of the first accumulation region 16 back to the vicinity of the gate trench portion 40. Similarly, the impedance is lower in a path that flows directly from the third accumulation region 28 to the second accumulation region 26 rather than in a path to flow in the second accumulation region 26 from the center vicinity of the third accumulation region 28 back to the vicinity of the gate trench portion 40.

Among regions below individual accumulation regions, holes tend to be accumulated in a hole high concentration region adjacent to the gate trench portion 40. Also, due to the electron current being flowing not in the vicinity of the gate trench portion 40, but in the center vicinity of the mesa portion 61, accumulation of holes into the hole high concentration region is facilitated. For this reason, the flow of the electron current through the center vicinity of the mesa portion 61 is facilitated. Although the hole high concentration region accumulated by holes is schematically shown in FIG. 14, the hole high concentration region may exist only in the vicinity of a boundary between the gate trench portion 40 and the semiconductor substrate 10.

As described above, the electron current of the present example travels downward near the center of the mesa portion 61 sandwiched between the gate trench portion 40 and the dummy trench portion 30, not returning the vicinity of the gate trench portion 40. That is, the electron current of the present example flows near the center of the mesa portion 61, not in the vicinity of the gate trench portion 40. An effect in which this electron current flows near the center of the mesa portion 61 is produced by the multiple accumulation regions arrayed in the depth direction.

If the electron current flows near the center of the mesa portion 61, the hole distribution in the vicinity of a bottom portion of the mesa portion 61 is divided near the center of the mesa portion 61. For this reason, holes on the dummy trench portion 30 side relative to the path of the electron current do not flow toward the gate trench portion 40 side. This division of the hole distribution at a center portion of the mesa portion 61 suppresses accumulation of holes at the lower end of the gate trench portion 40. As a result, as compared to an example of FIG. 13, the displacement current can be reduced in an example of FIG. 14. Because the displacement current can be reduced, charging of the gate conductive portion 44 is reduced, and the instantaneous increase at the gate metal layer Vge is also suppressed. In this way, the voltage reduction rate (dV/dt) in the inter-collector-emitter voltage can be suppressed.

The inventor(s) in the present case confirmed by simulation that holes mainly distribute the lower end of the gate trench portion 40, as well as the lower end and the side portion of the dummy trench portion 30, but scarcely distribute in the center portion of the mesa portion 61. As one example, holes exist on the order of 1E+13 [cm$^{-3}$] in the vicinity of the lower end of the gate trench portion 40, and in the vicinity of the lower end of the dummy trench portion 30, and that order is sufficiently lower than 1E+16 [cm$^{-3}$] in the comparative example of FIG. 13. Note that 1E+13 means $1\times10^{13}$.

Although the following reason is not restrictive, it is considered that the hole distribution in the example of FIG. 14 is due to the fact that the hole distribution between the gate trench portion 40 and the dummy trench portion 30 is divided by the electron current. Also, due to the hole distribution, a displacement current smaller than that of the comparative example of FIG. 13 flows at turn-on from the vicinity of the lower end of the dummy trench portion 30 to the vicinity of the lower end of the gate trench portion 40.

Therefore, since the displacement current in the present example of FIG. 13 is smaller than that of the comparative example, dV/dt is smaller than that of the comparative example of FIG. 13, so that electromagnetic noise can also be reduced. Also, in the present example, an additional gate resistance Rg that aims at suppression of an prompt increase of the potential of the gate conductive portion 44 does not need to be connected to the gate conductive portion 44. Alternatively, when a small gate resistance Rg is connected to the gate conductive portion 44, a steep increase of the potential of the gate conductive portion 44 can be suppressed. Accordingly, power loss at turn-on can be reduced as compared to the comparative example of FIG. 13.

Note that the second accumulation region 26 and the third accumulation region 28 do not need to be in direct contact with the dummy trench portion 30. In this case, holes can exist from the lower end of the dummy trench portion 30 to an area immediately under the first accumulation region 16 at the side portion of the dummy trench portion 30. In this way, a drawing of holes to the emitter electrode 52 at turn-off can be facilitated.

Figure 15:
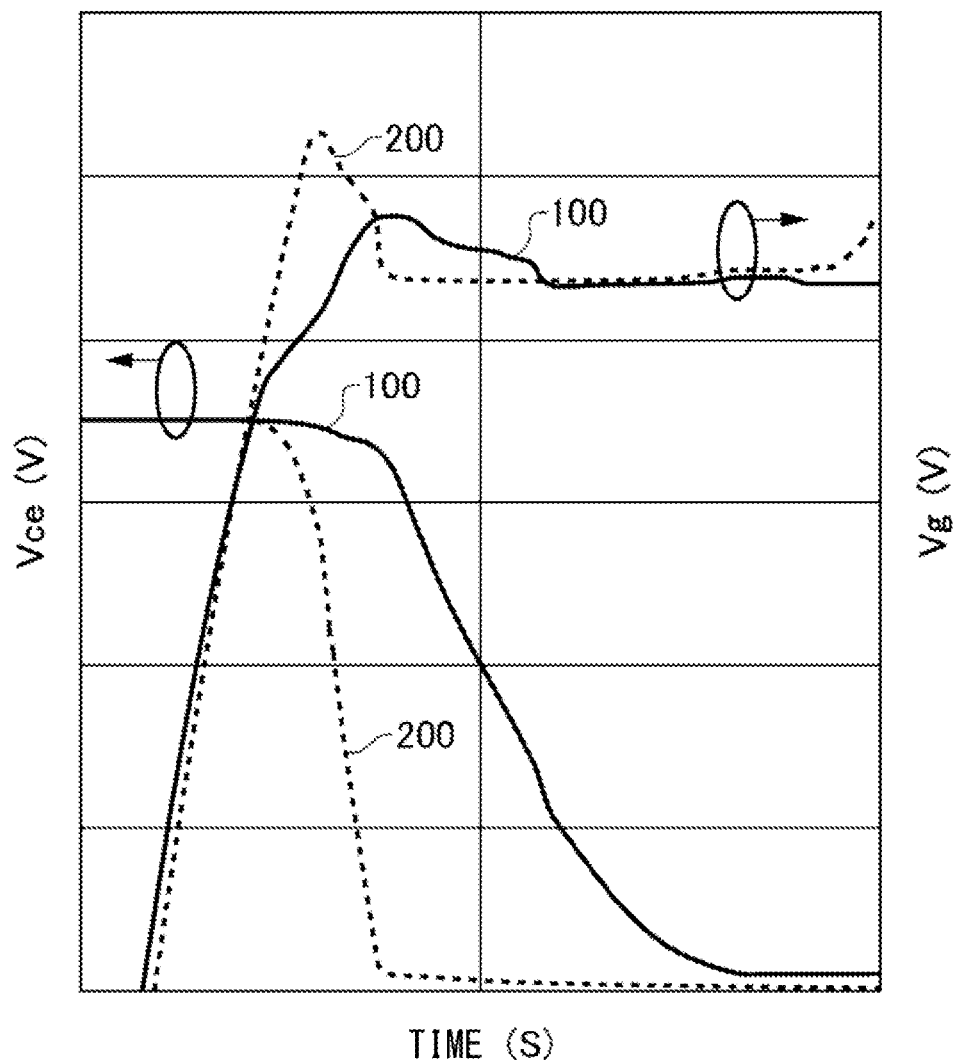

FIG. 15 illustrates one example of time waveforms of a gate voltage Vg and an inter-collector-emitter voltage Vce at turn-on. In FIG. 15, a characteristic of the semiconductor device 100 shown in FIG. 14 is shown by a solid line, and a characteristic of the comparative example shown in FIG. 13 is shown by a dotted line 200.

As shown in FIG. 15, according to the semiconductor device 100, variations of the gate voltage Vge and the inter-collector-emitter voltage Vce at turn-on are gentle as compared to the comparative example. For this reason, the turn-on loss can be further reduced. As one example, the turn-on loss in the semiconductor device 100 can be reduced by 30% or more as compared to the comparative example.

When the semiconductor device 100 is miniaturized, the reduction of the turn-on loss illustrated in FIG. 13 to FIG. 15 becomes more remarkable. When the semiconductor device 100 is miniaturized and thus a trench pitch becomes smaller, a density of holes in the vicinity of the bottom portion of each mesa portion 61 is increased. For this reason, a displacement current becomes easy to flow to the gate trench portion 40. On the other hand, as in the semiconductor device 100, when the multiple accumulation regions are provided, the electron current at turn-on flows at the center portion of the mesa portion 61, so that the hole distribution in the vicinity of the bottom portion of the mesa portion 61 is divided, which can suppress the displacement current that flows to the gate trench portion 40. For this reason, even when the semiconductor device 100 is miniaturized, the turn-on loss can be suppressed.

Figure 16:
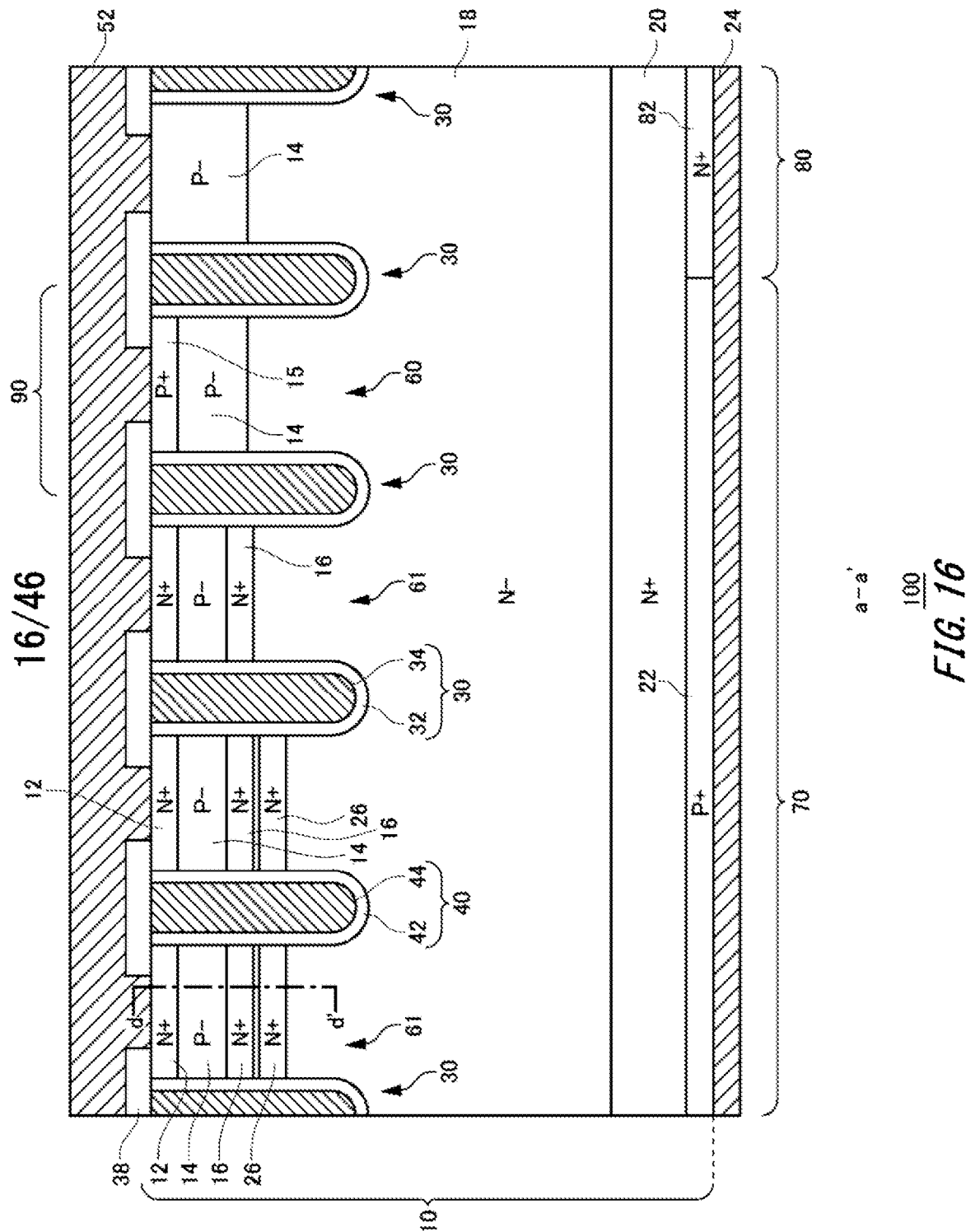
FIG. 16 illustrates another example in a cross-section a-a' in FIG. 1.

FIG. 16 illustrates another example in a cross-section a-a' in FIG. 1. In the present example, the capacitance addition portion has only one accumulation region in the mesa portion 61 of the transistor section 70. That is, in addition to the first accumulation region 16, the second accumulation region 26 is provided only by one in the mesa portion 61 of the transistor section 70. Also, no accumulation region is provided at the mesa portion 61 in the diode section 80. In the intermediate mesa portion 60, the first accumulation region 16 is provided, but no other accumulation region is provided therein.

Figure 17:
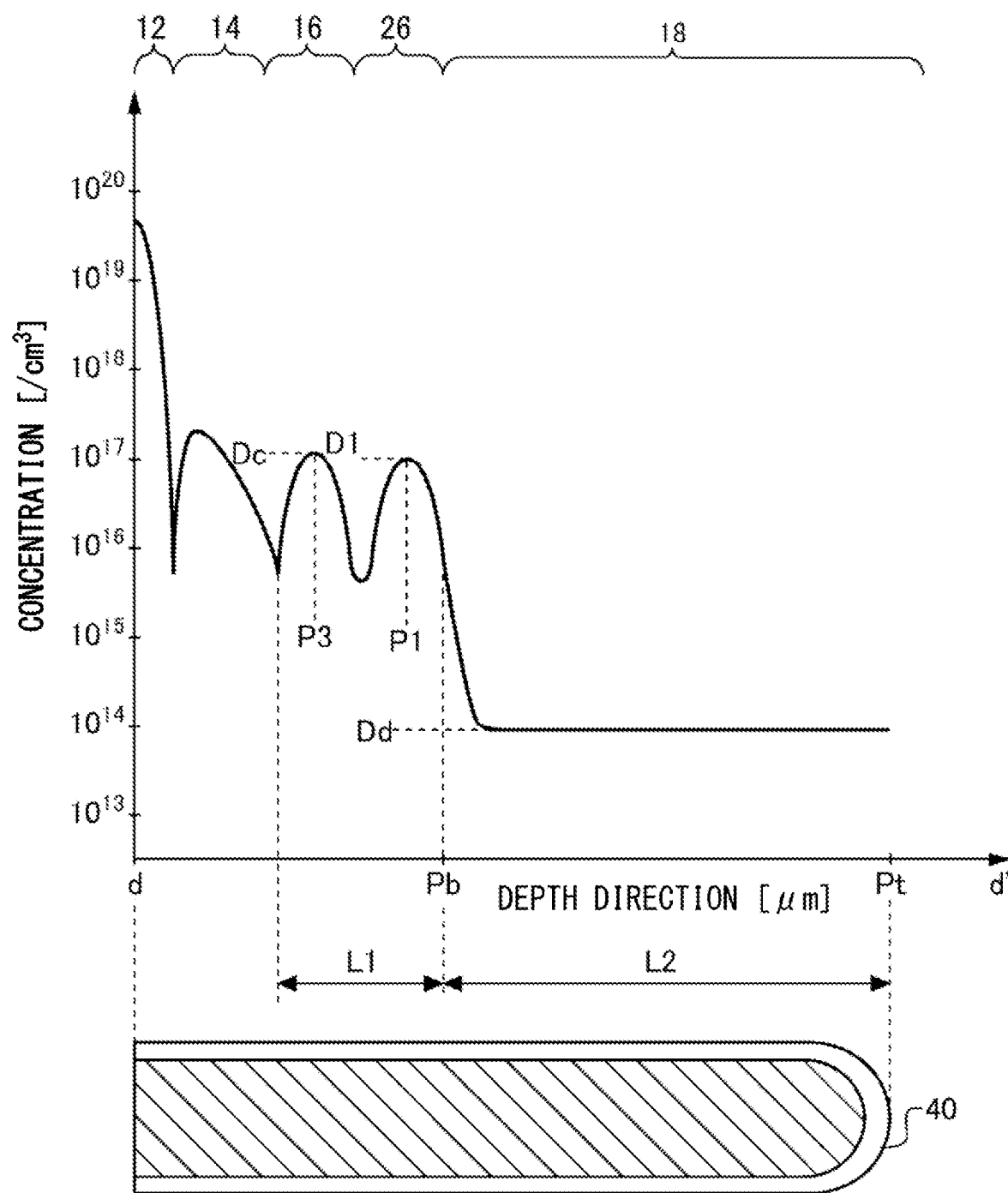
FIG. 17 illustrates one example of a doping concentration distribution in a cross-section d-d' in FIG. 16.

FIG. 17 illustrates one example of a doping concentration distribution in a cross-section d-d' of FIG. 16. In the mesa portion 61 of the transistor section 70, the cross-section d-d' is a cross-section perpendicular to the upper surface of the semiconductor substrate 10. As described above, the first accumulation region 16 and the second accumulation region 26 are provided in the mesa portion 61.

In the depth direction of the semiconductor substrate 10, a distance from the upper end of the first accumulation region 16 to the lower end of the accumulation region arranged at the lowest side (second accumulation region 26 in the present example) is denoted as L1. In the present example, the upper end of the first accumulation region 16 refers to a boundary between the first accumulation region 16 and the base region 14. As described above, at a lower side than a peak P1 of the second accumulation region 26, the lower end of the second accumulation region 26 may be a position that exhibits a doping concentration corresponding to 10 times of the doping concentration Dd of the drift region 18.

Also, a distance from the lower end of the accumulation region arranged at the lowest side (second accumulation region 26 in the present example) to the lower end of the trench portion (gate trench portion 40 in the present example) is denoted as L2. It is preferable that the distance L2 is twice or more of the distance L1 and three times or less thereof. In this way, the switching loss in the semiconductor device 100 can be reduced.

FIG. 18 to FIG. 23 illustrate relationships between the switching loss in semiconductor device 100 shown in FIG. 16, and the distance L2. In FIG. 18 to FIG. 23, the distance L2 is normalized by the distance L1. In the examples of FIG. 18 to FIG. 23, when the position at the lower end of the accumulation region arranged at the lowest side was fixed (that is, L1 was fixed), the position of the lower end of the gate trench portion 40 was changed. As one example, the position of the lower end of the accumulation region arranged at the lowest side is approximately 2.0 μm or more from the upper surface of the semiconductor substrate 10 to 3.0 μm or less therefrom, while the position of the lower end of the gate trench portion 40 is approximately 4 μm or more from the upper surface of the semiconductor substrate to 8 μm or less therefrom.

Figure 18:
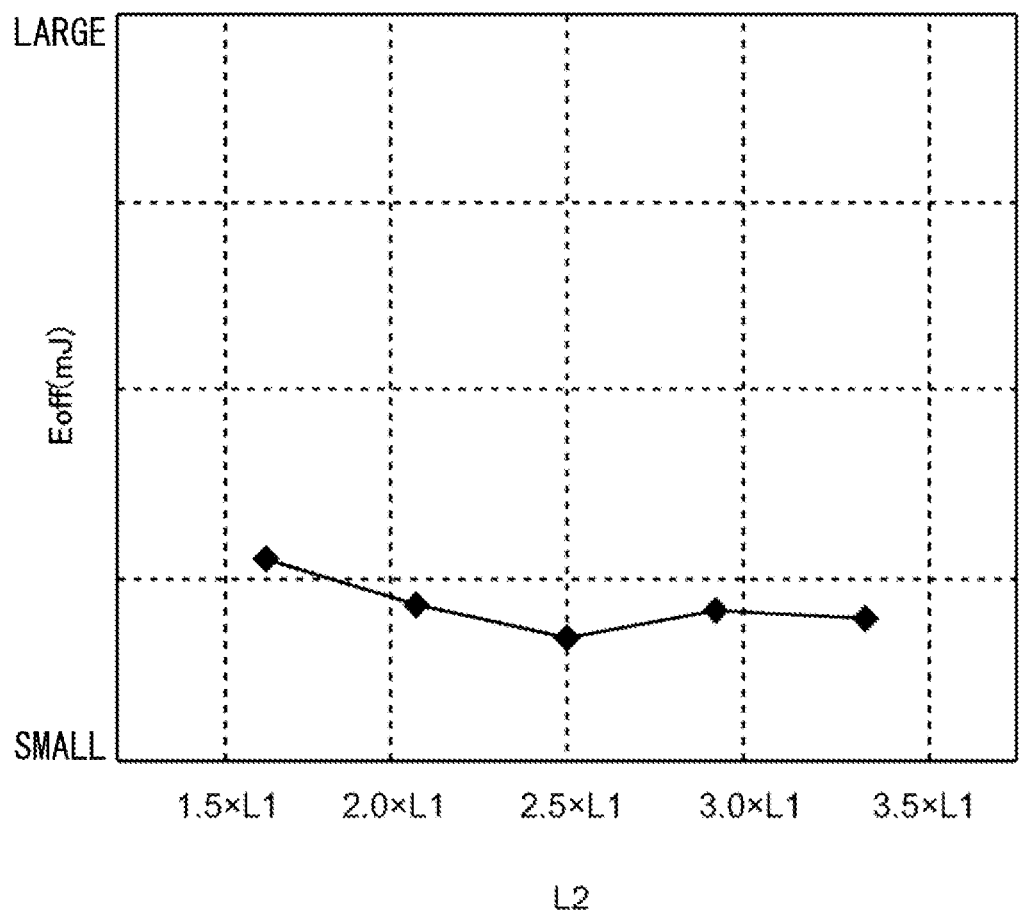
FIG. 18 illustrates a relationship between a turn-off loss Eoff and a distance L2 in a condition of a low current at room temperature.
Figure 19:
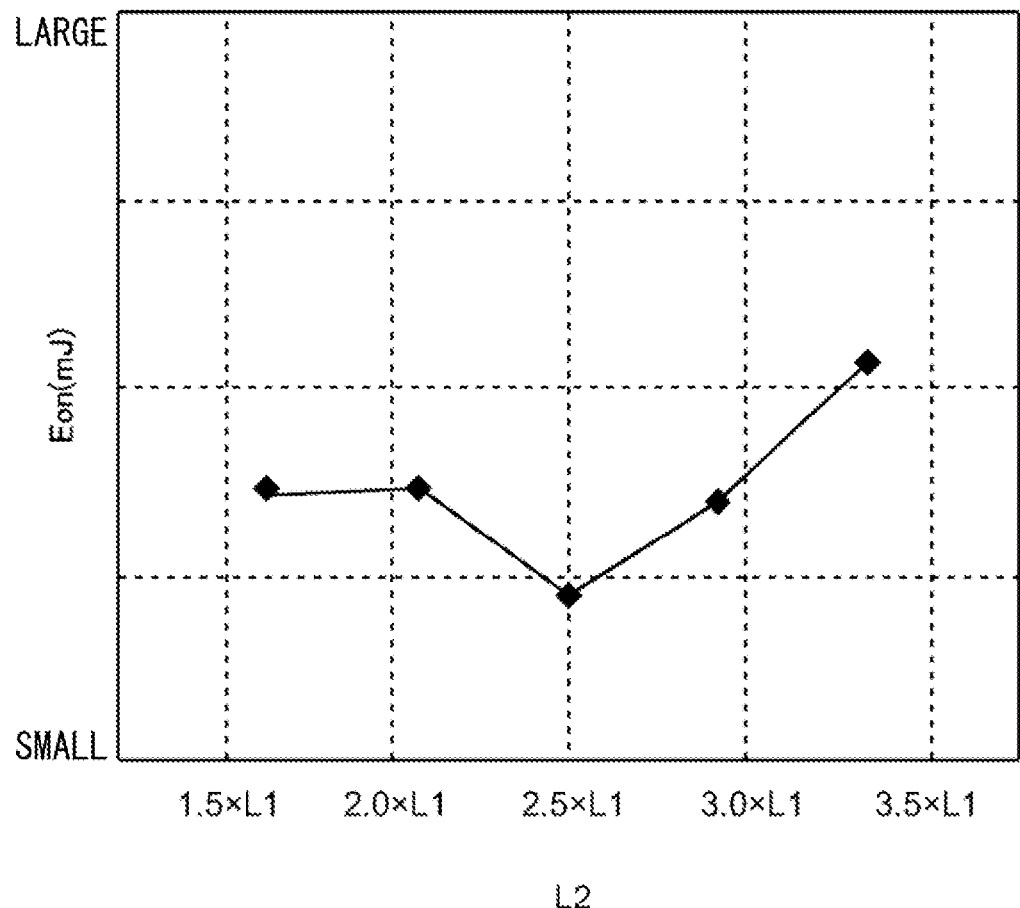
FIG. 19 illustrates a relationship between a turn-on loss Eon and the distance L2 in a condition of a low current at room temperature.
Figure 20:
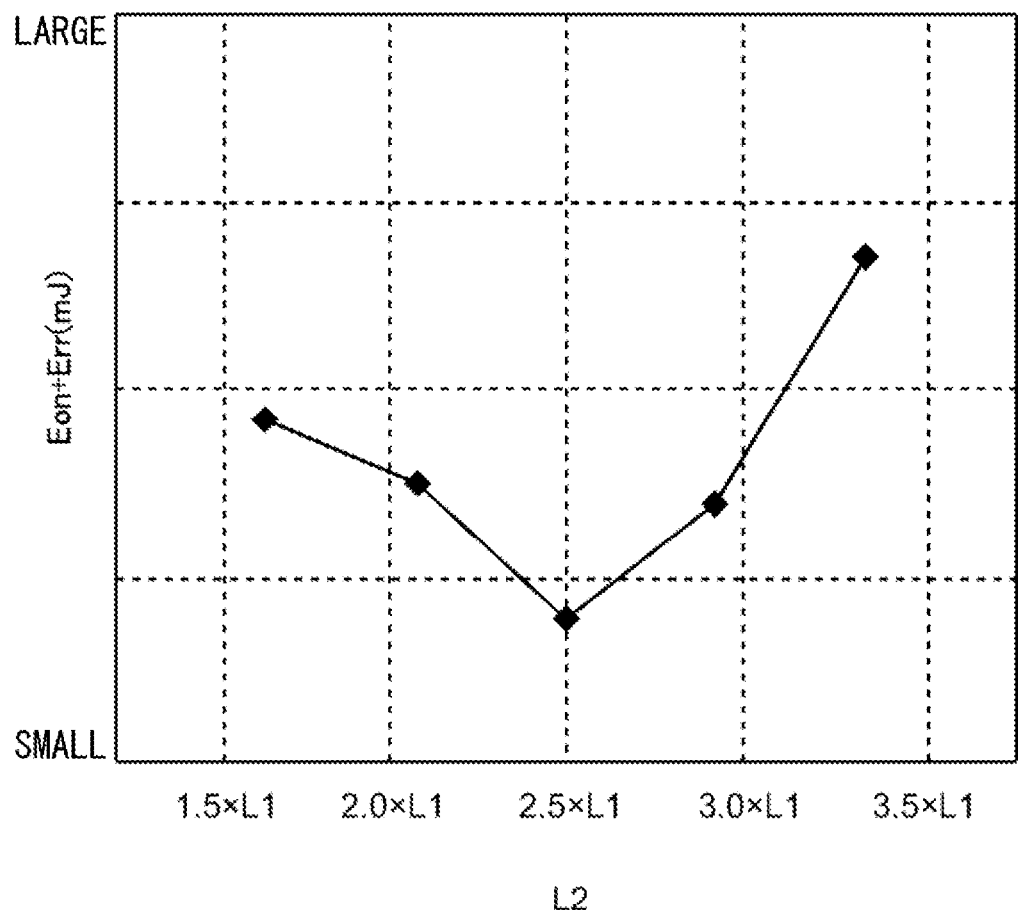
FIG. 20 illustrates a relationship between the sum (Eon+Err) of a turn-on loss and a reverse recovery loss, and the distance L2 in a condition of a low current at room temperature.

FIG. 18 illustrates a relationship between a turn-off loss Eoff and the distance L2 in a condition of an operating current of 10 A/cm² in the semiconductor device 100 at an ambient temperature of 25 degrees Celsius (referred to as a condition of a low current at room temperature). FIG. 19 illustrates a relationship between a turn-on loss Eon and the distance L2 in a condition of a low current at room temperature. FIG. 20 illustrates a relationship between the sum (Eon+Err) of a turn-on loss and a reverse recovery loss, and the distance L2 in a condition of a low current at room temperature.

Figure 21:
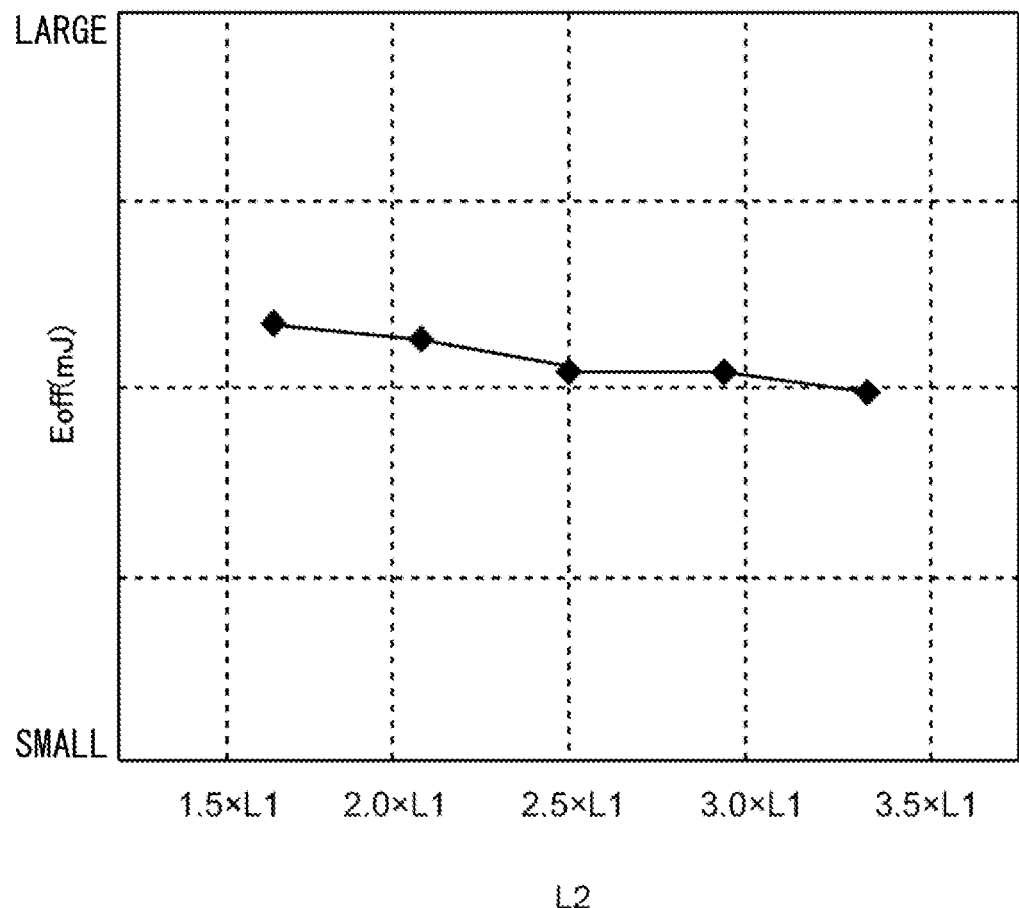
FIG. 21 illustrates a relationship between the turn-off loss Eoff and the distance L2 in a condition of a large current at a high temperature.
Figure 22:
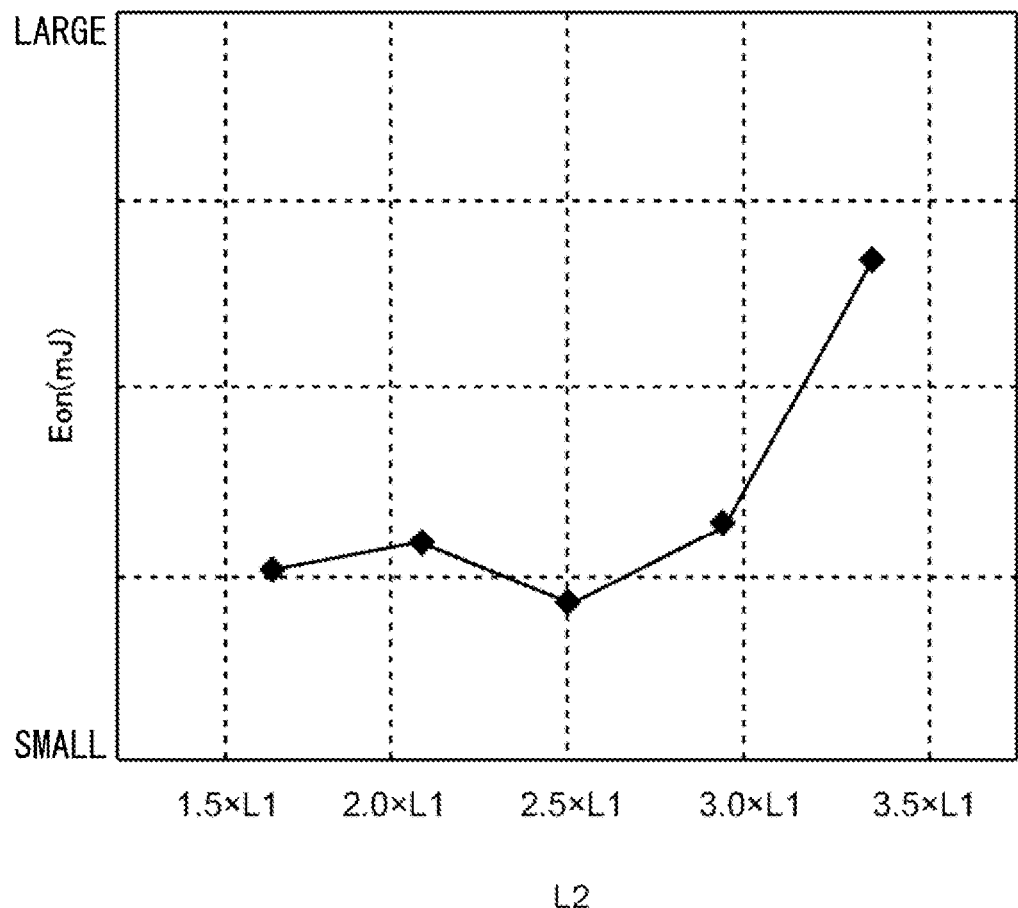
FIG. 22 illustrates a relationship between the turn-on loss Eon and the distance L2 in a condition of a large current at a high temperature.
Figure 23:
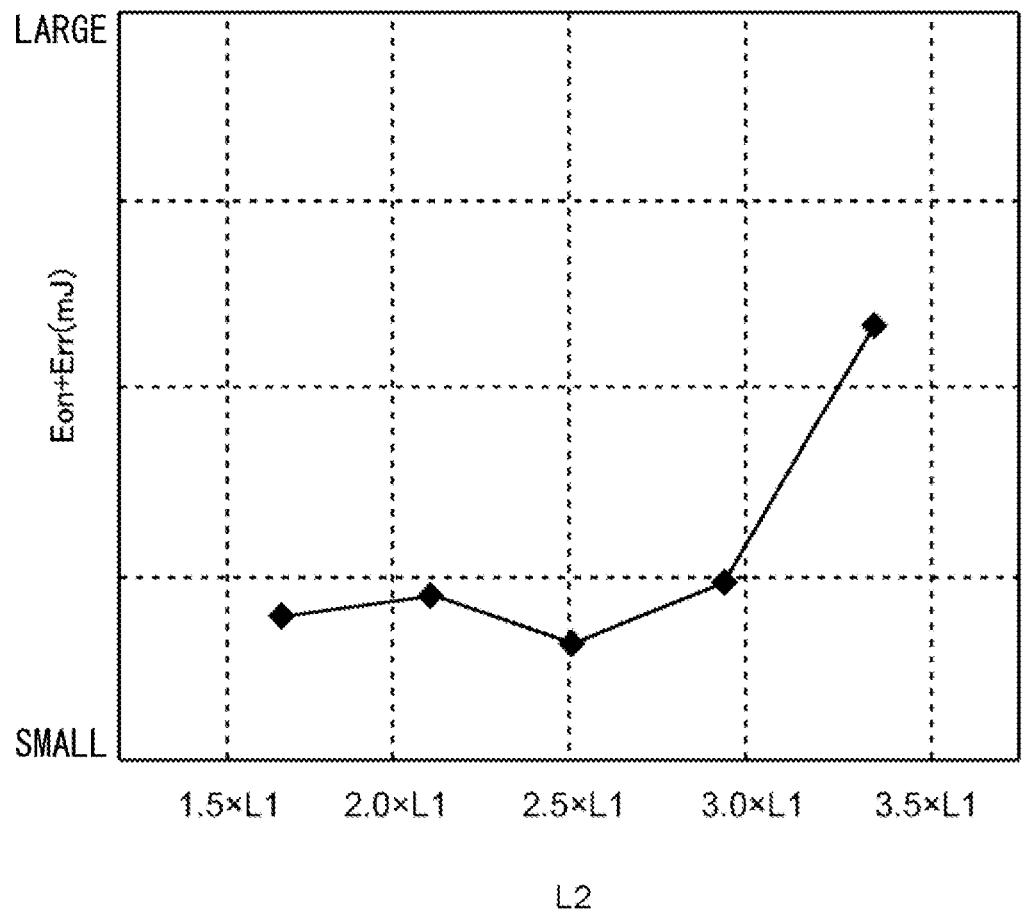
FIG. 23 illustrates a relationship between the sum (Eon+Err) of the turn-on loss and the reverse recovery loss, and the distance L2 in a condition of a large current at a high temperature.

FIG. 21 illustrates a relationship between the turn-off loss Eoff and the distance L2 in a condition of an operating current of approximately 400 A/cm² of the semiconductor device 100 at an ambient temperature of 150 degrees (referred to as a condition of a large current at a high temperature). FIG. 22 illustrates a relationship between the turn-on loss Eon and the distance L2 in a condition of a large current at a high temperature. FIG. 23 illustrates a relationship between the sum (Eon+Err) of the turn-on loss and the reverse recovery loss, and the distance L2 in a condition of a large current at a high temperature.

As shown in FIG. 18 to FIG. 23, when the distance L2 is set to twice or more of the distance L1 and three times or less thereof, the switching loss in the semiconductor device 100 can be reduced. In particular, the turn-on loss and the reverse recovery loss in the condition of a low current at room temperature can be reduced. Also, when the distance L2 is set to approximately 2.5 times of the distance L1, the switching loss in the semiconductor device 100 can be minimized. The distance L2 may be 2.25 times or more of the distance L1 and 2.75 times or less thereof.

As the distance L2 is increased in a region which the distance L2 is smaller than 2.5 times of the distance L1, a time change dV/dt of an inter-collector-emitter voltage at turn-on is increased, so that the turn-on loss is reduced. However, when the distance L2 is extremely increased, an inter-gate-collector mirror capacitance will be increased, so that the turn-on loss will be increased. As shown in FIG. 18 to FIG. 23, when the distance L2 is properly set, the switching loss can be minimized.

Figure 24:
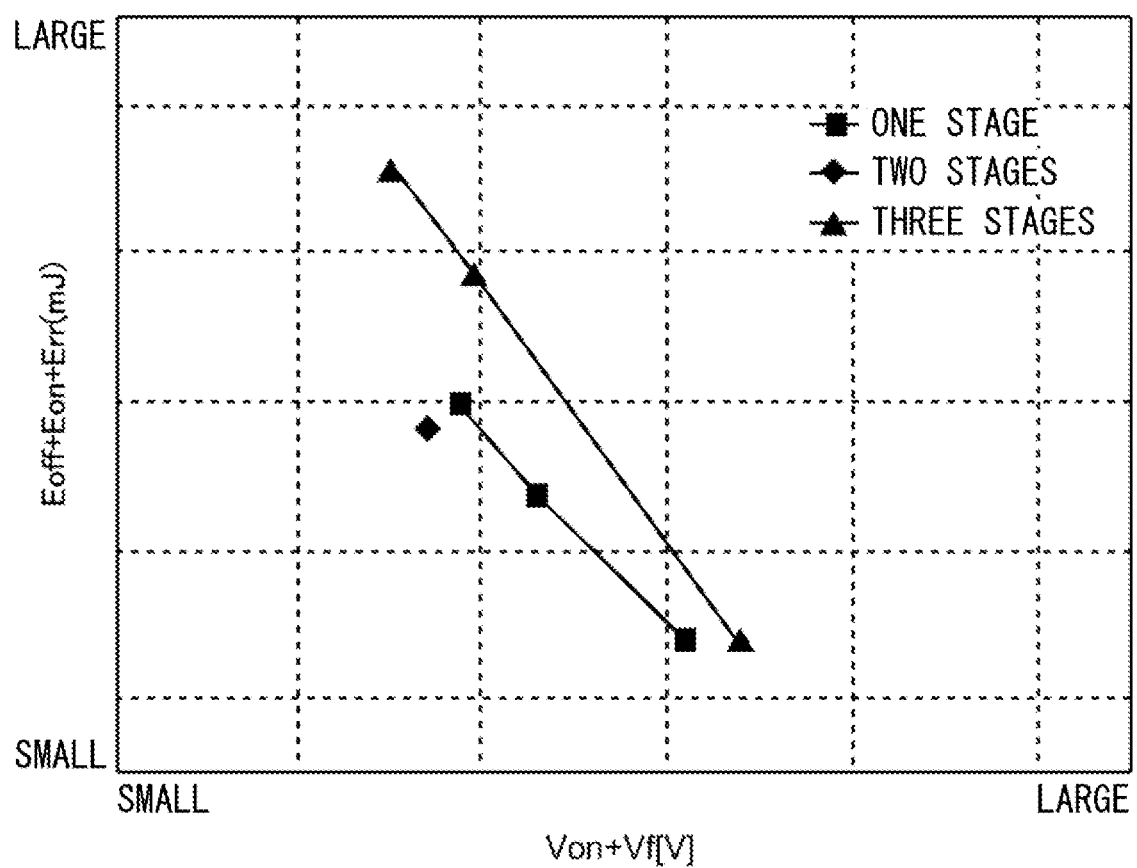
FIG. 24 illustrates a trade-off relationship between a switching loss, and the sum of an ON voltage in a transistor section 70 and a forward voltage in a diode section 80 in a condition of a low current at room temperature.

FIG. 24 illustrates a trade-off relationship between the switching loss (Eoff+Eon+Err), and the sum (Von+Vf) of the ON voltage in the transistor section 70 and the forward voltage in the diode section 80 in a condition of a low current at room temperature. FIG. 24 illustrates the respective characteristics when the number of stages of the accumulation region in the mesa portion 61 is set to one stage, two stages and three stages. The distance L2 of the present example is about 2.5 times of the distance L1.

As shown in FIG. 24, when the number of stages of the accumulation region in the mesa portion 61 is set to the two stages (for example, the two stages of the first accumulation region 16 and the second accumulation region 26), the trade-off between the switching loss and the ON voltage or the like can be improved. Note that even in a case where the number of stages of the accumulation region is one stage, the trade-off is relatively excellent, but a negative capacitance to be parasitic in the gate will be increased, so that time change of the voltage in the gate conductive portion 44 will become extremely steep.

Also, when the number of stages in the accumulation regions is set to three stages, the concentration of carriers to be accumulated in the lower side of the accumulation region will be extremely high. For this reason, the turn-off loss will be very large, and the switching loss will be increased. It is preferable that the number of stages of the accumulation region to be provided in the mesa portion 61 is two stages (that is, the number of stages of the accumulation region in the capacitance addition portion is one stage).

Figure 25:
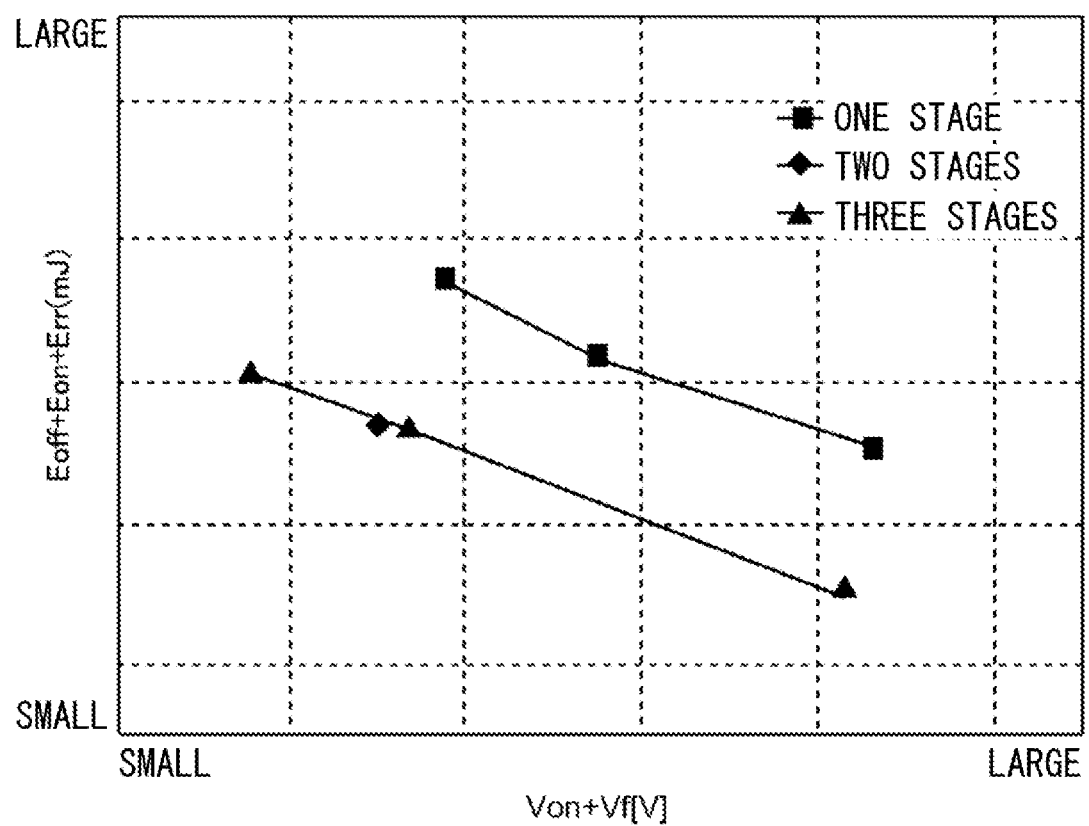
FIG. 25 illustrates a trade-off relationship between the switching loss, and the sum of the ON voltage in the transistor section 70 and the forward voltage in the diode section 80 in a condition of a large current at a high temperature.

FIG. 25 illustrates a trade-off relationship between the switching loss (Eoff+Eon+Err), and the sum (Von+Vf) of the ON voltage in the transistor section 70 and the forward voltage in the diode section 80 in a condition of a large current at a high temperature. As shown in FIG. 25, when the accumulation region is set to two stages, the trade-off is improved as compared to a case where the accumulation region has three stages.

Figure 26:
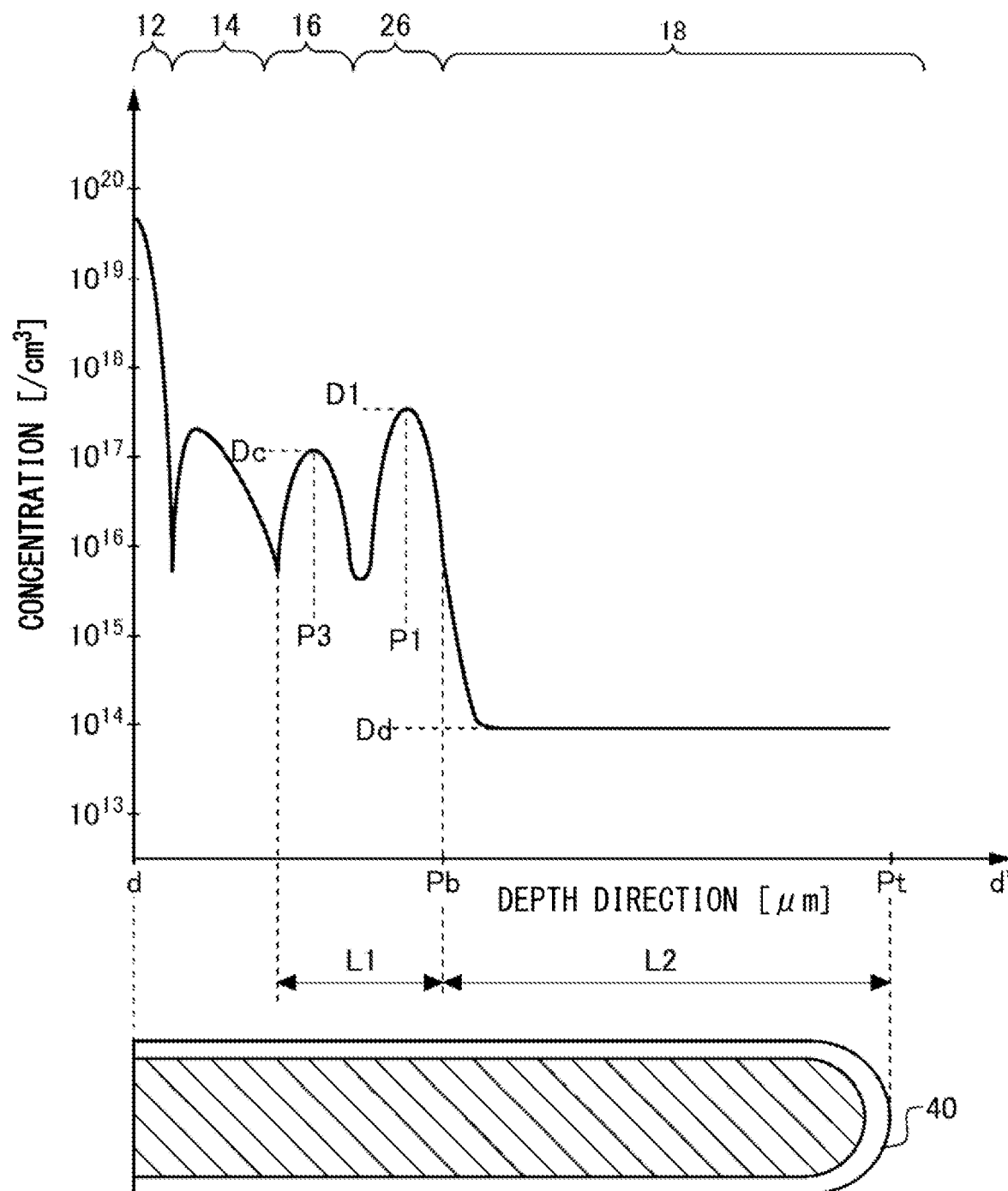
FIG. 26 illustrates another example of the doping concentration distribution in the cross-section d-d' of FIG. 16.

FIG. 26 illustrates another example of the doping concentration distribution in the cross-section d-d' of FIG. 16. Similarly to the example shown in FIG. 5, the doping concentration D1 of the second accumulation region 26 may be higher than the doping concentration Dc of the first accumulation region 16. The doping concentration D1 of the second accumulation region 26 may be higher than the doping concentration of the base region 14. Also, the doping concentration D1 of the second accumulation region 26 may be lower than the doping concentration Dc of the first accumulation region 16.

Figure 27:
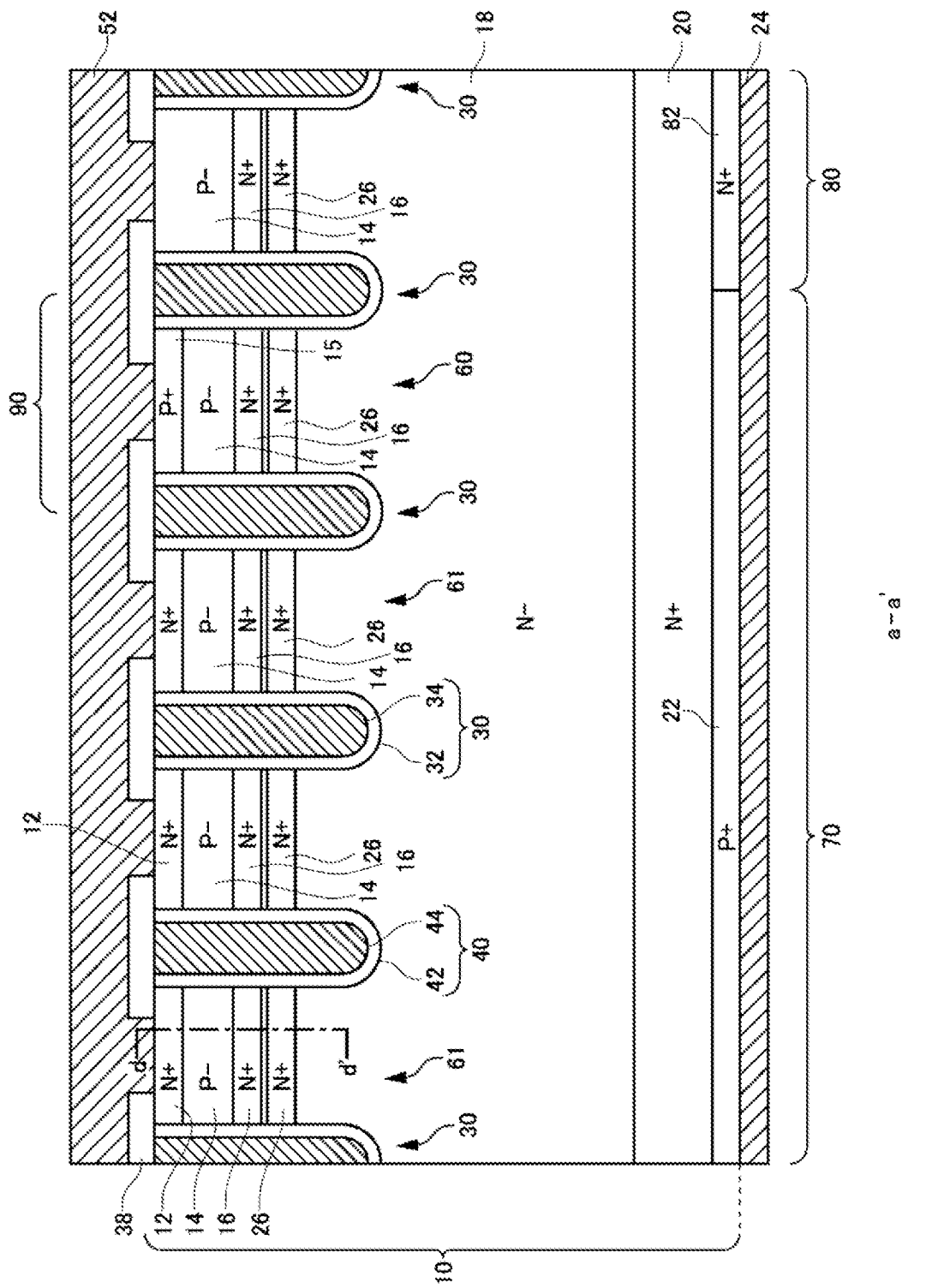
FIG. 27 illustrates another example of the cross-section taken along a-a' in FIG. 1.

FIG. 27 illustrates another example of the cross-section taken along a-a' in FIG. 1. In the semiconductor device 100 of the present example, the intermediate mesa portion 60 and the mesa portion 61 in the diode section 80 also have a structure similar to the mesa portion 61 in the transistor section 70 shown in FIG. 16. That is, each of the mesa portion 61 and the intermediate mesa portion 60 has the first accumulation region 16 and the second accumulation region 26. Also with such a structure, the turn-on loss of the semiconductor device 100 can be reduced, and further the trade-off between the switching loss and the ON voltage or the like can be improved.

Figure 28:
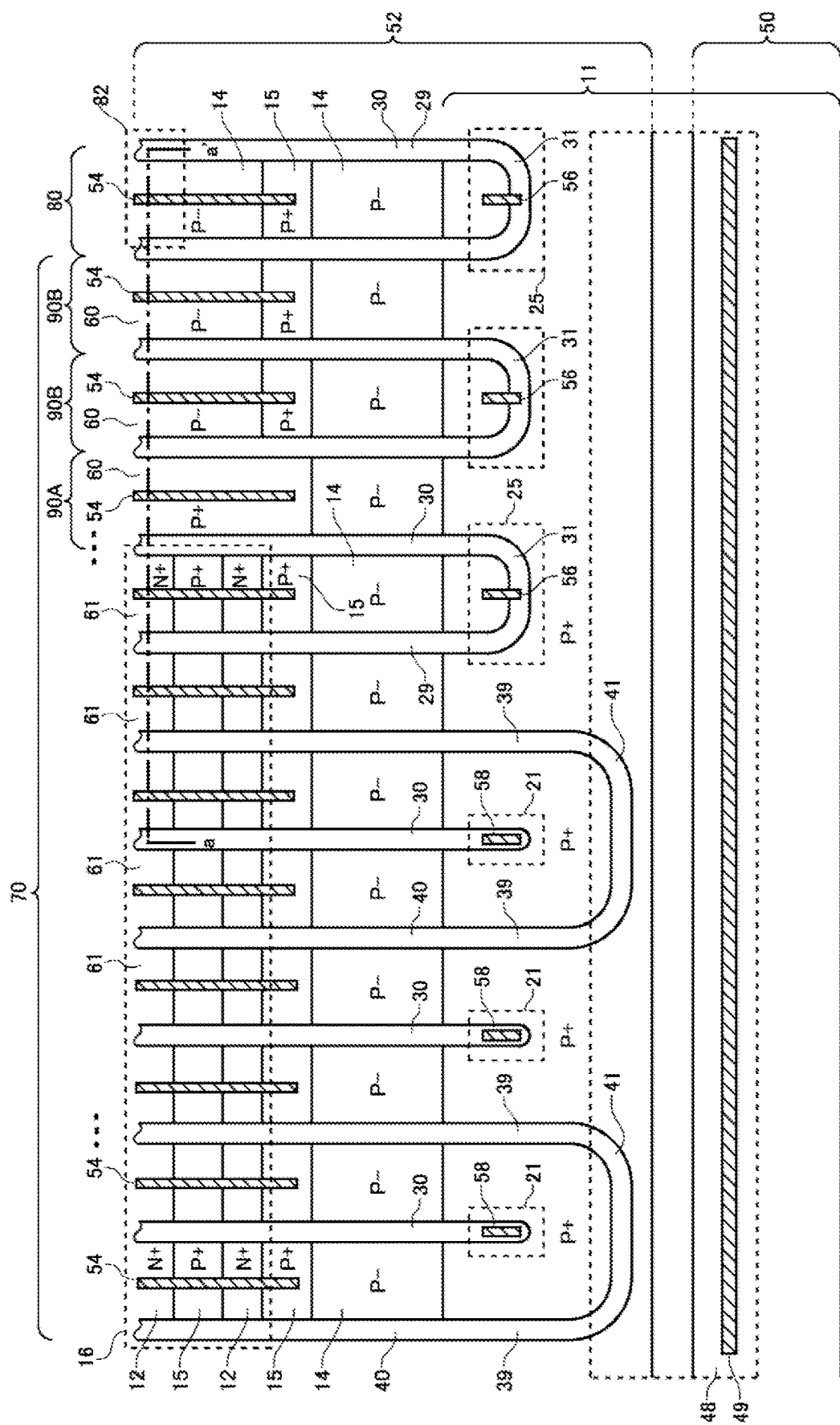
FIG. 28 is a diagram showing a part of an upper surface of a semiconductor device 300 according to another embodiment of the present invention.

FIG. 28 illustrates a part of an upper surface of a semiconductor device 300 according to another embodiment of the invention. The semiconductor device 300 is different from the semiconductor device 100 in that an intermediate region 90B is newly provided between the intermediate region 90A and the diode section 80. The intermediate region 90A in the semiconductor device 300 corresponds to the intermediate region 90 in the semiconductor device 100. Other structures are the same as those of the semiconductor device 100 in any aspect illustrated in FIG. 1 to FIG. 27.

In the intermediate region 90B, the contact regions 15 are provided only at both ends of the contact hole 54 in the extending direction. Also, the base region 14 is exposed to the upper surface of the semiconductor substrate between the contact regions 15 at both ends in the extending direction. In the upper surface of the intermediate region 90B, an area exposed by the base region 14 may be 5 times or more of the area of the contact region 15, may be 10 times or more thereof, or may be 20 times or more thereof.

Also, the number of the intermediate mesa portions 60 in the intermediate region 90B may be not less than the number of the intermediate mesa portions 60 in the intermediate region 90A, or larger than that number. Here, the number of the intermediate mesa portions 60 refers to the number of the intermediate mesa portions 60 sandwiched by the trench portions in the array direction. In the present example, the number of the intermediate mesa portions 60 in the intermediate region 90A is one, and the number of the intermediate mesa portions 60 in the intermediate region 90B is two.

Figure 29:
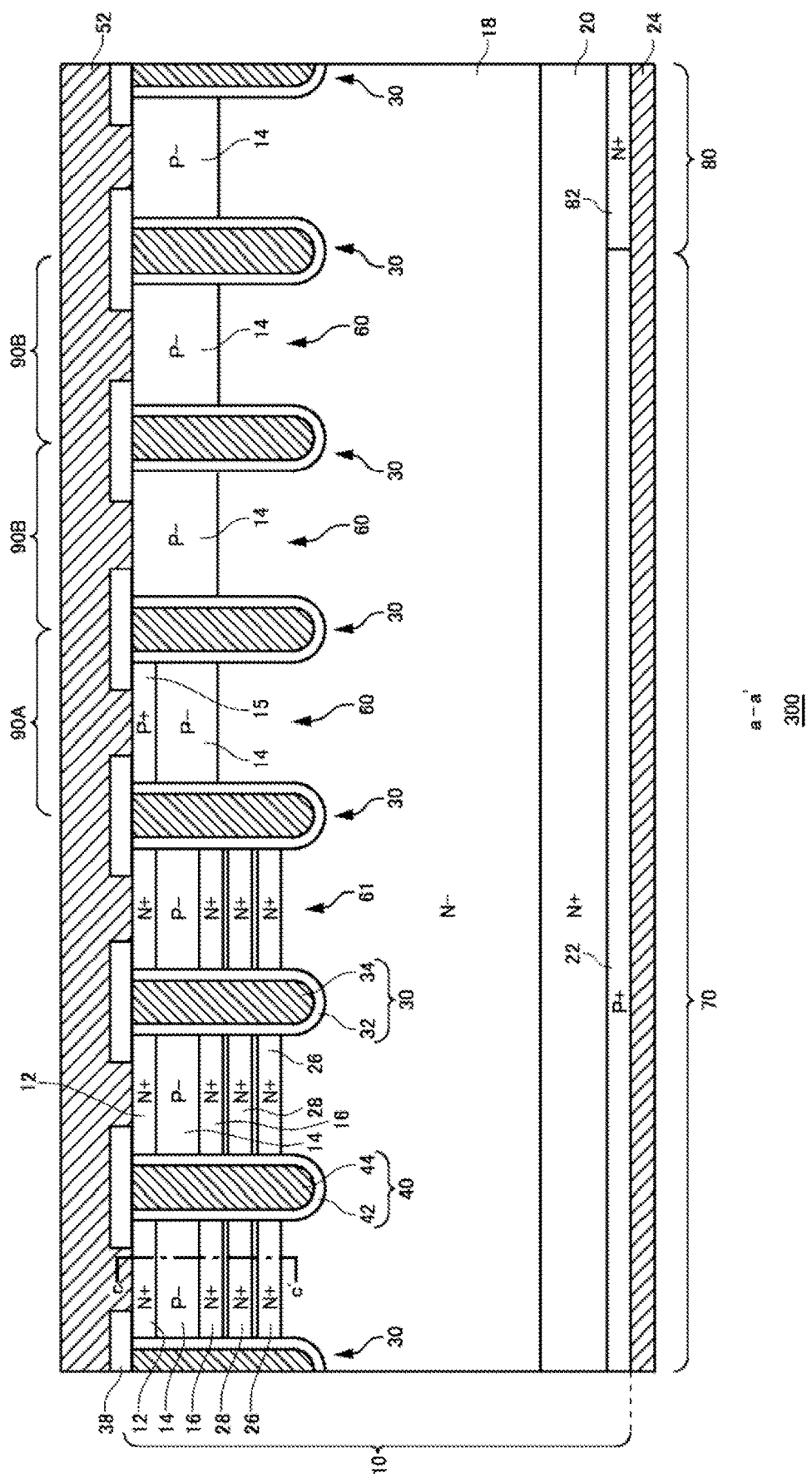
FIG. 29 is a cross-sectional view taken along a-a' in FIG. 28.

FIG. 29 is a cross-sectional view taken along a-a' in FIG. 28. In the lower surface of the semiconductor substrate 10 immediately under the intermediate region 90B, the collector region 22 of the intermediate region 90A may be formed as being extended. In the present example, the first accumulation region 16, the second accumulation region 26 and the third accumulation region 28 are not formed in the intermediate region 90A and the intermediate region 90B. In the case where the diode section 80 conducts in a forward direction, holes flow from the intermediate region 90A in the transistor section 70 toward the cathode region 82 in the diode section 80. In the surface of the intermediate region 90A, the contact region 15 is formed on the almost whole surface, an injection amount of holes is large. When the intermediate region 90B is provided, a distance between the intermediate region 90A and the cathode region 82 becomes longer, so that an injection amount of holes from the intermediate region 90A to the diode section 80 is suppressed.

Figure 30:
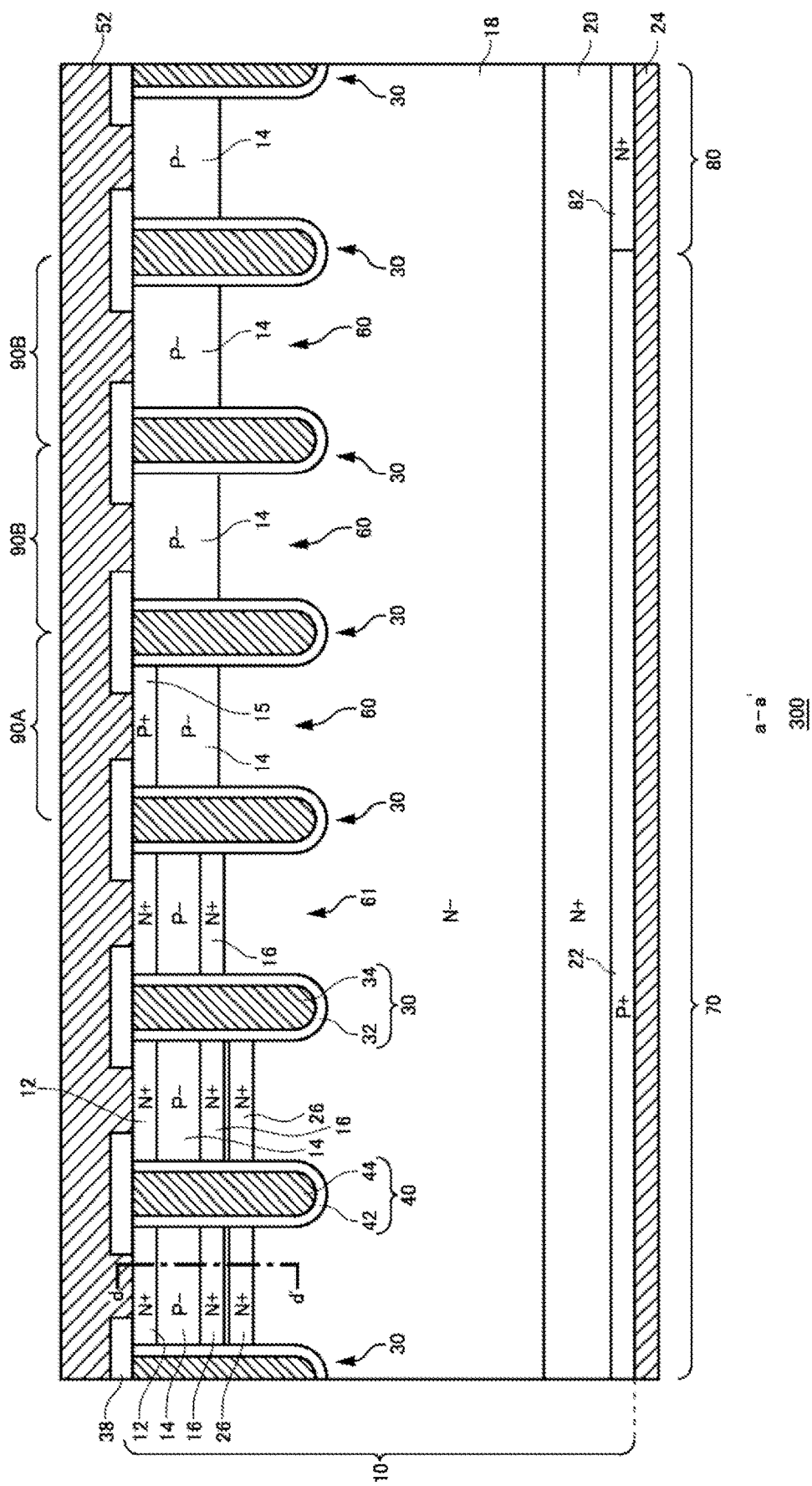
FIG. 30 is another example of a cross-sectional view taken along a-a' in FIG. 28.

FIG. 30 is another example of a cross-sectional view taken along a-a' in FIG. 28. In the present example, the number of stages of the accumulation region provided in each mesa portion is reduced as going from the transistor section 70 toward the diode section 80. Other structures are the same as those of the semiconductor device 300 shown in FIG. 29. In the example shown in FIG. 30, the first accumulation region 16 and the second accumulation region 26 are formed in the mesa portion 61 of the transistor section 70, and only the first accumulation region 16 is formed in the mesa portion 61 of the transistor section 70 adjacent to the intermediate region 90A. The accumulation region is not formed in the mesa portions of the diode section 80, the intermediate region 90A and the intermediate region 90B. Also in the present example, when the intermediate region 90B is provided, a distance between the intermediate region 90A and the cathode region 82 becomes longer, the injection amount of holes from the intermediate region 90A to the diode section 80 is suppressed.

Figure 31:
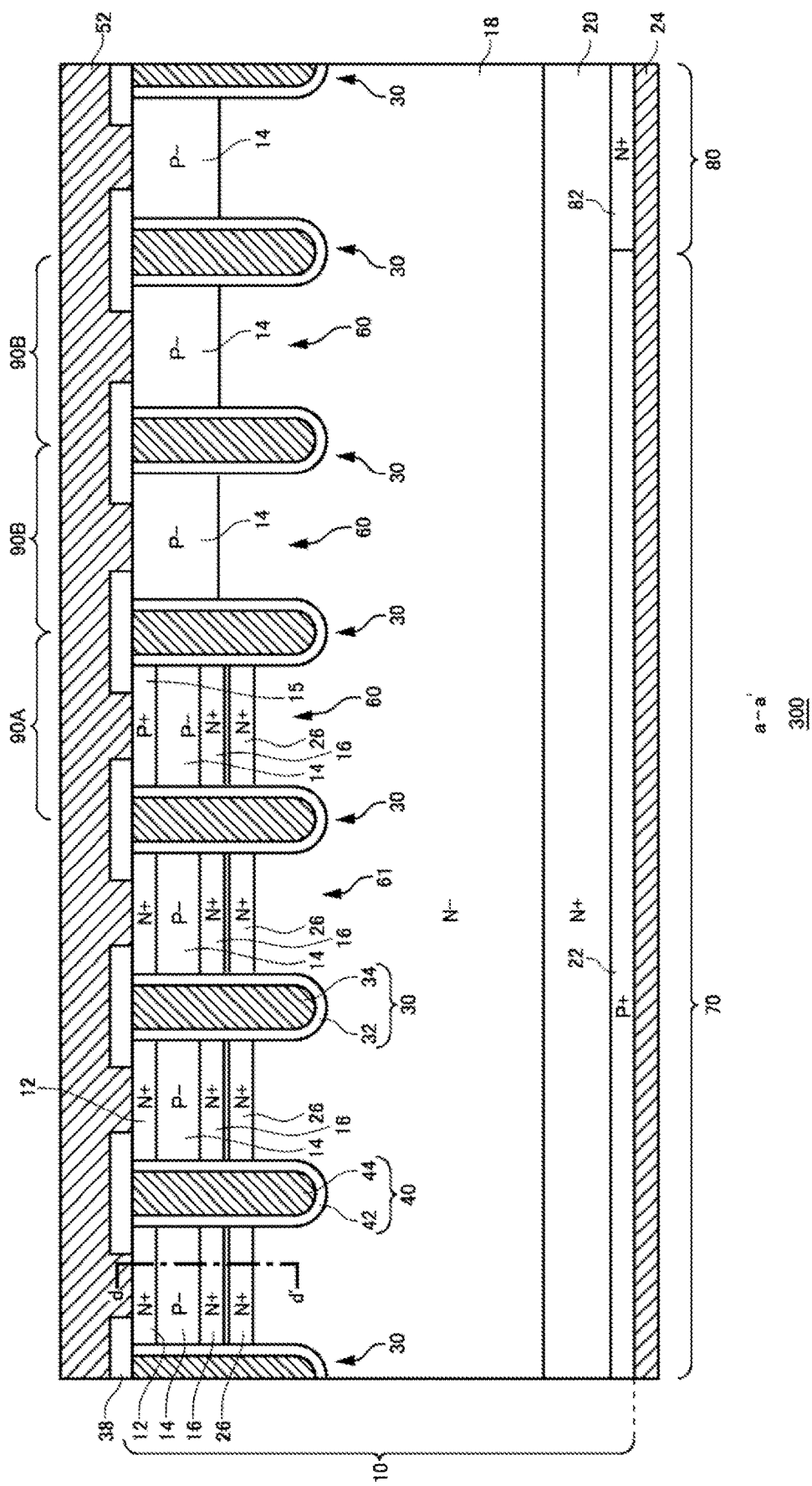
FIG. 31 is another example of a cross-sectional view taken along a-a' in FIG. 28.

FIG. 31 illustrates another example of a cross-sectional view taken along a-a' in FIG. 28. In the present example, the accumulation region is formed in the mesa portion of the transistor section 70 and the intermediate region 90A, and the accumulation region is not formed in the mesa portion of the diode section 80 and the intermediate region 90B. In an example shown in FIG. 31, the first accumulation region 16 and the second accumulation region 26 are formed in each mesa portion of the transistor section 70 and the intermediate region 90A. Also in the present example, when the intermediate region 90B is provided, a distance between the intermediate region 90A and the cathode region 82 becomes longer, the injection amount of holes from the intermediate region 90A to the diode section 80 is suppressed.

Figure 32:
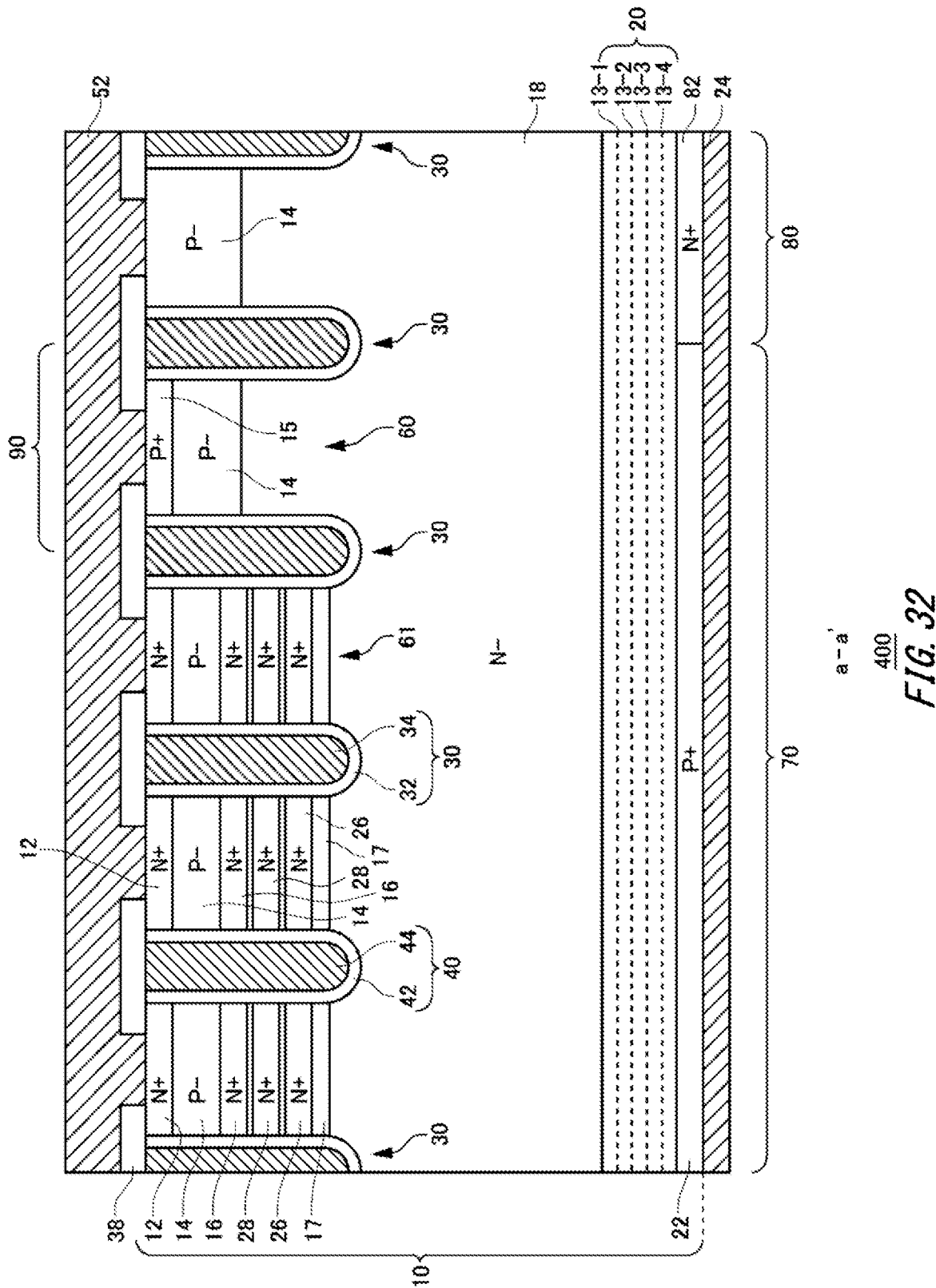
FIG. 32 illustrates one example of a cross-section in a semiconductor device 400 according to another embodiment of the invention.

FIG. 32 illustrates one example of a cross-section in a semiconductor device 400 according to another embodiment of the invention. In addition to the configuration of the semiconductor devices illustrated in FIG. 1 to FIG. 31, the semiconductor device 400 further comprises a bottom region 17. Other configurations other than the bottom region 17 are similar to structures are similar to those of the semiconductor device in any aspect illustrated in FIG. 1 to FIG. 31. FIG. 32 illustrates a configuration in which the bottom region 17 is added to the configuration in a cross-section a-a' of FIG. 2.

The bottom region 17 is a region doped by an impurity of the second conductivity type. The bottom region 17 of the present example is of P− type. A peak value of the doping concentration in the bottom region 17 may be smaller, may be larger than or may be the same as a peak value of the doping concentration in the base region 14.

In each mesa portion of the transistor section 70, the bottom region 17 is provided between the accumulation region formed at the lowest side (second accumulation region 26 in an example of FIG. 32) and the drift region 18. The bottom region 17 may be provided adjacent to trench portions on both sides of each mesa portion. The bottom region 17 does not need to be provided in the intermediate region 90 and the diode section 80.

The bottom region 17 may be in an electrically floating state with respect to the base region 14 and the emitter electrode 52. In another example, the bottom region 17 may be connected to the base region 14 or the emitter electrode 52 through a P type region.

In the depth direction of the semiconductor substrate 10, the bottom region 17 may be provided in a range that faces the gate conductive portion 44. Also, the bottom region 17 may be arranged at an upper side than the bottom portion of the adjacent trench portion. In another example, the bottom region 17 may cover at least a part of the bottom portion of the adjacent trench portion.

When the bottom region 17 is provided, an electric field concentration in each mesa portion 61 can be relaxed to thereby increase the breakdown voltage. In particular, as to the mesa portion 61 provided with the multiple accumulation regions, an electric field tends to concentrate in the mesa portion 61. The bottom region 17 may be provided in the mesa portion 61 provided with the multiple accumulation regions. The bottom region 17 does not need to be provided in a mesa portion that is provided with the accumulation region only by one, or not provided with the accumulation region. In the depth direction of the semiconductor substrate 10, areas between the multiple accumulation regions 16, 26 and 28 may be provided with areas of N type that have a doping concentration lower than each peak concentration of doping concentrations of the multiple accumulation regions 16, 26 and 28.

Alternatively, in the depth direction of the semiconductor substrate 10, the areas between the multiple accumulation regions 16, 26 and 28 may be of P type. In this case, the doping concentration of the P type regions between the multiple accumulation regions 16, 26 and 28 may be equal to or lower than the maximum doping concentration of the base region 14 and equal to or higher than the maximum doping concentration of the bottom region 17, or may be equal to or lower than the maximum doping concentration of the bottom region 17. In particular, when the doping concentration of the P type regions between the multiple accumulation regions 16, 26 and 28 may be equal to or lower than the maximum doping concentration of the bottom region 17, an electron current becomes easy to flow near the center of the mesa portion 61.

As one example, the buffer region 20 in the semiconductor device 400 has a plurality of peaks 13 in the doping concentration distribution in the depth direction. Note that the doping concentration distribution in the buffer region 20 may have a single peak, or may have an almost uniform concentration over the whole. The semiconductor device 400 shown in FIG. 32 has four peaks in the buffer region 20. The peak 13-1 arranged at the highest side may have a concentration higher than the peak 13-2 arranged next to the highest side.

Figure 33:
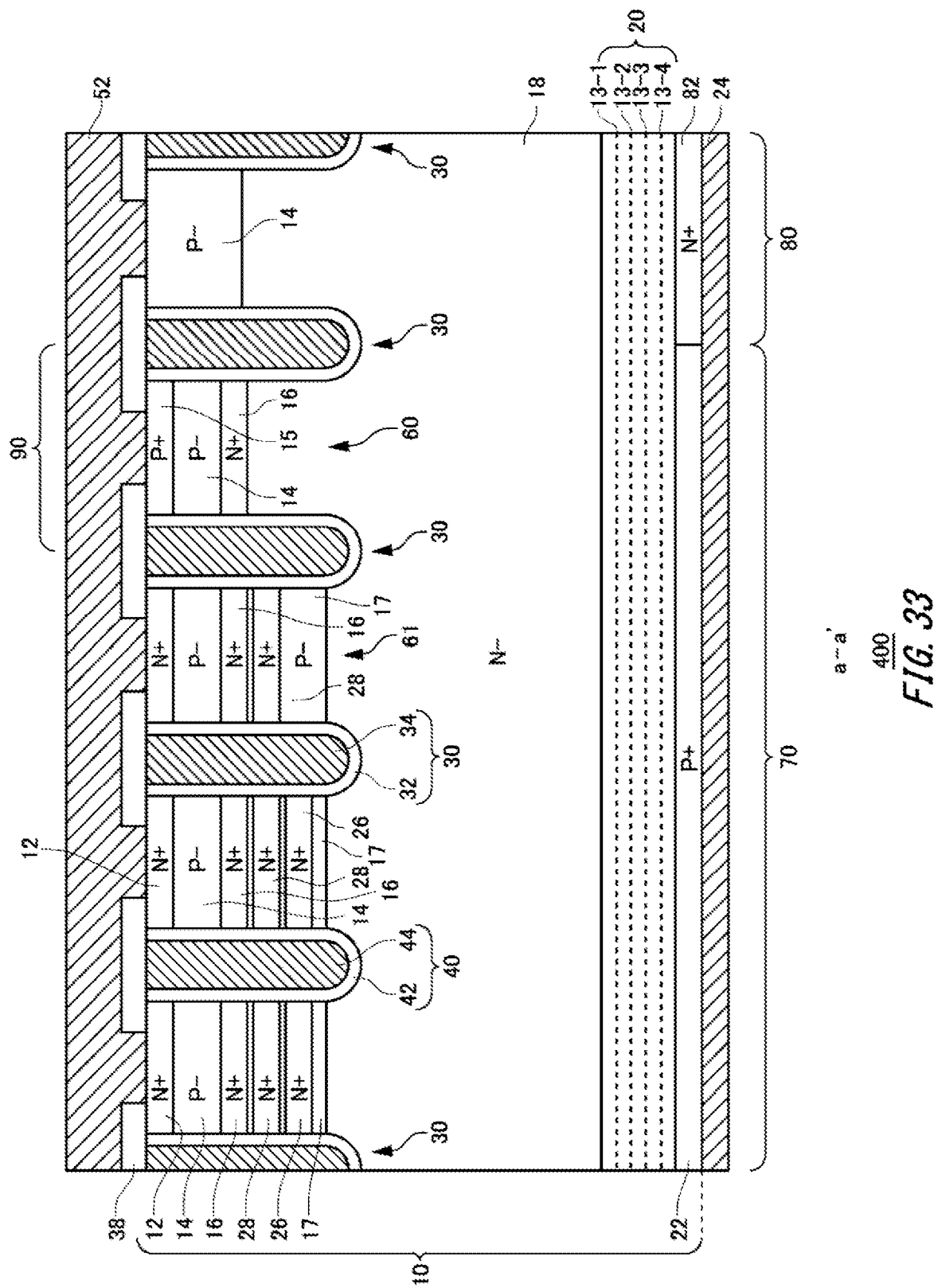
FIG. 33 illustrates another example of the semiconductor device 400.

FIG. 33 illustrates another example of the semiconductor device 400. FIG. 33 shows a configuration in which the bottom region 17 is added to the configuration in a cross-section a-a' of FIG. 7. Other configurations are the same as those of the semiconductor device 100 shown in FIG. 7.

The semiconductor device 400 of the present example is provided with the bottom region 17 in the mesa portion 61 in which two or more accumulation regions are formed. The bottom region 17 is not provided in another mesa portion.

Also, even in the mesa portion 61 having a different number of stages of the accumulation regions, the depth position at the lower end of the bottom region 17 may be the same. That is, the thickness in the depth direction of the bottom region 17 in the mesa portion 61 having a small number of stages of the accumulation regions may be larger than the thickness of the bottom region 17 in the mesa portion 61 having a large number of stages of the accumulation regions. In another example, each thickness of the bottom regions 17 may be constant not depending on the number of stages of the accumulation regions. Also with such a structure, an electric field concentration in each mesa portion 61 can be relaxed to increase the breakdown voltage.

Figure 34:
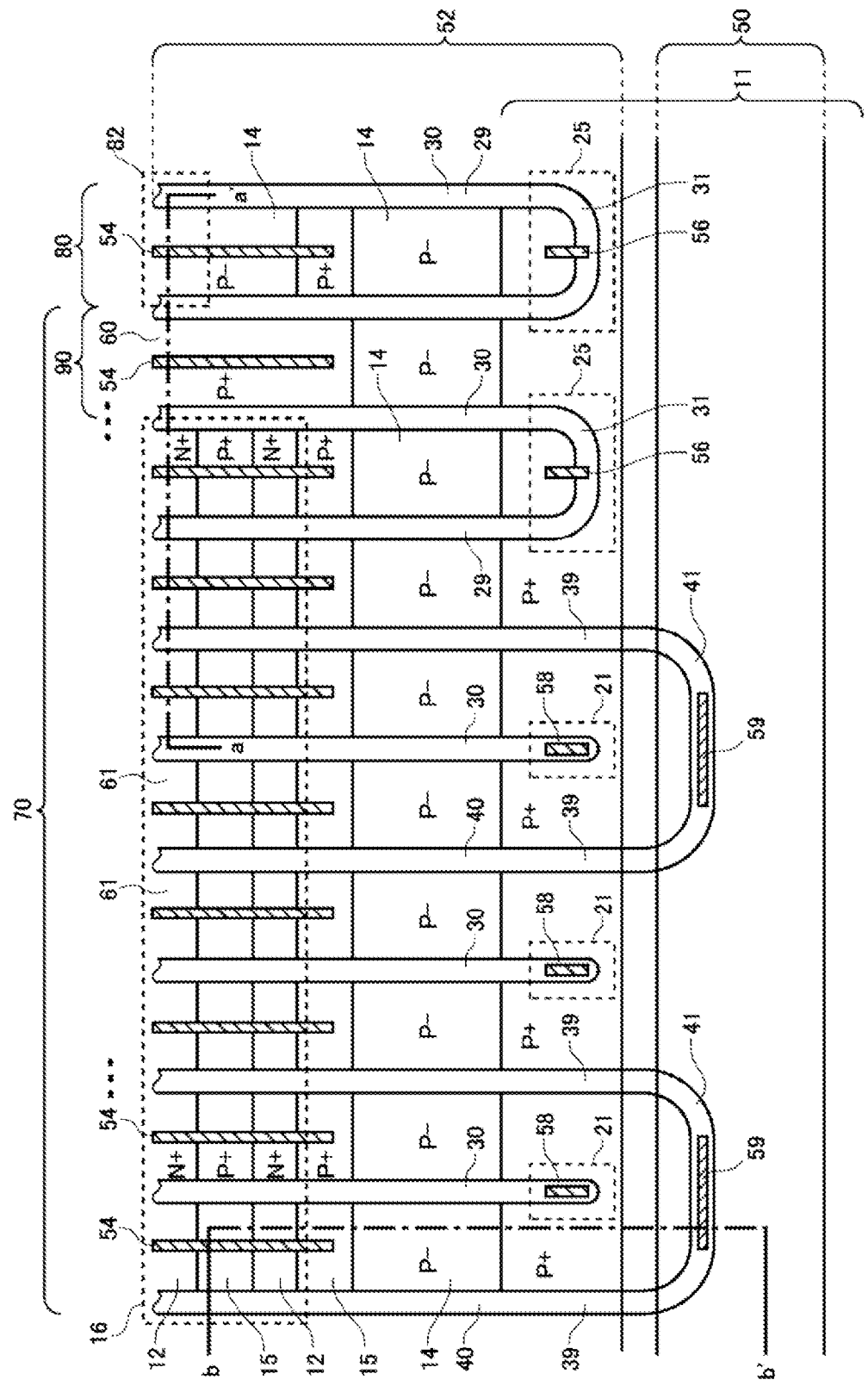
FIG. 34 illustrates a part of an upper surface of a semiconductor device 500 according to another embodiment of the invention.

FIG. 34 illustrates a part of an upper surface of a semiconductor device 500 according to another embodiment of the invention. The semiconductor device 500 has a different cross-section in the trench portion from any of the semiconductor devices illustrated in FIG. 1 to FIG. 33. Other structures may be the same as those in any of the semiconductor devices illustrated in FIG. 1 to FIG. 33.

Moreover, there is a difference from the semiconductor devices illustrated in FIG. 1 to FIG. 33 in that the semiconductor device 500 shown in FIG. 34 is not provided with the gate runner 48 and the contact hole 49. In the semiconductor device 500 shown in FIG. 34, the gate metal layer 50 is arranged at a position that overlaps with the edge portion 41 of the gate trench portion 40. The gate metal layer 50 is directly connected to the gate conductive portion 44 of the gate trench portion 40 by passing through the contact hole 59 formed in the interlayer insulating film 38. Note that similarly to the semiconductor devices in FIG. 1 to FIG. 33, the semiconductor device 500 may comprise the gate runner 48 and the contact hole 49.

Figure 35:
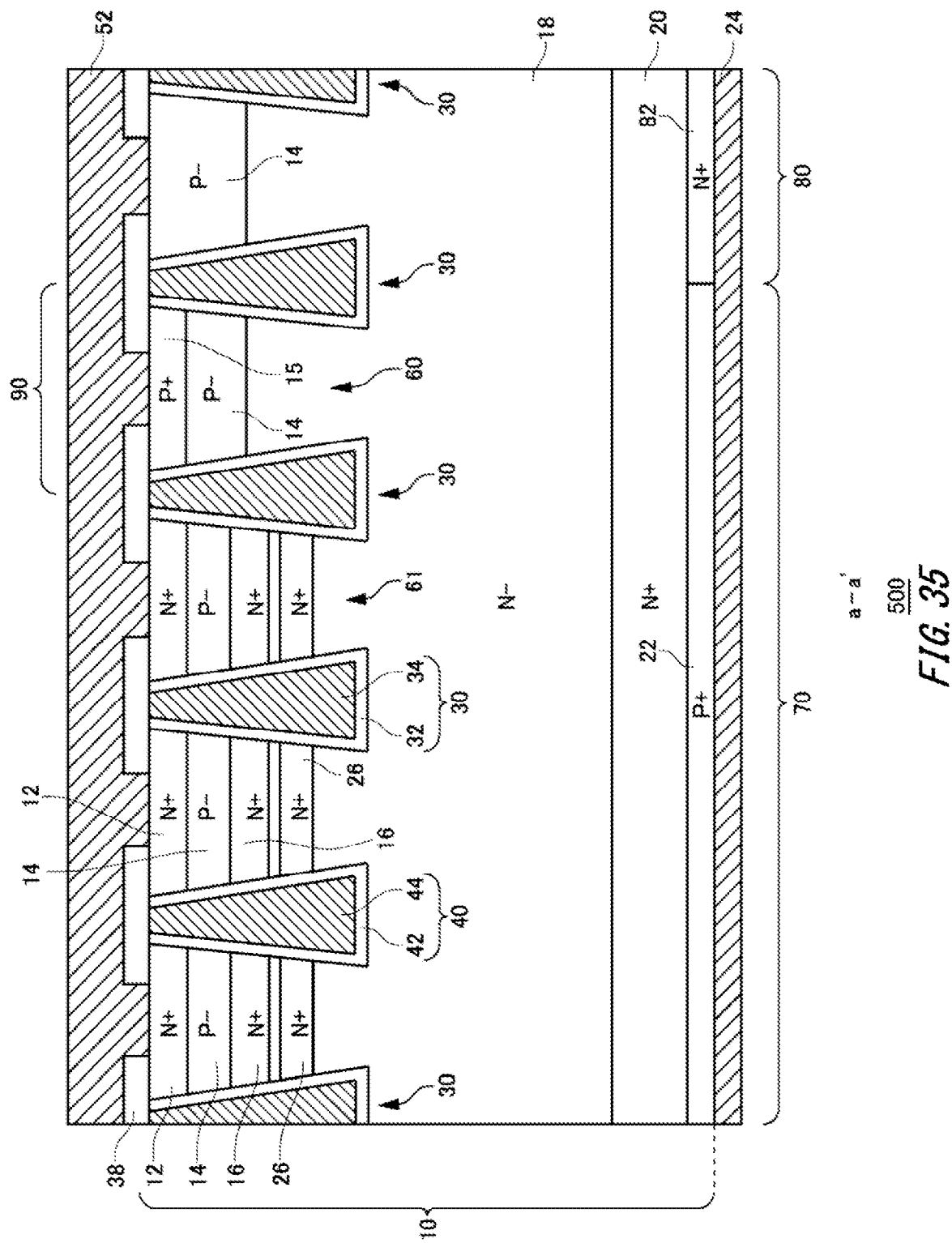
FIG. 35 is a cross-sectional view taken along a-a' in FIG. 34.

FIG. 35 is a cross-sectional view taken along a-a' in FIG. 34. As described above, the cross-section at the trench portion in the semiconductor device 500 is different from that of each semiconductor device in FIG. 1 to FIG. 33. In the example of FIG. 35, the first accumulation region 16 and second accumulation region 26 are provided in the mesa portion 61, and the accumulation region is not provided in the intermediate mesa portion 60 and the diode section 80. Note that the number of stages of the accumulation regions in each mesa portion may be the same as the number of stages in the accumulation regions in any of the semiconductor devices illustrated in FIG. 1 to FIG. 33.

The gate trench portion 40 of the present example has a tapered portion of which a width in a direction parallel to the upper surface of the semiconductor substrate 10 (that is, a width in a direction perpendicular to the extending direction of the gate trench portion 40) is reduced as going upward. The dummy trench portion 30 may have the same shape as that of the gate trench portion 40, or may have the same shape as that of the gate trench portions 40 illustrated in FIG. 1 to FIG. 33.

Figure 36:
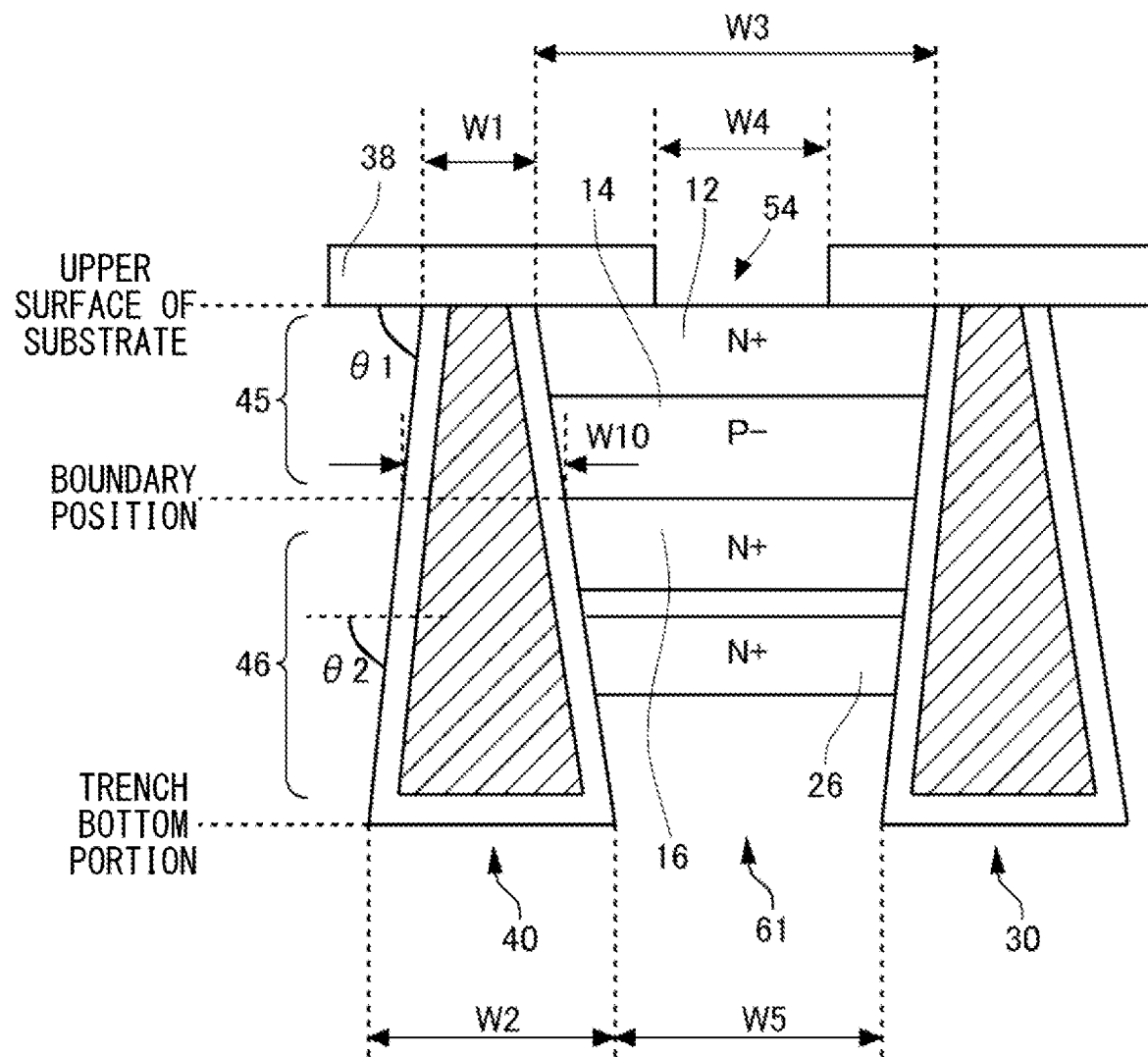
FIG. 36 is a drawing describing a cross-section in the gate trench portion 40.

FIG. 36 illustrates a cross-section in the gate trench portion 40. In the present example, a boundary between the base region 14 and the first accumulation region 16 in the depth direction of the semiconductor substrate 10 is defined as boundary position. The boundary position may be a boundary position between the base region 14 and the first accumulation region 16 in a region in contact with the gate trench portion 40.

The gate trench portion 40 has, at an upper side of the boundary position, a first tapered portion 45 of which a width in a direction parallel to the upper surface of the semiconductor substrate 10 is reduced as going upward (that is, as approaching the upper surface of the semiconductor substrate 10). The first tapered portion 45 may be formed over the whole region between the boundary position and the upper surface of the semiconductor substrate 10, or may be formed in a part only thereof. The first tapered portion 45 may be formed over a range wider than the base region 14, or may be formed over a region corresponding to a half or more of the region between the boundary position and the upper surface of the semiconductor substrate 10.

A width W1 of the gate trench portion 40 in the upper surface of the semiconductor substrate 10 may be smaller than a width W10 of the gate trench portion 40 at the boundary position. Also, the width W1 of the gate trench portion 40 may be smaller than a width W2 at the bottom portion of the gate trench portion 40. When the width W1 of the gate trench portion 40 in the upper surface of the semiconductor substrate 10 is reduced, a distance between the gate trench portion 40 and the contact hole 54 can be increased. For this reason, even when the semiconductor device 500 is miniaturized, the distance between the gate trench portion 40 and the contact hole 54 can be ensured, and a distance between the gate trench portion 40 and an emitter electrode 52 can be ensured. For this reason, it becomes easy to miniaturize the semiconductor device 500.

The gate trench portion 40 of the present example has a second tapered portion 46 at a lower side than the boundary position, the second tapered portion 46 having a larger width as going downward. The second tapered portion 46 may be formed over the whole region between the boundary position and the trench bottom portion, or may be formed in a part only thereof. The second tapered portion 46 may be formed in a range that is wider than a region from the upper end of the accumulation region at the highest side (the first accumulation region 16 in the present example) to the lower end of the accumulation region at the lowest side (the second accumulation region 26 in the present example), or may be formed over a region corresponding to a half or more of a region between the boundary position and the trench bottom portion.

With such a structure, the width W1 of the gate trench portion 40 in the upper surface of the semiconductor substrate 10 can be easily reduced. Note that since the gate trench portion 40 has the second tapered portion 46, a mesa width W5 between the gate trench portion 40 and the dummy trench portion 30 at the trench bottom portions is reduced. For this reason, the displacement current shown in FIG. 13 and FIG. 14 becomes easy to flow. On the other hand, according to the semiconductor device 500, since the multiple accumulation regions are provided in the mesa portion 61, the electron current becomes easy to flow in the center vicinity of the mesa portion 61 as shown in FIG. 14. For this reason, the hole distribution in the vicinity of the trench bottom portion can be divided at the center of the mesa portion 61, thereby suppressing the displacement current.

The width W1 of the gate trench portion 40 in the upper surface of the semiconductor substrate 10 may be 0.8 times or less of the maximum width W2 in the gate trench portion 40 (width at the trench bottom portion in the present example), or may be 0.7 times or less thereof. The width W1 of the gate trench portion 40 may be smaller than a maximum width W3 of the mesa portion 61 (mesa width in the upper surface of the substrate in the present example), may be smaller than a minimum width W5 of the mesa portion 61 (mesa width in the trench bottom portion in the present example), or may be smaller than a width W4 of the contact hole 54.

The maximum width W2 in the gate trench portion 40 may be larger than the minimum width W5 of the mesa portion 61. The maximum width W2 in the gate trench portion 40 may be larger than the maximum width W3 of the mesa portion 61. An angle θ1 of a sidewall of the first tapered portion 45 with respect to the surface parallel to the upper surface of the semiconductor substrate 10 may be the same as an angle θ2 of a sidewall of the second tapered portion 46 thereto, or may be different therefrom. The angle θ1 may be larger than the angle θ2, or may be smaller than the angle θ2. In the present example, the angle θ1 is equal to the angle θ2. Note that the angles θ1 and θ2 may be a maximum angle among angles measured between a tangent of each sidewall of the tapered portions and the upper surface of the substrate. Also, the angle measured between the tangent of the sidewall and the upper surface of the substrate at the center position in the depth direction at each tapered portion may be used for each of the angles θ1 and θ2.

Figure 37:
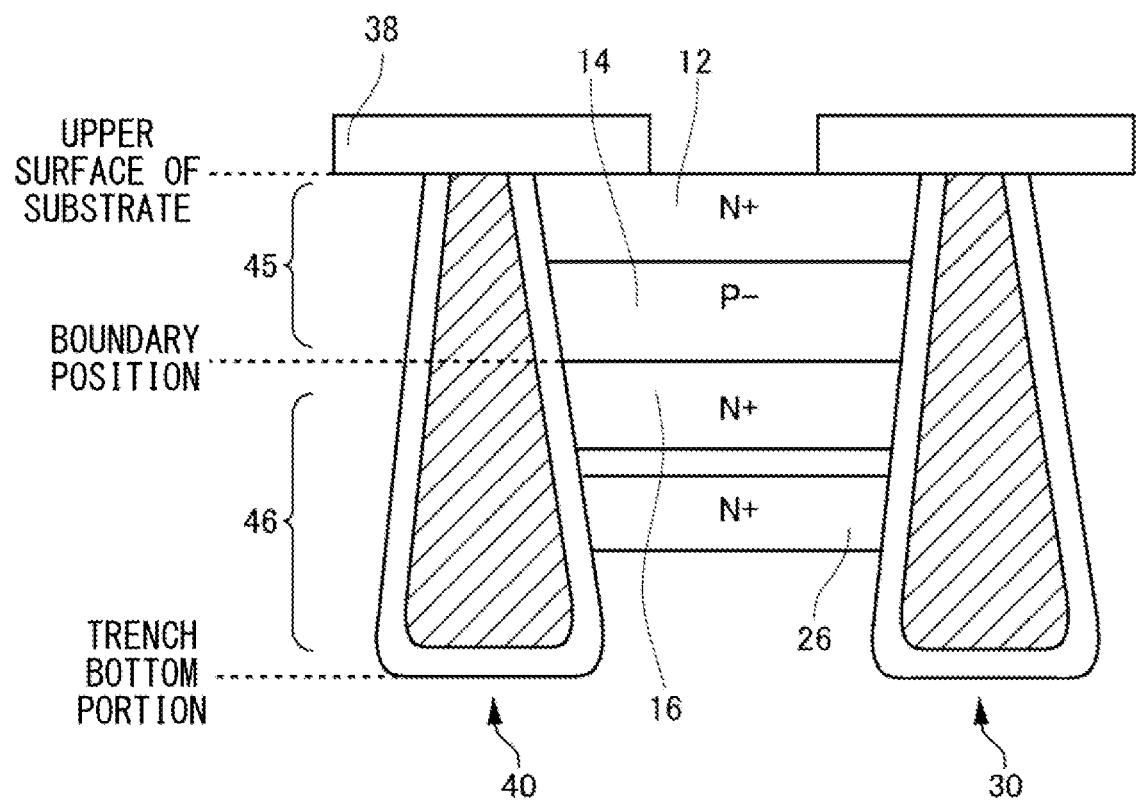
FIG. 37 illustrates another example of the cross-section in a gate trench portion 40.

FIG. 37 illustrates another example of a cross-section in the gate trench portion 40. The gate trench portion 40 of the present example has a curved shape at a corner in the trench bottom portion. Other structures may be the same as those of the gate trench portion 40 shown in FIG. 36. With such a structure, the electric field at the corner in the trench bottom portion can be relaxed. Also, a distance between the gate trench portion 40 in the trench bottom portion, and the dummy trench portion 30 can be increased, so that the displacement current can be suppressed.

Figure 38:
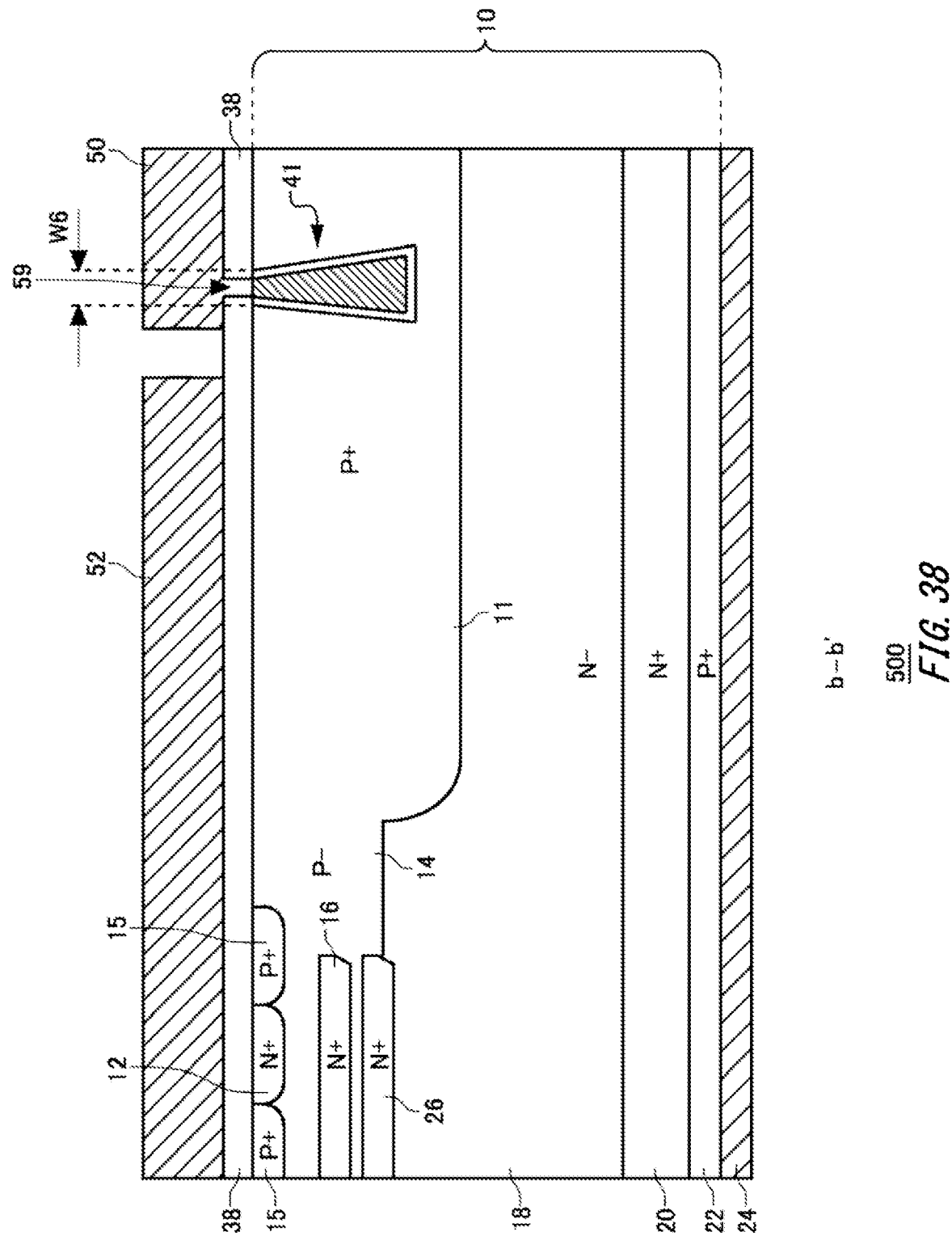
FIG. 38 is a cross-sectional view taken along b-b' in FIG. 34.

FIG. 38 is a cross-sectional view taken along b-b' in FIG. 34. As described above, the gate metal layer 50 of the present example is directly connected to the gate conductive portion at the edge portion 41 of gate trench portion 40 via the contact hole 59. On the other hand, as shown in FIG. 1, when the gate conductive portion is connected to the gate metal layer 50 through the gate runner 48, charges that flow in parallel to the upper surface of the substrate through the gate runner 48 will flow in the depth direction of the substrate in the gate conductive portion. In this case, when a connection point of the gate runner 48 and the gate conductive portion has a steep corner portion, charges concentrate at the corner portion, which is not preferable. For this reason, in order to relax a connection angle between the gate runner 48 and gate conductive portion, the gate trench portion 40 preferably has, in the vicinity of the upper surface of the semiconductor substrate 10, a reverse tapered structure having a wider width as approaching the upper surface of the semiconductor substrate 10. However, when the upper end of the gate trench portion 40 has the reverse tapered structure, a distance between the gate trench portion 40 and the contact hole 54 will be reduced in the cross-section shown in FIG. 36.

In the present example, since the gate metal layer 50 is directly connected to the gate conductive portion, the upper end of the gate trench portion 40 does not need to have the reverse tapered structure. For this reason, as shown in FIG. 36 and so on, the first tapered portion 45 is provided in the gate trench portion 40, and the width W1 of the gate trench portion 40 in the upper surface of the substrate can be easily reduced.

Note that the width W1 of the upper end of the gate trench portion 40 is reduced, as shown in FIG. 38, an alignment between the gate metal layer 50 and the gate trench portion 40 becomes relatively difficult. For this reason, it is preferable that a width W6 at the upper end of the gate trench portion 40 in a portion that is in contact with the gate metal layer 50 is greater than the width W1 at the upper end of the gate trench portion 40 in a portion that is not in contact with the gate metal layer 50. For example, the width W6 of the gate trench portion 40 in the portion that is in contact with the gate metal layer 50 is greater than the width W1 at the extending portion 39 of the gate trench portion 40.

Figure 39:
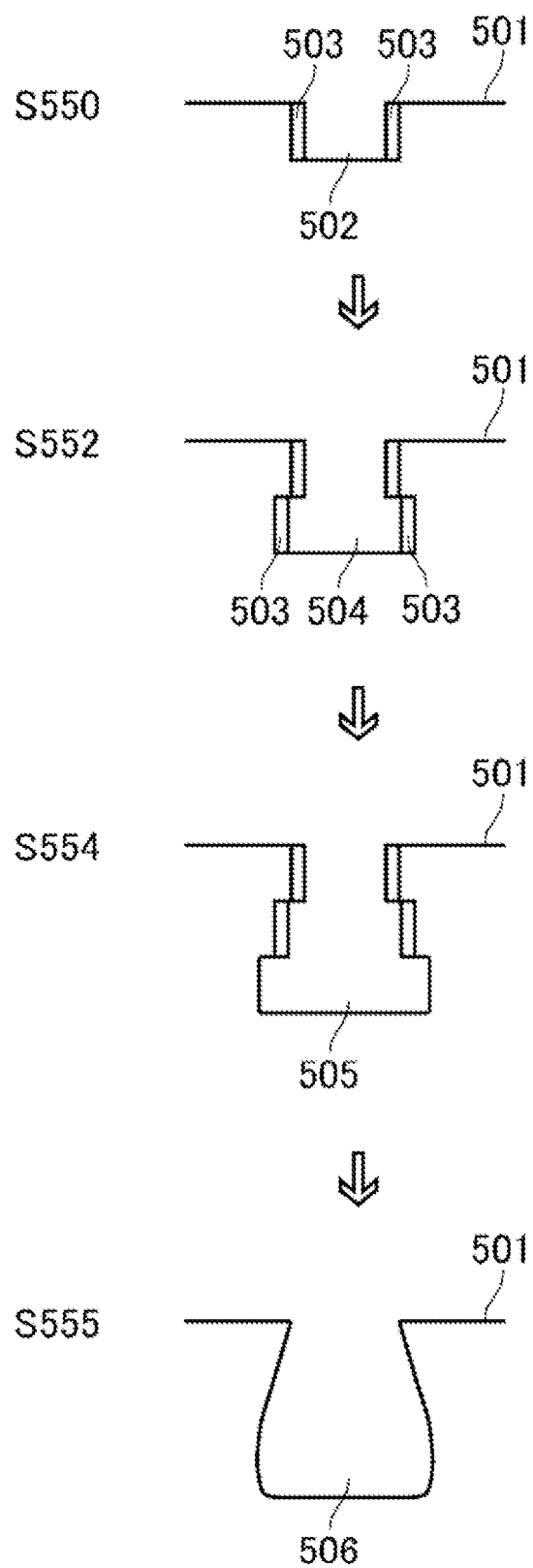
FIG. 39 illustrates one example of a formation process of a gate trench portion 40 shown in FIG. 35 to FIG. 38.

FIG. 39 illustrates one example of a formation process of a gate trench portion 40 shown in FIG. 35 to FIG. 38. First, at S550, a shallow groove portion 502 is formed in the upper surface 501 of the semiconductor substrate 10. The groove portion 502 can be formed by forming a mask having a predetermined pattern on the upper surface 501 of the semiconductor substrate 10, and then etching the upper surface 501 of the semiconductor substrate 10. Each groove portion in FIG. 39 may be formed by an anisotropic etching, or may be formed by an isotropic etching. After the formation of the groove portion 502, a protective film 503 such as a nitride film is formed on the sidewall of the groove portion 502.

At S552, the bottom surface of the groove portion 502 is etched to form the groove portion 504. A width of the groove portion 504 is greater than that of the groove portion 502. After the formation of the groove portion 504, a protective film 503 is formed on the sidewall of the groove portion 504. At S554, the formation of the groove portion is repeated. The number of stages of the groove portions may be adjusted according to a depth of the trench portion to be formed. The protective film 503 is not formed on the sidewall of a finally formed groove portion 505.

At S555, after the formation of the groove portion 505, the individual protective films 503 are removed. In this way, a trench 506 in a tapered shape can be formed. After the removal of the protective film 503, an isotropic etching may be further performed on the whole inner wall of the trench 506 to make the inner wall of the trench 506 a smooth shape.

Figure 40:
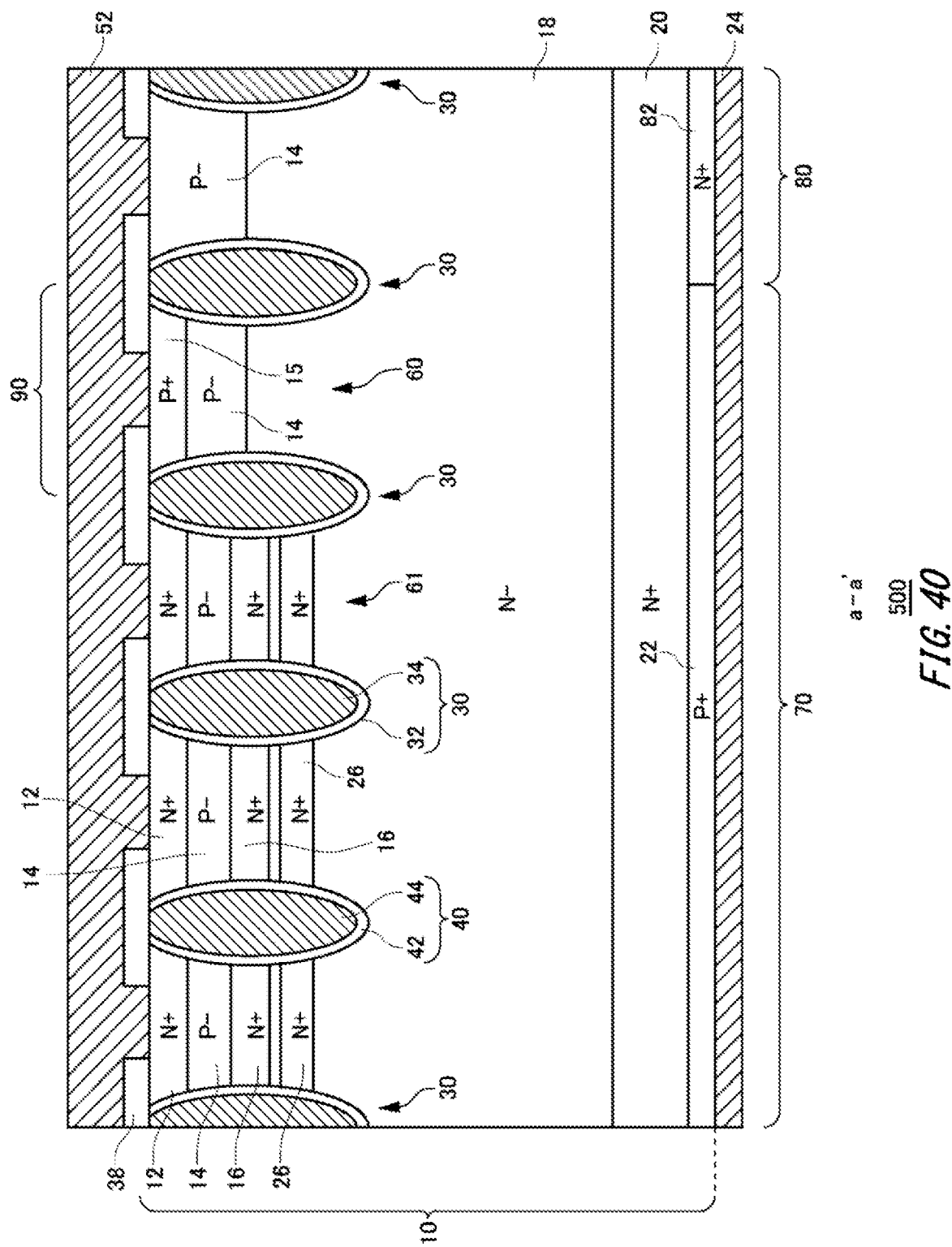
FIG. 40 illustrates another example of a cross-section in the gate trench portion 40.

FIG. 40 illustrates another example of a cross-section in the gate trench portion 40. Except for the cross-section in the gate trench portion 40, the semiconductor device 500 may have the same structure as those of each example illustrated in FIG. 35 to FIG. 38.

Figure 41:
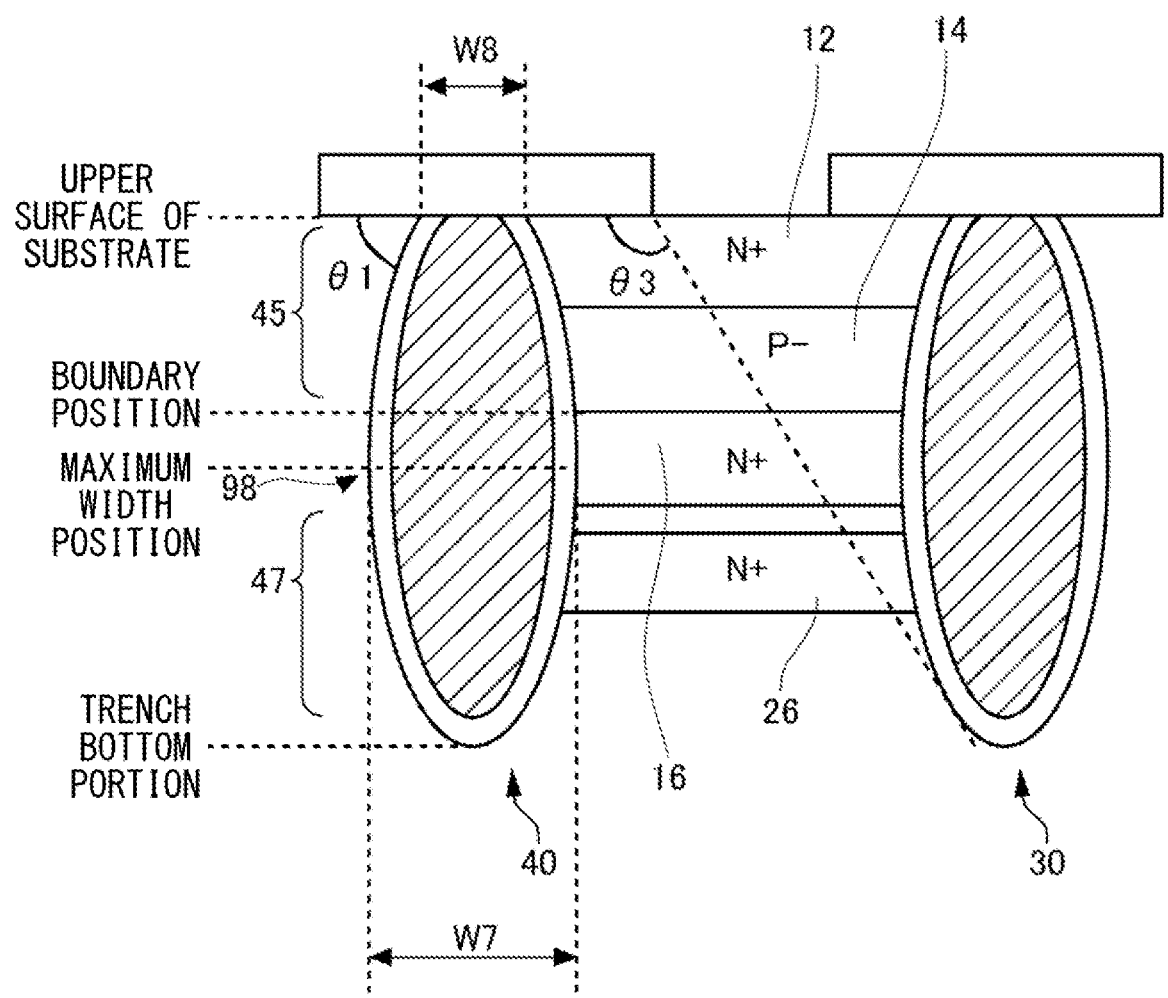
FIG. 41 is a drawing describing the cross-section in the gate trench portion 40.

FIG. 41 illustrates the cross-section in the gate trench portion 40. The gate trench portion 40 of the present example has the first tapered portion 45 and a third tapered portion 47. The first tapered portion 45 is similar to the first tapered portion 45 illustrated in FIG. 35 to FIG. 38. Note that the sidewall at the first tapered portion 45 shown in FIG. 35 has a substantially straight shape, while the sidewall at the first tapered portion 45 of the present example has a curved shape that is outward convex. Note that the sidewall of the first tapered portion 45 in the example of FIG. 35 and in the present example may be one of the straight shape and the curved shape.

The third tapered portion 47 is provided at a lower side than the boundary position, and has a smaller width as the width is measured at the lower side. The third tapered portion 47 may be formed over the whole region between the boundary position and the trench bottom portion, or may be formed only in a part thereof. The third tapered portion 47 may be formed over a region corresponding to a half or more of a region between the boundary position and the trench bottom portion. The sidewall of the third tapered portion 47 may have a straight shape, or may have a curved shape. The sidewall of the third tapered portion 47 in the example of FIG. 41 has a curved shape that is outward convex.

Due to the configuration that the gate trench portion 40 has the first tapered portion 45 and the third tapered portion 47, while the width W8 of the gate trench portion 40 in the upper surface of the substrate is set smaller, the distance between the gate trench portion 40 at the trench bottom portion, and the dummy trench portion 30 can be set larger. For this reason, the semiconductor device 500 can be easily miniaturized, and the displacement current can be suppressed.

The width of the gate trench portion 40 has a maximum width portion 98 between the first tapered portion 45 and the third tapered portion 47 to give a maximum width of the gate trench portion 40. The maximum width portion 98 may be arranged at a lower side than the boundary position between the base region 14 and the first accumulation region 16. The width W7 of the gate trench portion 40 at the maximum width portion 98 may be 1.2 times or more of the width in the gate trench portion 40 on the upper surface of the substrate, or may be 1.3 times or more thereof.

An angle of the sidewall of the first tapered portion 45 with respect to the surface parallel to the upper surface of the semiconductor substrate 10 is denoted as θ1, while an angle of the sidewall of the second tapered portion 46 is denoted as θ2. When the angle θ1 is provided as an acute angle, an angle θ3 becomes an obtuse angle. That is, a mutual relationship between θ1 and θ3 may be as follows: one of θ1 and θ3 is an acute angle, while the other is an obtuse angle. Note that the angles θ1 and θ3 may be a maximum value among angles measured between a tangent of each sidewall of the tapered portions and the upper surface of the substrate. Also, the angle θ1 may be an acute angle at an arbitrary position in the depth direction of the first tapered portion 45. The angle θ3 may be an obtuse angle at an arbitrary position in the depth direction of the third tapered portion 47. Also, the angle that the tangent of the sidewall forms with the upper surface of the substrate at the center position in the depth direction at each tapered portion may be used for each of the angles θ1 and θ2. The sidewall of the first tapered portion 45 may have a shape that is upward convex. The sidewall of the third tapered portion 47 may have a shape that is downward convex.

Any of the accumulation regions may be arranged at the same depth position as that of the maximum width portion 98. In the example of FIG. 41, the first accumulation region 16 is arranged at the same depth position as that of the maximum width portion 98. In the region provided with the maximum width portion 98, the width of the mesa portion 61 is reduced. When the accumulation region is provided at that position, holes are accumulated at a narrow region such that a concentration of holes to be accumulated by the accumulation region can be set higher.

Figure 42:
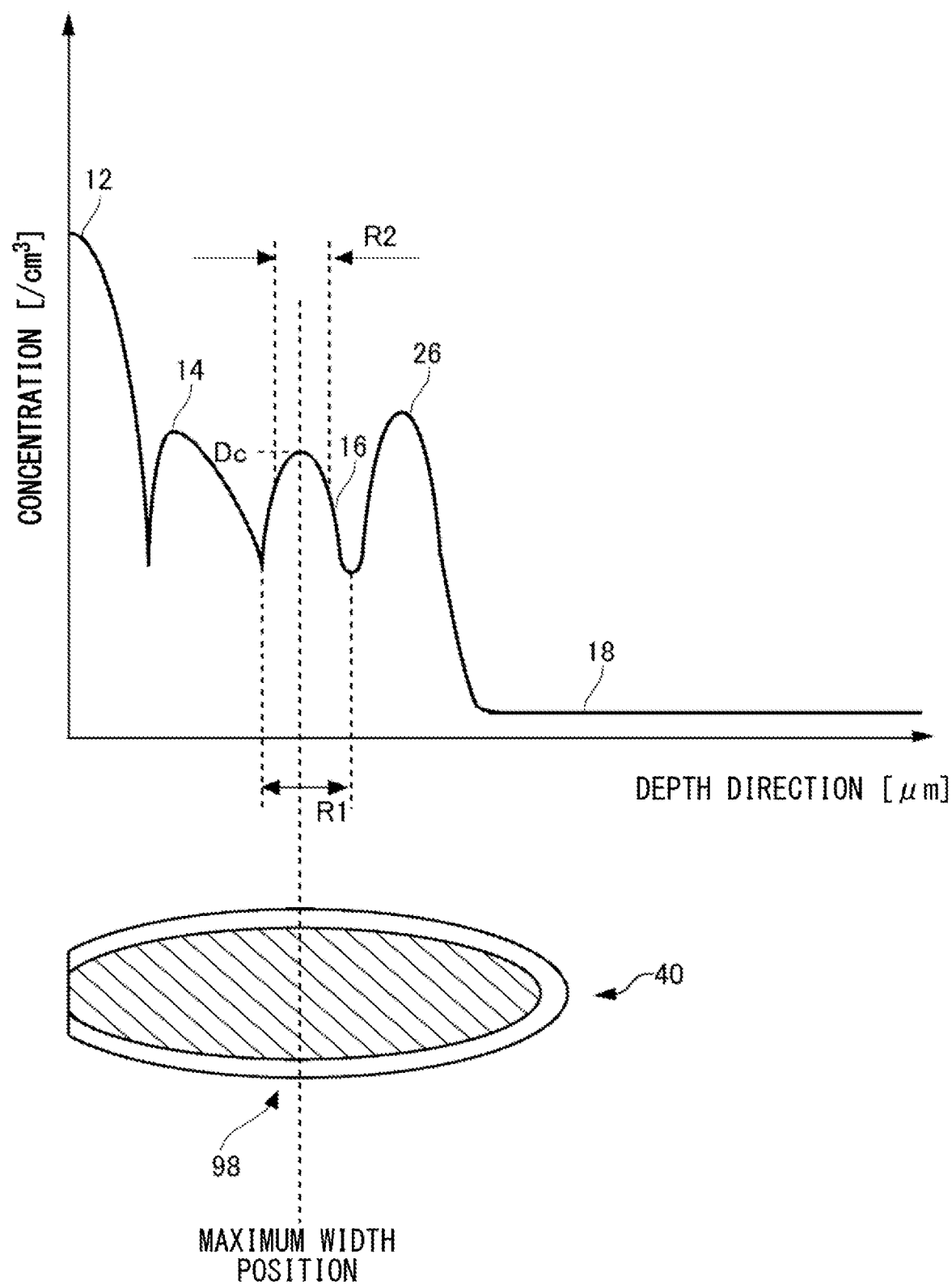
FIG. 42 illustrates an example of relationship between a depth position of a maximum width portion 98 of the gate trench portion 40, and the first accumulation region 16.

FIG. 42 illustrates an example of relationship between the depth position of the maximum width portion 98 of the gate trench portion 40, and the first accumulation region 16. As described above, the first accumulation region 16 is arranged at the same depth position as that of the maximum width portion 98. In the present example, a range from the boundary between the base region 14 and the first accumulation region 16 to the boundary between the first accumulation region 16 and the second accumulation region 26 is defined as a range R1 of the first accumulation region 16. The position of the maximum width portion 98 (maximum width position) may be arranged in the range R1 of the first accumulation region 16.

Also, the maximum width portion 98 may be arranged in the range R2 at the half-value width in the doping concentration distribution of the first accumulation region 16 in the depth direction. Also, the peak position in the doping concentration distribution of the first accumulation region 16 in the depth direction may overlap with the depth position of the maximum width portion 98.

Figure 43:
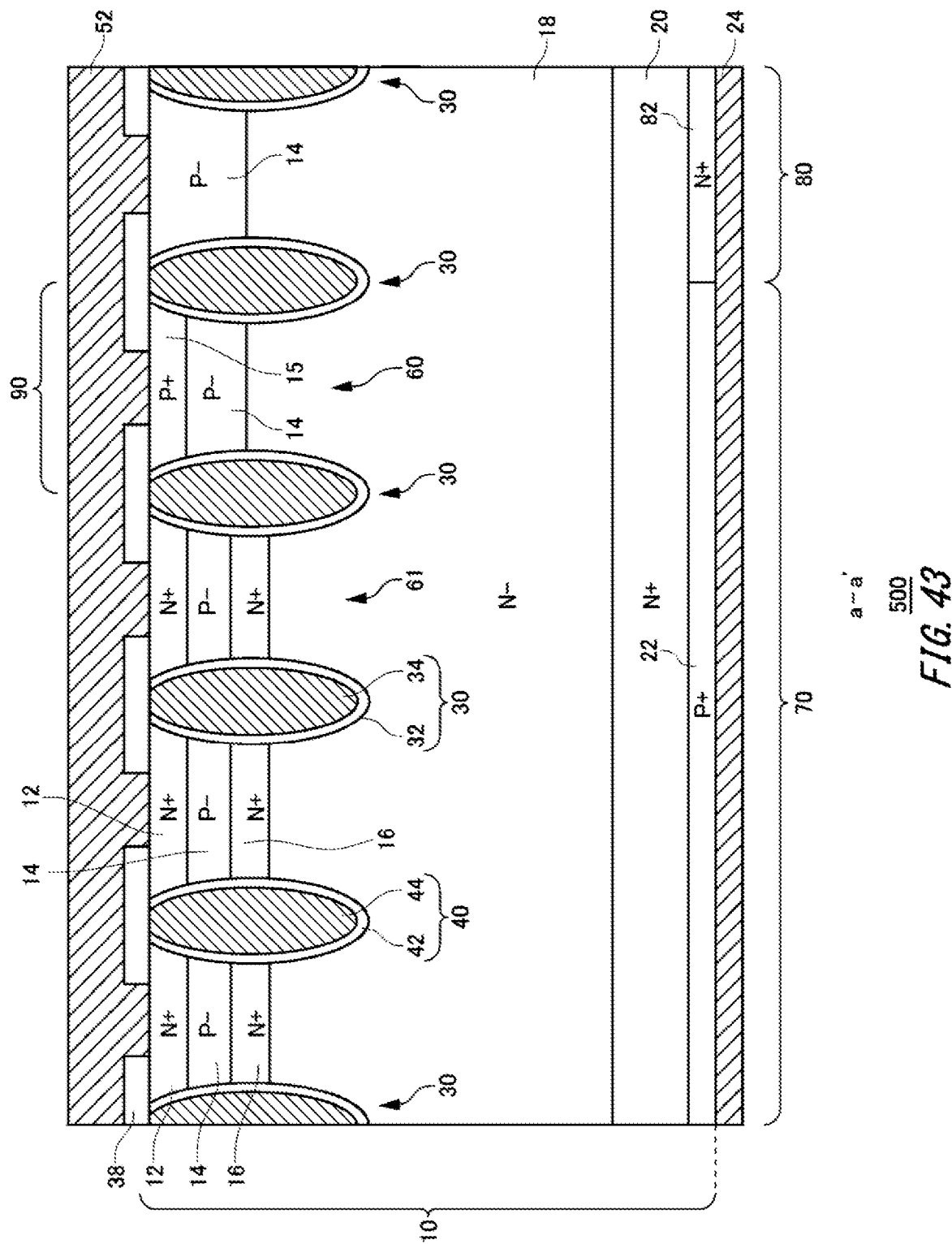
FIG. 43 is another example of the cross-sectional view taken along a-a' in FIG. 34.

FIG. 43 illustrates another example of the cross-sectional view taken along a-a' in FIG. 34. The semiconductor device 500 of the present example has a different number of stages of the accumulation regions in the mesa portion 61 from the semiconductor device 500 illustrated in FIG. 40 to FIG. 42. Other structures are the same as those in each semiconductor device 500 illustrated in FIG. 40 to FIG. 42.

The semiconductor device 500 of the present example has only one accumulation region in the mesa portion 61 (first accumulation region 16 in the present example). Since the gate trench portion 40 of the present example has a small width of the trench bottom portion, a distance from the dummy trench portion 30 in the trench bottom portion is large. For this reason, the displacement current can be suppressed. Accordingly, no large displacement current flows even by only one stage of the accumulation region.

Figure 44:
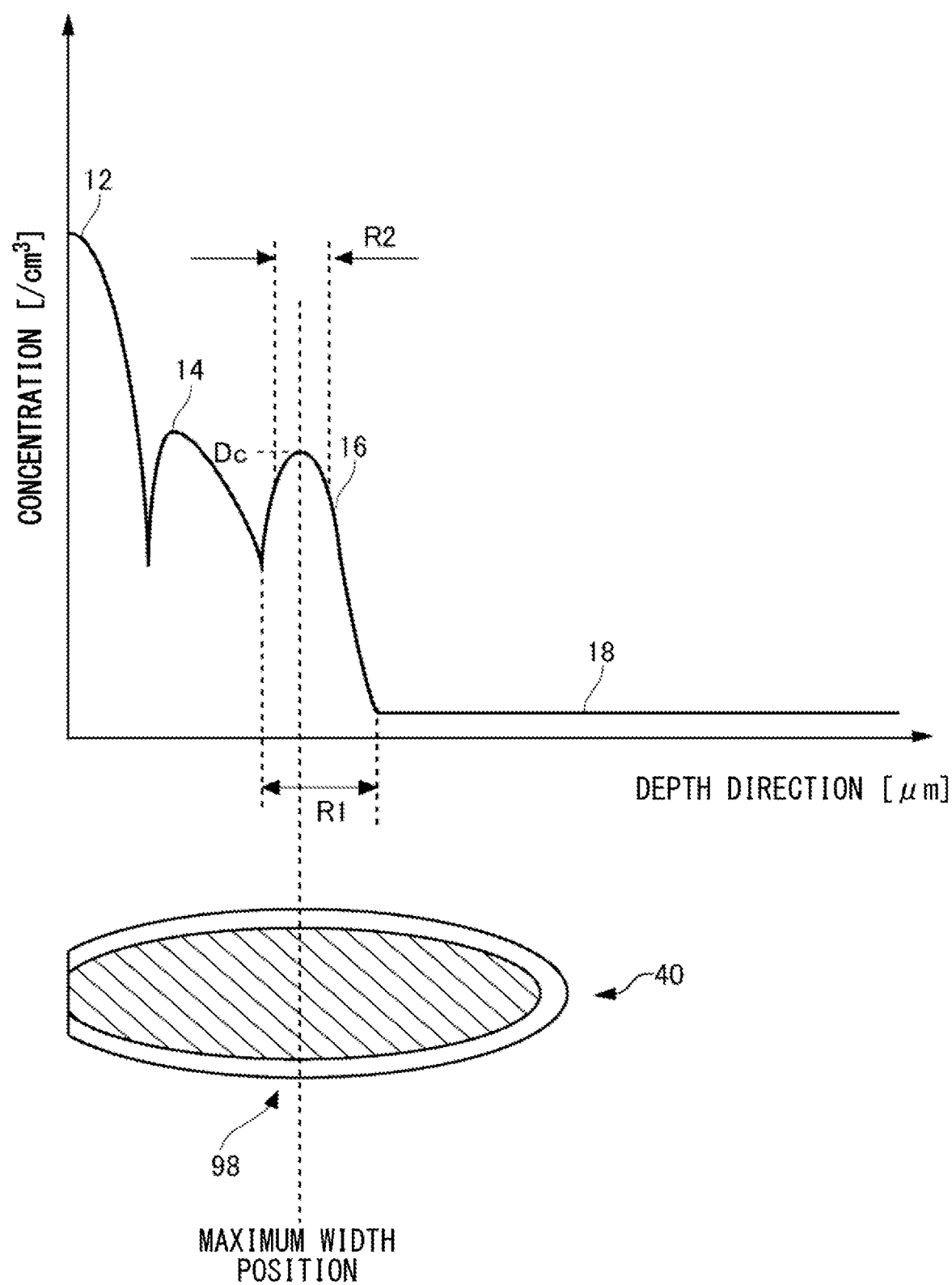
FIG. 44 illustrates an example of relationship between the depth position of a maximum width portion 98 of the gate trench portion 40, and the first accumulation region 16 in the example of FIG. 43.

FIG. 44 illustrates an example of relationship between the depth position of a maximum width portion 98 of the gate trench portion 40, and the first accumulation region 16 in the example of FIG. 43. Also in the present example, the first accumulation region 16 may be arranged at the same depth position as that of the maximum width portion 98. In the present example, a range from the boundary between the base region 14 and the first accumulation region 16 to the boundary between the first accumulation region 16 and the drift region 18 is defined as the range R1 of the first accumulation region 16. The position of the maximum width portion 98 (maximum width position) may be arranged in the range R1 of the first accumulation region 16.

Also, the maximum width portion 98 may be arranged in the range R2 of the half-value width in the doping concentration distribution of the first accumulation region 16 in the depth direction. Also, the peak position in the doping concentration distribution of the first accumulation region 16 in the depth direction may overlap with the depth position of the maximum width portion 98.

Figure 45:
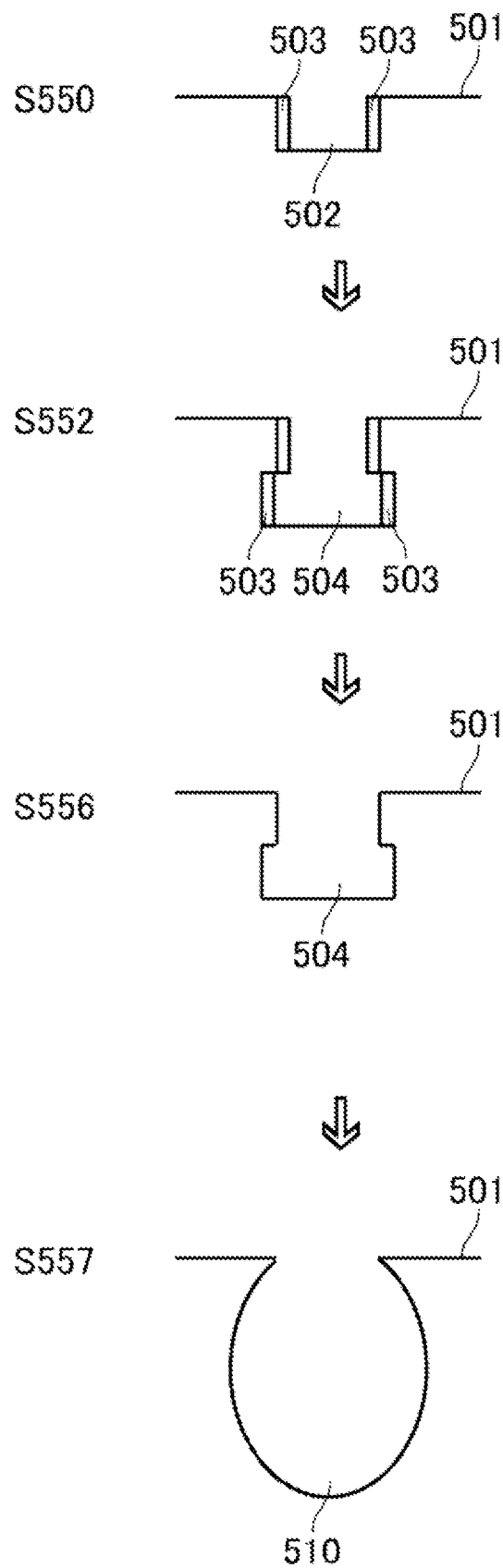
FIG. 45 illustrates one example of a formation process of a gate trench portion 40 having a first tapered portion 45 and a third tapered portion 47.

FIG. 45 illustrates one example of a formation process of the gate trench portion 40 having the first tapered portion 45 and the third tapered portion 47. The processes at S550 and S552 are similar to those in FIG. 39. The process at S552 may be repeated according to a depth to form the gate trench portion 40, whereby a plurality of groove portions 504 each having a gradually increasing width is formed.

At S556, the protective film 503 of each groove portion is removed. At S557, an isotropic etching is performed on the sidewall of each groove portion and the whole bottom surface to thus form the trench 510. In this way, the first tapered portion 45 is formed in the region where the groove portion has been formed, so that the third tapered portion 47 can be formed at a lower side than the groove portion.

Figure 46:
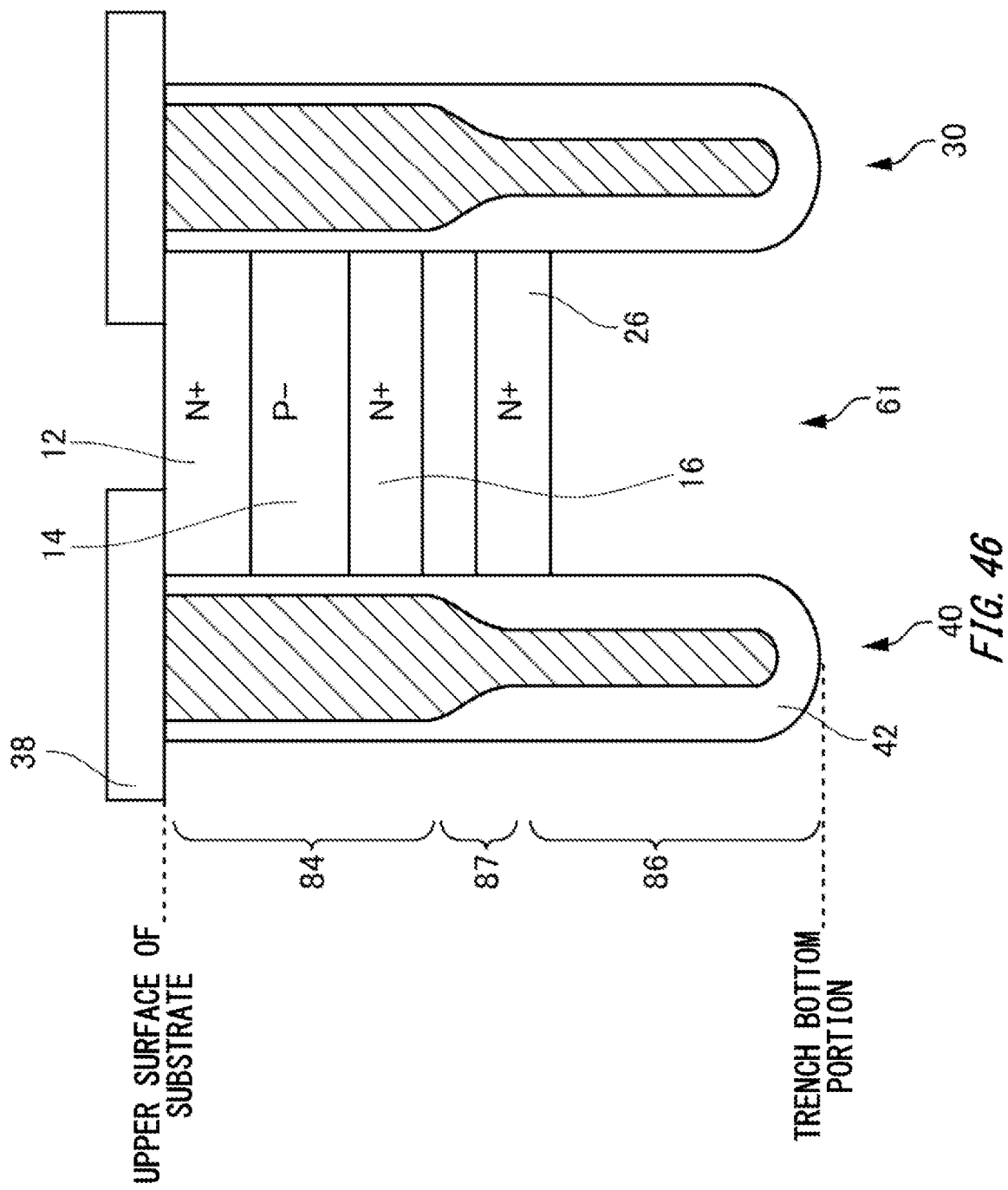
FIG. 46 illustrates another example of the cross-section in the gate trench portion 40.

FIG. 46 illustrates another example of the cross-section in the gate trench portion 40. The gate trench portion 40 of the present example has a lower portion 86 including a bottom portion of the gate trench portion 40, and a thin film portion 84 which is provided at an upper side than the lower portion 86 and of which the gate insulating film 42 is thinner than the gate insulating film 42 in the lower portion 86. When the gate insulating film 42 at the trench bottom portion is made thicker, the breakdown voltage of the gate insulating film 42 can be set higher in the trench bottom portion that an electric field is prone to concentrate.

An intermediate portion 87 having a thickness of the gate insulating film 42 varied continuously may be provided between the thin film portion 84 and the lower portion 86. The thickness of the gate insulating film 42 in the thin film portion 84 may be approximately constant. The thickness of the gate insulating film 42 in the lower portion 86 may be approximately constant. A slope in thickness change of the gate insulating film 42 in the intermediate portion 87 is larger than a slope in thickness change of the gate insulating film 42 at each of the thin film portion 84 and the lower portion 86.

The multiple accumulation regions are provided in the mesa portion 61 of the present example. In an example of FIG. 46, the first accumulation region 16 and the second accumulation region 26 are provided. Among the accumulation regions, the first accumulation region 16 arranged at the highest side may be arranged opposite to the thin film portion 84. A configuration that the first accumulation region 16 is opposite to the thin film portion 84 refers to a configuration where the peak position in the doping concentration distribution of the first accumulation region 16 in the depth direction is arranged opposite to the thin film portion 84. The whole first accumulation region 16 may be arranged opposite to the thin film portion 84.

The second accumulation region 26 arranged at the lowest side among the accumulation regions also functions as a capacitance addition portion. The second accumulation region 26 may be arranged opposite to at least one of the intermediate portion 87 and the lower portion 86. In the second accumulation region 26, the peak position in the doping concentration distribution thereof in the depth direction may be arranged opposite to the lower portion 86, and the whole thereof may be arranged opposite to the lower portion 86. In the second accumulation region 26, a gate-collector capacitance is preferably increased to an extent that the gate-collector capacitance to be reduced due to the thicker gate insulating film 42 of the lower portion 86 can be compensated. A peak value of the doping concentration in the second accumulation region 26 may be higher than a peak value of the doping concentration of the first accumulation region 16.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a drift region of a first conductivity type;
   a first semiconductor region of the first conductivity type provided above the drift region and having a doping concentration higher than the drift region;
   a second semiconductor region of a second conductivity type provided between the first semiconductor region and the drift region; and
   a plurality of trench portions arranged in a first direction and having an extending portion that extends in a second direction perpendicular to the first direction, wherein
   at least one trench portion of the plurality of trench portions has a first tapered portion at an upper side than a depth position of a lower surface of the second semiconductor region, a width of the first tapered portion in the first direction becoming smaller from a lower side of the first tapered portion toward an upper side of the first tapered portion.

2. The semiconductor device according to claim 1, wherein
   the at least one trench portion further has a second tapered portion at an lower side than the depth position of the lower surface of the second semiconductor region, a width of the second tapered portion in the first direction becoming larger from an upper side of the second tapered portion toward an lower side of the second tapered portion.

3. The semiconductor device according to claim 1, wherein
   the depth position is a depth position of a region at which the lower surface of the second semiconductor region is in contact with the at least one trench portion.

4. The semiconductor device according to claim 1, further comprising:
   a first upper-surface electrode and a second upper-surface electrode provided separately from each other; and an interlayer insulating film provided below the first upper-surface electrode and the second upper-surface electrode, wherein the second upper-surface electrode is in contact with the first semiconductor region via a contact hole provided in the interlayer insulating film.

5. The semiconductor device according to claim 4, wherein
each trench portion of the plurality of trench portions includes:
a first trench portion having (i) a first insulating film formed on an inner wall of the first trench portion and (ii) a first conductive portion formed inside of the first insulating film within the first trench portion and connected to the first upper-surface electrode; and
a second trench portion having (i) a second insulating film formed on an inner wall of the second trench portion and (ii) a second conductive portion formed inside of the second insulating film within the second trench portion and connected to the second upper-surface electrode.

6. The semiconductor device according to claim 1, further comprising a transistor section and a diode section.

7. The semiconductor device according to claim 1, further comprising a semiconductor substrate that is a silicon substrate or a silicon carbide substrate.

8. A semiconductor device comprising:
a drift region of a first conductivity type;
a first semiconductor region of the first conductivity type provided above the drift region and having a doping concentration higher than the drift region;
a second semiconductor region of a second conductivity type provided between the first semiconductor region and the drift region;
a plurality of trench portions arranged in a first direction and having an extending portion that extends in a second direction perpendicular to the first direction;
a first upper-surface electrode and a second upper-surface electrode provided separately from each other; and
an interlayer insulating film provided below the first upper-surface electrode and the second upper-surface electrode, wherein
each trench portion of the plurality of trench portions includes:
a first trench portion having (i) a first insulating film formed on an inner wall of the first trench portion and (ii) a first conductive portion formed inside of the first insulating film within the first trench portion and connected to the first upper-surface electrode; and
a second trench portion having (i) a second insulating film formed on an inner wall of the second trench portion and (ii) a second conductive portion formed inside of the second insulating film within the second trench portion and connected to the second upper-surface electrode,
the first conductive portion or the second conductive portion has a portion at an upper side than a depth position of a lower surface of the second semiconductor region, a width of the portion in the first direction becoming smaller from a lower side of the portion toward an upper side of the portion.

9. The semiconductor device according to claim 1, wherein
in a cross-sectional view in the first direction, a width of a top portion of the at least one trench portion is smaller than a width of the at least one trench portion at the depth position of the lower surface of the second semiconductor region.

10. The semiconductor device according to claim 1, wherein
in a cross-sectional view in the first direction, a width of a bottom portion of the at least one trench portion is larger than a width of the at least one trench portion at the depth position of the lower surface of the second semiconductor region.

11. The semiconductor device according to claim 1, wherein
in a cross-sectional view in the first direction, a width of a top portion of the at least one trench portion is 0.8 times or less of a width of a bottom portion of the at least one trench portion.

12. The semiconductor device according to claim 1, wherein
in a cross-sectional view in the first direction, a width of a top portion of the at least one trench portion is smaller than a width of a mesa portion adjacent to the at least one trench portion.

13. The semiconductor device according to claim 1, wherein
in a cross-sectional view in the first direction, a width of a bottom portion of the at least one trench portion is larger than a width of a bottom portion of a mesa portion adjacent to the at least one trench portion.

14. The semiconductor device according to claim 1, wherein
in a cross-sectional view in the first direction, a width of a bottom portion of the at least one trench portion is larger than a width of a top portion of a mesa portion adjacent to the at least one trench portion.

15. The semiconductor device according to claim 4, wherein
in a cross-sectional view in the first direction, a width of a top portion of the at least one trench portion is smaller than a width of an exposed region that is exposed by the contact hole.

16. The semiconductor device according to claim 1, wherein
the at least one trench portion further has a third tapered portion at an lower side than the depth position of the lower surface of the second semiconductor region, a width of the third tapered portion in the first direction becoming smaller from an upper side of the third tapered portion toward an lower side of the third tapered portion.

17. The semiconductor device according to claim 16, wherein
the at least one trench portion has a maximum width portion to give a maximum width between the first tapered portion and the third tapered portion.

18. The semiconductor device according to claim 1, wherein
the first tapered portion has a curved shape that is outward convex.

19. The semiconductor device according to claim 1, further comprising a bottom region of the second conductivity type formed in the first direction from a bottom portion of one trench portion to a bottom portion of an other trench portion, the one trench portion and the other trench portion being adjacent to each other among the plurality of trench portions.

20. A semiconductor device comprising:
a drift region of a first conductivity type;

a first semiconductor region of the first conductivity type provided above the drift region and having a doping concentration higher than the drift region;

a second semiconductor region of a second conductivity type provided between the first semiconductor region and the drift region;

a plurality of trench portions arranged in a first direction and having an extending portion that extends in a second direction perpendicular to the first direction; and a bottom region of the second conductivity type formed in the first direction from a bottom portion of one trench portion to a bottom portion of an other trench portion, the one trench portion and the other trench portion being adjacent to each other among the plurality of trench portions, wherein at least one trench portion of the plurality of trench portions has a portion at an upper side than a depth position of a lower surface of the second semiconductor region, a width of the portion in the first direction becoming smaller from a lower side of the portion toward an upper side of the portion.

* * * * *